United States Patent
Ko et al.

(10) Patent No.: US 12,167,619 B2
(45) Date of Patent: Dec. 10, 2024

(54) ORGANIC ELECTRO LUMINESCENCE DEVICE AND DISPLAY DEVICE INCLUDING THE SAME

(71) Applicant: Samsung Display Co., Ltd., Yongin-si (KR)

(72) Inventors: Hyomin Ko, Suwon-si (KR); Ilsoo Oh, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 733 days.

(21) Appl. No.: 17/380,547

(22) Filed: Jul. 20, 2021

(65) Prior Publication Data

US 2022/0173346 A1    Jun. 2, 2022

(30) Foreign Application Priority Data

Nov. 30, 2020    (KR) .................. 10-2020-0164825

(51) Int. Cl.
*H10K 50/15* (2023.01)
*H10K 50/11* (2023.01)
*H10K 50/852* (2023.01)
*H10K 59/12* (2023.01)
*H10K 59/35* (2023.01)
*H10K 85/30* (2023.01)
*H10K 85/60* (2023.01)
*H10K 101/40* (2023.01)
*H10K 102/00* (2023.01)

(52) U.S. Cl.
CPC ........... *H10K 50/156* (2023.02); *H10K 50/11* (2023.02); *H10K 50/852* (2023.02); *H10K 59/12* (2023.02); *H10K 59/35* (2023.02); *H10K 85/342* (2023.02); *H10K 85/615* (2023.02); *H10K 85/624* (2023.02); *H10K 85/631* (2023.02); *H10K 85/636* (2023.02); *H10K 85/656* (2023.02); *H10K 85/6565* (2023.02); *H10K 85/6572* (2023.02); *H10K 2101/40* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 7,875,895 | B2 | 1/2011 | Kwack et al. |
| 8,373,191 | B2 | 2/2013 | Ide et al. |
| 8,674,596 | B2 | 3/2014 | Kim et al. |
| 2012/0025180 | A1 | 2/2012 | Matsumoto |
| 2014/0027732 | A1 | 1/2014 | Pyo et al. |
| 2019/0040187 | A1 | 2/2019 | Sano et al. |
| 2021/0005814 | A1* | 1/2021 | Watabe ................. C09K 11/06 |

FOREIGN PATENT DOCUMENTS

| | | |
|---|---|---|
| JP | 11-251068 | 9/1999 |
| JP | 2017-139342 | 8/2017 |
| KR | 10-0873082 | 12/2008 |
| KR | 10-0873704 | 12/2008 |
| KR | 10-1290610 | 7/2013 |
| KR | 10-2014-0013513 | 2/2014 |
| KR | 10-1408547 | 6/2014 |

* cited by examiner

*Primary Examiner* — Robert S Loewe
(74) *Attorney, Agent, or Firm* — KILE PARK REED & HOUTTEMAN PLLC

(57) ABSTRACT

Provided is an organic electroluminescence device including a first electrode, a hole transport region disposed on the first electrode, an emission layer disposed on the hole transport region, an electron transport region disposed on the emission layer, and a second electrode disposed on the electron transport region. The hole transport region includes a first hole transport layer disposed adjacent to the first electrode, the first hole transport layer including a first organic compound having a first dielectric constant and a second hole transport layer disposed between the first hole transport layer and the emission layer, the second hole transport layer including a second organic having a second dielectric constant which is greater than the first dielectric constant.

27 Claims, 11 Drawing Sheets

ORGANIC ELECTRO LUMINESCENCE DEVICE AND DISPLAY DEVICE INCLUDING THE SAME

CROSS-REFERENCE TO RELATED APPLICATION(S)

This U.S. non-provisional patent application claims priority to and the benefit of Korean Patent Application No. 10-2020-0164825 under 35 U.S.C. § 119, filed in the Korean Intellectual Property Office (KIPO) on Nov. 30, 2020, the entire contents of which are incorporated herein by reference.

BACKGROUND

The disclosure herein relates to an organic electroluminescence device and a display device including the same, and more specifically, to an organic electroluminescence device including hole transport layers having different dielectric constants and a display device including the organic electroluminescence device.

Various display devices used for multimedia devices such as a television, a mobile phone, a tablet computer, a navigation system, a game machine are being developed. In such display devices, a so-called self-luminescence display device which realizes display by allowing a light emitting material including an organic compound, a quantum dot, or the like to emit light in an emission layer disposed between electrodes facing each other is used.

In applying an organic electroluminescence device in a display device, high luminescence efficiency and fast driving rate of the organic electroluminescence device are required, and the development of the material and structure of an organic electroluminescence device which is capable of stably implementing the above is in constant demand.

SUMMARY

The disclosure provides an organic electroluminescence device capable of being driven at a high speed.

The disclosure also provides a display device including an organic electroluminescence device capable of being driven at a high speed.

An embodiment of the disclosure provides an organic electroluminescence device including a first electrode, a hole transport region disposed on the first electrode, an emission layer disposed on the hole transport region, an electron transport region disposed on the emission layer, and a second electrode disposed on the electron transport region. The hole transport region may include a first hole transport layer disposed adjacent to the first electrode, the first hole transport layer including a first organic compound having a first dielectric constant and a second hole transport layer disposed between the first hole transport layer and the emission layer, the second hole transport layer including a second organic having a second dielectric constant which is greater than the first dielectric constant.

In an embodiment, the ratio of the first dielectric constant to the second dielectric constant may be in a range of about 1:1.20 to about 1:2.25.

In an embodiment, the difference between the first dielectric constant and the second dielectric constant may be in a range of about 0.6 to about 2.5.

In an embodiment, the first dielectric constant may be in a range of about 2.0 to about 2.8, and the second dielectric constant may be in a range of about 3.4 to about 4.5.

In an embodiment, the ratio of the thickness of the first hole transport layer to the thickness of the second hole transport layer may be in a range of about 1:1 to about 1:12.

In an embodiment, the thickness of the first hole transport layer may be in a range of about 10 nm to about 60 nm, and the thickness of the second hole transport layer may be in a range of about 60 nm to about 120 nm.

In an embodiment, the hole transport region may further include a third hole transport layer disposed between the second hole transport layer and the emission layer, the third hole transport layer including the first organic compound.

In an embodiment, the ratio of the a thickness of the first hole transport layer to a thickness of the second hole transport layer to a thickness of the third hole transport layer may be about 1:2:1 to about 1:11:1.

In an embodiment, thickness of the first hole transport layer may be in a range of about 10 nm to about 30 nm, the thickness of the second hole transport layer may be in a range of about 60 nm to about 110 nm, and the thickness of the third hole transport layer may be in a range of about 10 nm to about 30 nm.

In an embodiment, the hole transport region may further include a fourth hole transport layer disposed between the third hole transport layer and the emission layer, the fourth hole transport layer including the second organic compound, and a fifth hole transport layer disposed between the fourth hole transport layer and the emission layer, the fifth hole transport layer including the first organic compound.

In an embodiment, the ratio of the thickness of the first hole transport layer to the thickness of the second hole transport layer may be in a range of about 1:0.5 to about 1:3, the ratio of the thickness of the first hole transport layer to the thickness of the third hole transport layer may be in a range of about 1:1 to about 1:5, the ratio of the thickness of the first hole transport layer to the thickness of the fourth hole transport layer may be in a range of about 1:0.5 to about 1:3, and the ratio of the thickness of the first hole transport layer to the thickness of the fifth hole transport layer is in a range of about 1:0.5 to about 1:2.

In an embodiment, the thickness of the first hole transport layer and the thickness of the fifth hole transport layer may each be in a range of about 10 nm to about 20 nm, the thickness of the second hole transport layer and the thickness of the fourth hole transport layer may each be in a range of about 10 nm to about 30 nm, and the thickness of the third hole transport layer may be in a range of about 20 nm to about 50 nm.

In an embodiment, a sixth hole transport layer disposed between the first hole transport layer and the second hole transport layer, the sixth hole transport layer including the first organic compound and the second organic compound, and a seventh hole transport layer disposed between the second hole transport layer and the third hole transport layer, the seventh hole transport layer including the first organic compound and the second organic compound may further be included.

In an embodiment, the volume ratio of the first organic compound to the second organic compound included in the sixth hole transport layer and the seventh hole transport layer may be in a range of about 2:8 to about 8:2.

In an embodiment, the dielectric constant of the sixth hole transport layer and the dielectric constant of the seventh hole transport layer may each be in a range of about 2.3 to about 3.3.

In an embodiment, the thickness of the first hole transport layer and the thickness of the third transport layer may each be in a range of about 10 nm to about 20 nm, the thickness of the second hole transport layer may be in a range of about 20 nm to about 50 nm, and the thickness of the sixth hole transport layer and the thickness of the seventh hole transport layer may each be in a range of about 10 nm to about 30 nm.

In an embodiment, the first electrode may be a reflective electrode, and the second electrode may be either a transflective electrode or a transmissive electrode.

In an embodiment, the first organic compound may be represented by Formula 1.

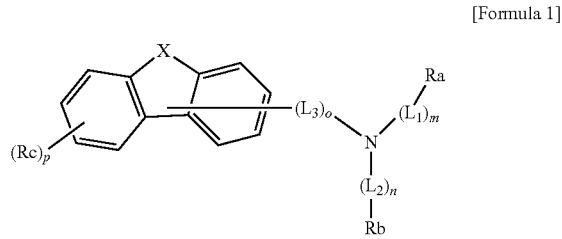

[Formula 1]

In an embodiment, in Formula 1, X may be N, $NR_1$, or $CR_2R_3$, m to o may each independently be 0 or 1, p may be an integer of 0 to 4, $L_1$ to $L_3$ may each independently be a substituted or unsubstituted arylene group having 6 to 30 ring-forming carbon atoms, $R_1$ to $R_3$ may each independently be a substituted or unsubstituted alkyl group having 1 to 10 carbon atoms or a substituted or unsubstituted aryl group having 6 to 30 ring-forming carbon atoms, and Ra to Rc may each independently be a hydrogen atom, a deuterium atom, a halogen atom, a substituted or unsubstituted aryl group having 6 to 30 ring-forming carbon atoms, or a substituted or unsubstituted amine group, wherein in case that X is N or $NR_1$, at least one of Ra and Rb may be a substituted or unsubstituted cyclohexyl group, a substituted or unsubstituted triphenylsilyl group, a fluorenyl group containing a substituted or unsubstituted alkyl group having 2 to 16 carbon atoms as a substituent, or an aryl group having 6 to 30 ring-forming carbon atoms containing a substituted or unsubstituted cyclohexyl group as a substituent, and wherein in case that X is $CR_2R_3$, $R_2$ and $R_3$ may each independently be a substituted or unsubstituted alkyl group having 6 to 10 carbon atoms, or at least one of Ra and Rb may be a substituted or unsubstituted cyclohexyl group, a substituted or unsubstituted triphenylsilyl group, a fluorenyl group containing a substituted or unsubstituted alkyl group having 2 to 16 carbon atoms as a substituent, or an aryl group having 6 to 30 ring-forming carbon atoms containing a substituted or unsubstituted cyclohexyl group as a substituent.

In an embodiment, Formula 1 may be represented by one of Formula 2 to Formula 4.

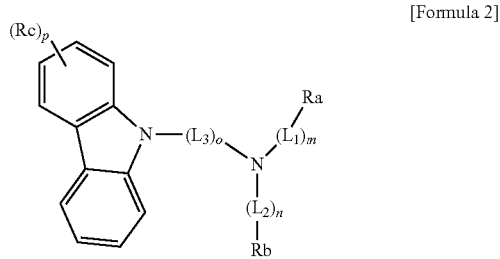

[Formula 2]

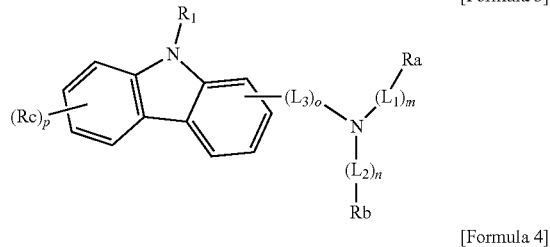

[Formula 3]

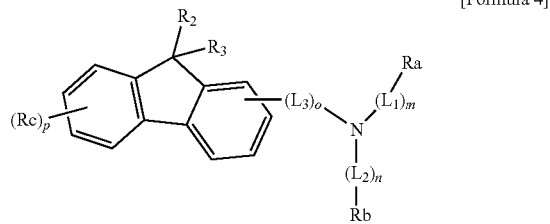

[Formula 4]

In an embodiment, m to p, Ra to Rc, $L_1$ to $L_3$ in Formula 2 to Formula 4, $R_1$ in Formula 3, and $R_2$ and $R_3$ in Formula 4 may be the same as defined in Formula 1 above.

Formula 4 may be represented by Formula 4-1.

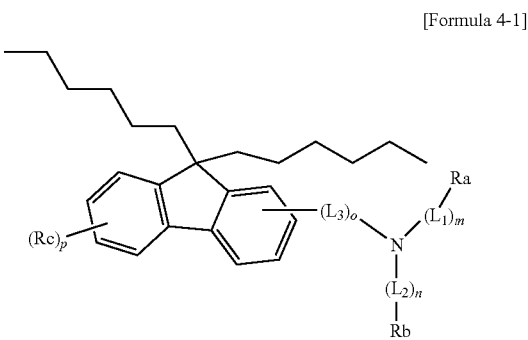

[Formula 4-1]

In an embodiment, Ra to Rc, $L_1$ to $L_3$, and m to p in Formula 4-1 may be the same as defined in Formula 1.

In an embodiment, Formula 1 may be represented by Formula 5.

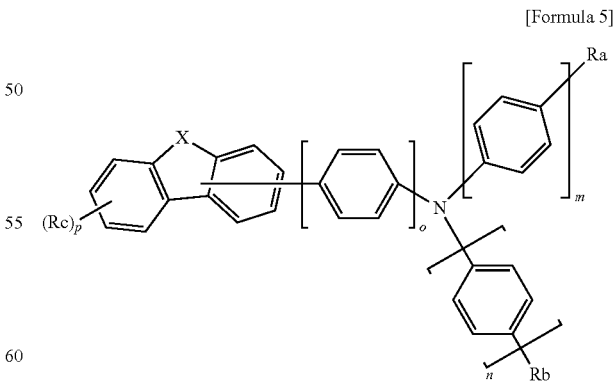

[Formula 5]

In an embodiment, in Formula 5, m to p, Ra to Rc, and X may be the same as defined in Formula 1.

In an embodiment, in Formula 1, Ra and Rb may each independently be represented by one of Formula 6 to Formula 13.

[Formula 6]
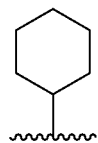
[Formula 7]
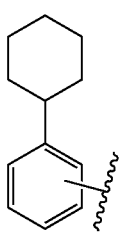
[Formula 8]
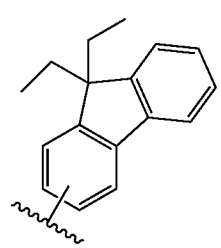
[Formula 9]
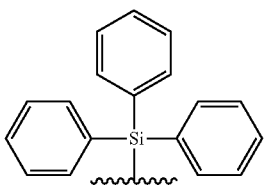
[Formula 10]
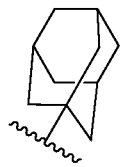
[Formula 11]
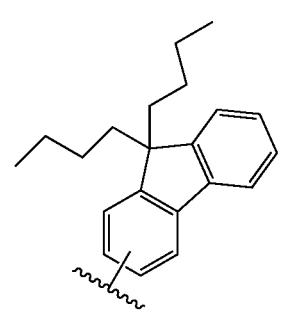
[Formula 12]
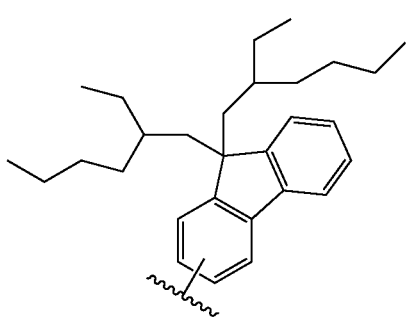
[Formula 13]
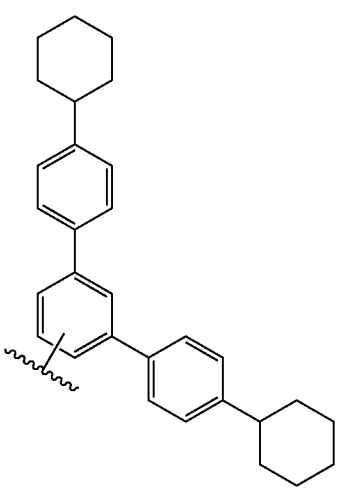
In an embodiment, the organic compound may be represented one of compounds of Compound group 1.
[Compound Group 1]
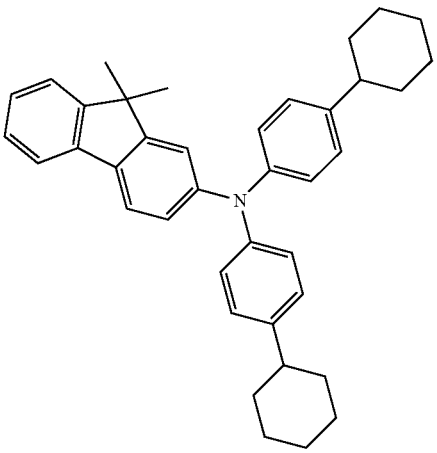
1
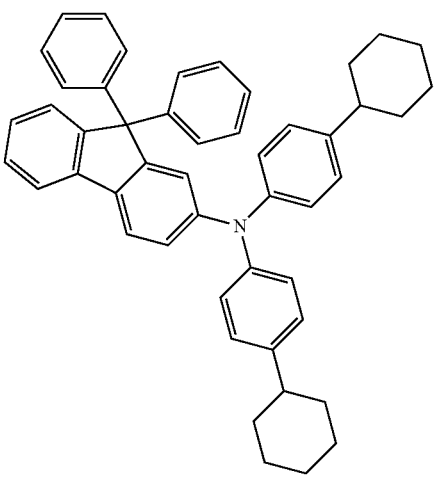
2

3
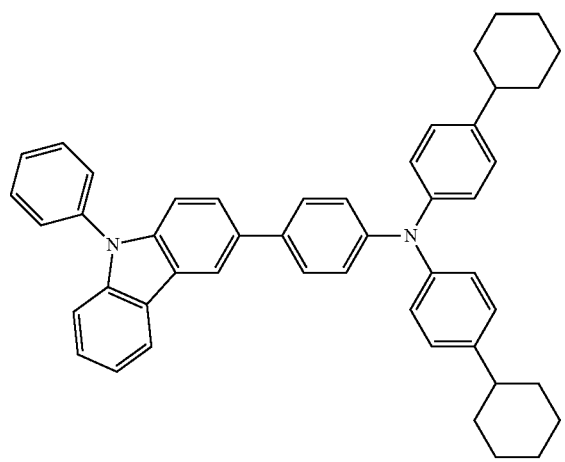
4
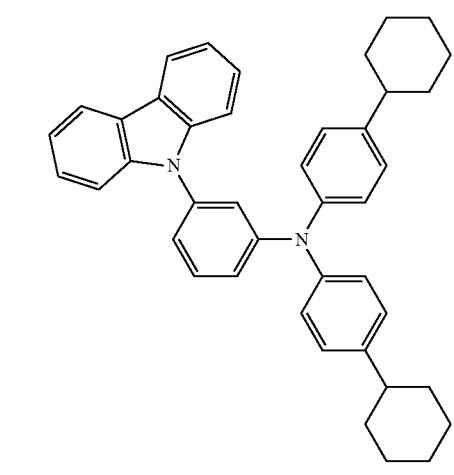
5
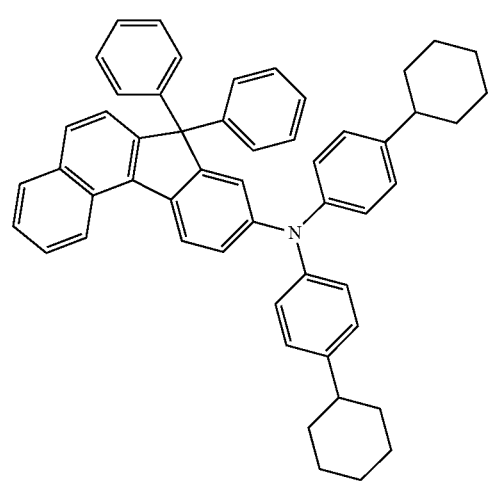
6
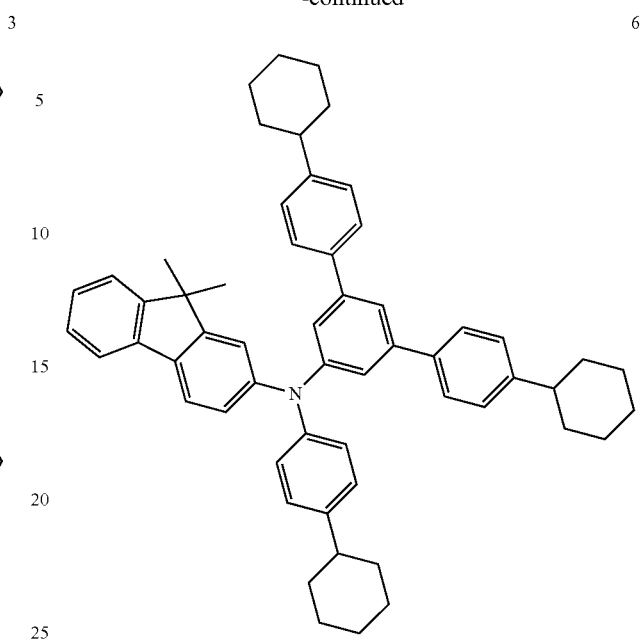
7
8
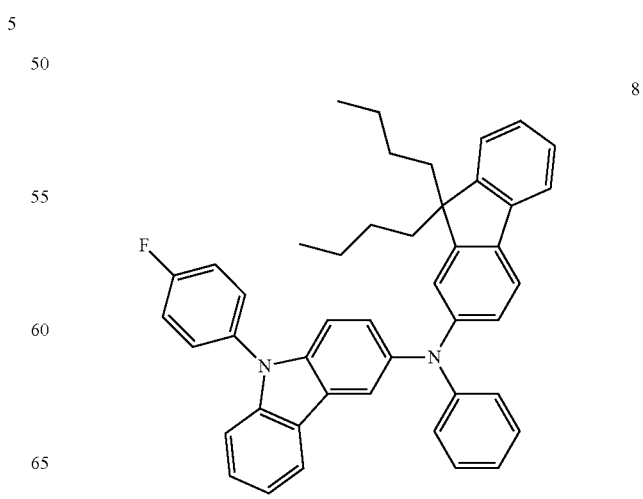

9
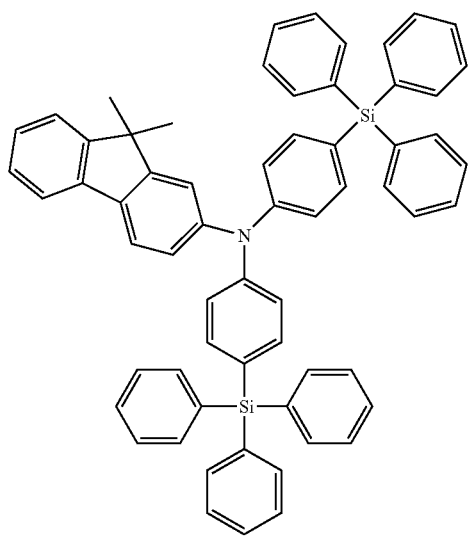
10
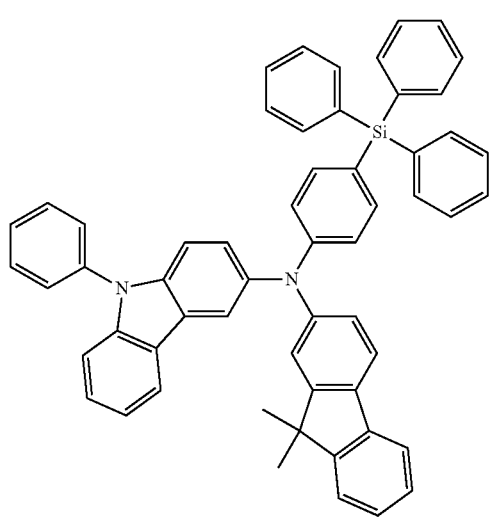
11
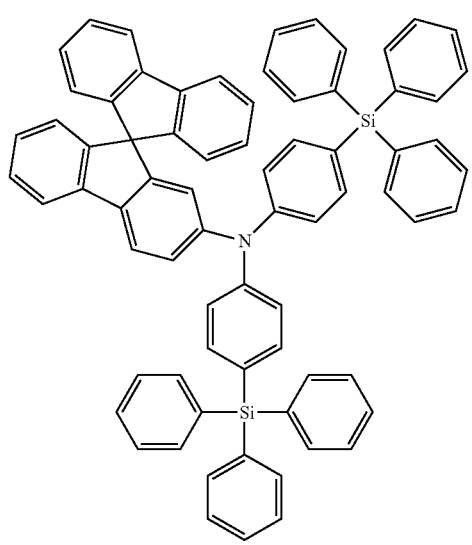
12
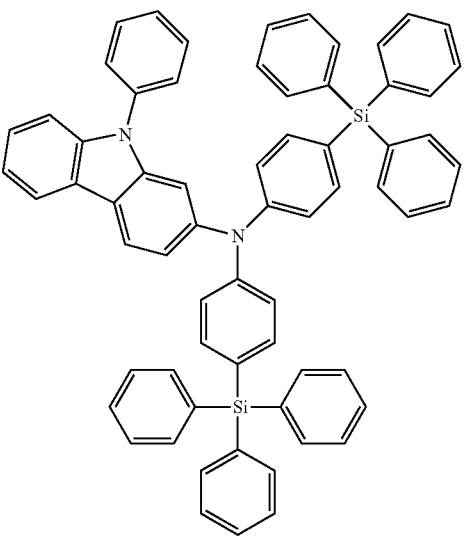
13
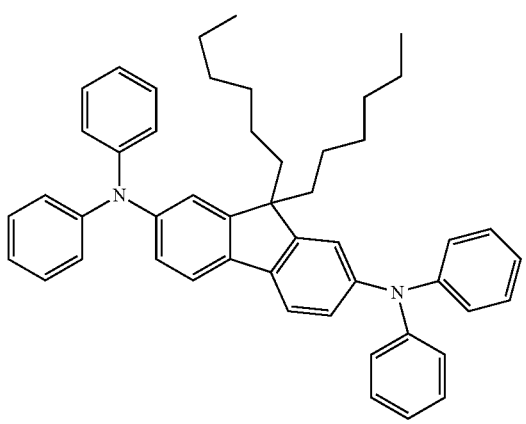
14
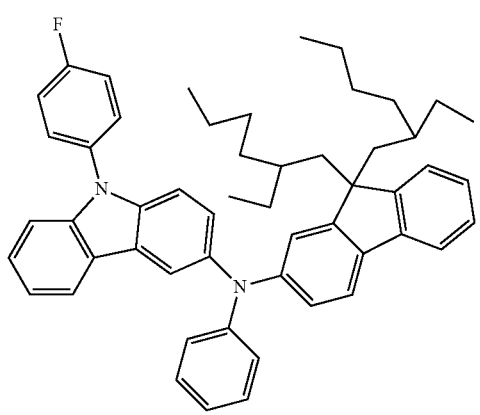

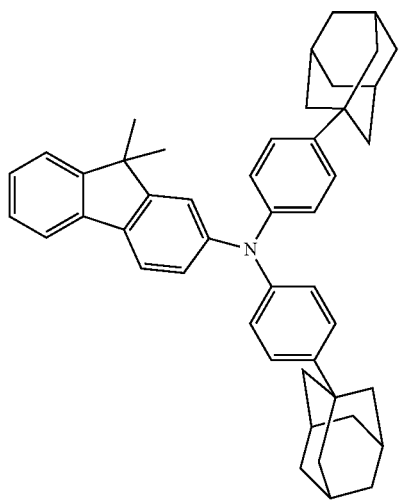

In an embodiment of the disclosure, an organic electroluminescence device may include a first electrode, a second electrode facing the first electrode, a hole transport region disposed between the first electrode and the second electrode, the hole transport region including a plurality of hole transport layers, an emission layer disposed between the hole transport region and the second electrode, and an electron transport region disposed between the emission layer and the second electrode. Hole transport layers adjacent to each other among the plurality of hole transport layers have different dielectric constants.

In an embodiment, the plurality of hole transport layers may include a first hole transport layer having a first dielectric constant and a second hole transport layer adjacent to the first hole transport layer and having a second dielectric constant which is greater than the first dielectric constant. The first hole transport layer may be adjacent to the first electrode, and the second hole transport layer may be disposed on an upper portion of the first hole transport layer.

In an embodiment of the disclosure, a display device may include a plurality of organic electroluminescence devices wherein each of the plurality of organic electroluminescence devices includes first electrode, a hole transport region disposed on the first electrode, an emission layer disposed on the hole transport region, an electron transport region disposed on the emission layer, and a second electrode disposed on the electron transport region. The hole transport region may include a first hole transport layer disposed adjacent to the first electrode, the first hole transport layer including a first organic compound having a first dielectric constant, and a second hole transport layer disposed between the first hole transport layer and the emission layer, the second hole transport layer including a second organic having a second dielectric constant which is greater than the first dielectric constant.

In an embodiment, the first dielectric constant may be in a range of about 2.0 to about 2.8, and the second dielectric constant may be in a range of about 3.4 to about 4.5.

In an embodiment, the first electrode may be a reflective electrode, and the second electrode may be either a transmissive electrode or a transflective electrode.

In an embodiment, the plurality of organic electroluminescence devices may include a first organic electroluminescence device including first emission layer that emits light of a first wavelength, a second organic electroluminescence device including a second emission layer that emits light of a second wavelength which is different from the first wavelength, and a third organic electroluminescence device including a third emission layer that emits light of a third wavelength which is different from the first wavelength and the second wavelength.

In an embodiment, the first wavelength may be a wavelength longer than the second wavelength, the second wavelength may be a wavelength longer than the third wavelength, the thickness of the first emission layer may be greater than the thickness of the second emission layer, and the thickness of the second emission layer may be greater than the thickness of the third emission layer.

In an embodiment, the first wavelength may be a wavelength longer than the second wavelength, the second wavelength may be a wavelength longer than the third wavelength, the display device may further include a first resonance auxiliary layer disposed between the first emission layer and the hole transport region, a second resonance auxiliary layer disposed between the second emission layer and the hole transport region, and a third resonance auxiliary layer disposed between the third emission layer and the hole transport region, the thickness of the first resonance auxiliary layer may be greater than the thickness of the second resonance auxiliary layer, and the thickness of the second resonance auxiliary layer may be greater than the thickness of the third resonance auxiliary layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of some aspects of the disclosure. In the drawings.

DETAILED DESCRIPTION OF THE EMBODIMENTS

Figure 1:
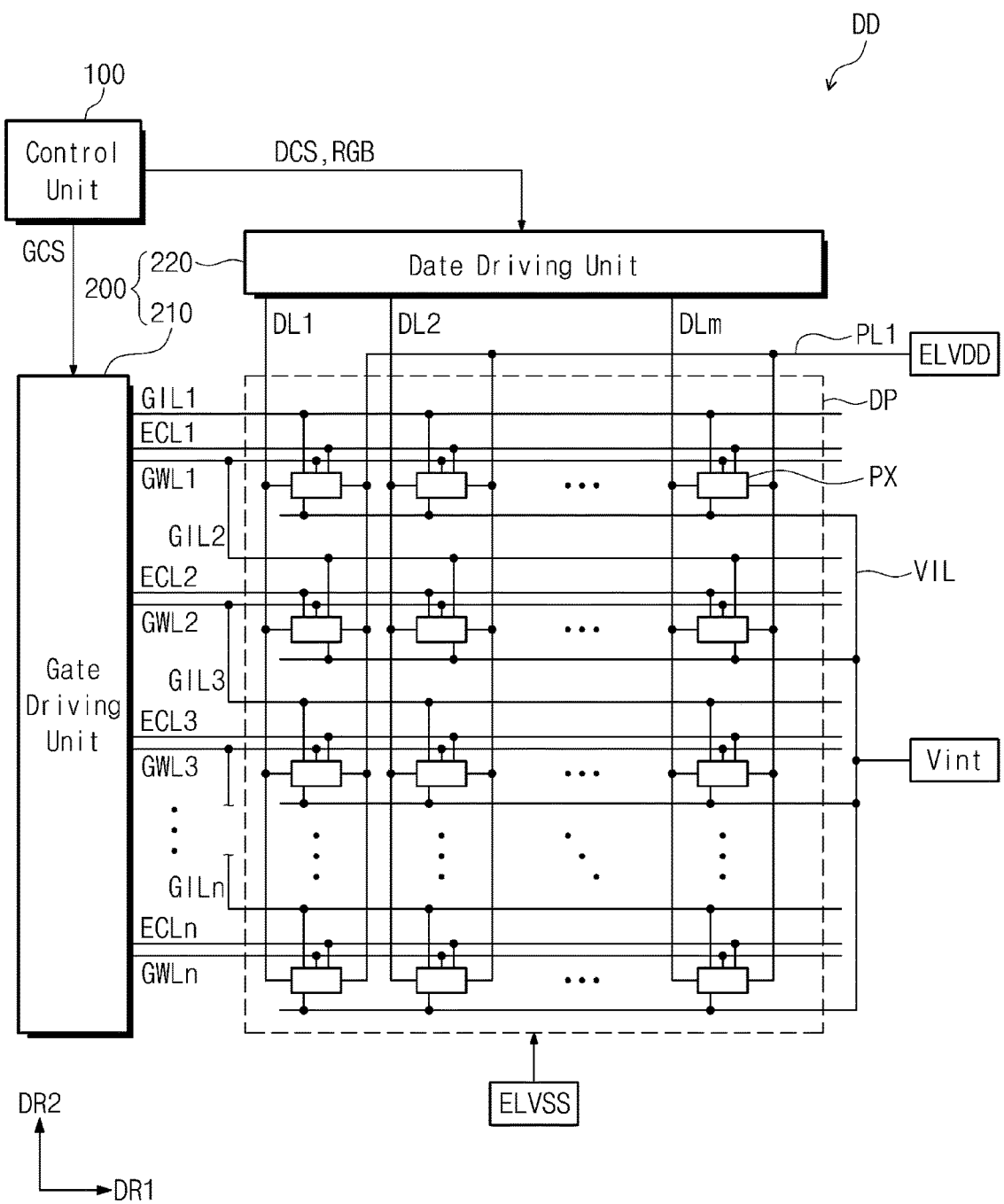
FIG. 1 is a schematic block diagram of a display device according to an embodiment of the disclosure.

In the specification, when an element (or a region, a layer, a portion, etc.) is referred to as being "on," "connected to," or "coupled to" another element, it means that the element may be directly disposed on, connected to, or coupled to the other element, or that a third element may be disposed therebetween.

Like reference numerals refer to like elements. Also, in the drawings, the thickness, the ratio, and the dimensions of elements may be exaggerated for an effective description of technical contents.

The term "and/or" includes all combinations of one or more of which associated configurations may define.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of embodiments of the disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined or implied herein, all terms (including technical and scientific terms) used herein have the same meaning as commonly understood by those skilled in the art to which the disclosure pertains. It is also to be understood that terms, such as those defined in commonly used dictionaries, should be interpreted as having meanings consistent with their meanings in the context of the related art and the disclosure, and should not be interpreted in an ideal or excessively formal sense unless clearly so defined herein.

It should be understood that the terms "comprise," "include," and "have" are intended to specify the presence of stated features, integers, steps, operations, elements, components, or combinations thereof in the disclosure, but do not preclude the presence or addition of one or more other features, integers, steps, operations, elements, components, or combinations thereof.

In the specification, "substituted" or "unsubstituted" may mean being substituted or unsubstituted with one or more substituents selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a hetero ring group. In addition, each of the substituents discussed above may be substituted or unsubstituted. For example, a biphenyl group may be interpreted as an aryl group and may also be interpreted as a phenyl group substituted with a phenyl group.

In the specification, "forms a ring by being bonded to an adjacent group" may mean forming a substituted or unsubstituted hydrocarbon ring or a substituted or unsubstituted hetero ring by being bonded to an adjacent group. The hydrocarbon ring includes an aliphatic hydrocarbon ring and an aromatic hydrocarbon ring. The hetero ring includes an aliphatic hetero ring and an aromatic hetero ring. The hydrocarbon ring and the hetero ring may be monocyclic or polycyclic. Also, rings formed by being bonded to each other may be connected to another ring to form a spiro structure.

In the specification, "an adjacent group" may mean a substituent which is substituted with an atom directly connected to an atom with which a corresponding substituent is substituted, another substituent which is substituted with an atom with which a corresponding substituent is substituted, or a substituent which is three-dimensionally most adjacent to a corresponding substituent. For example, in 1,2-dimethylbenzene, two methyl groups may be interpreted as being "an adjacent group" to each other, and in 1,1-diethylcyclopentane, two ethyl groups may be interpreted as being "an adjacent group" to each other. In 4,5-dimethylphenanthrene, two methyl groups may be interpreted as being "an adjacent group" to each other.

In the specification, examples of the halogen atom include a fluorine atom, a chlorine atom, a bromine atom, or an iodine atom.

In the specification, the alkyl group may be linear, branched, or cyclic. The number of carbon atoms of the alkyl group is about 1 to about 50, about 1 to about 30, about 1 to about 20, about 1 to about 10, or about 1 to about 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantly group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group, and the like, but are not limited thereto.

In the specification, the aryl group means a functional group or substituent derived from an aromatic hydrocarbon ring. The aryl group may be a monocyclic aryl group or a polycyclic aryl group. The number of ring-forming carbon atoms of the aryl group may be about 6 to about 60, about 6 to about 30, about 6 to about 20, or about 6 to about 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a biphenylene group, a triphenylene group, a pyrenyl group, a benzofluoranthenyl group, a chrysenyl group, and the like, but are not limited thereto.

In the specification, a fluorenyl group may be substituted, and two substituents may be bonded to each other to form a spiro structure. Examples in which a fluorenyl group is substituted are as follows. However, the embodiment of the disclosure is not limited thereto.

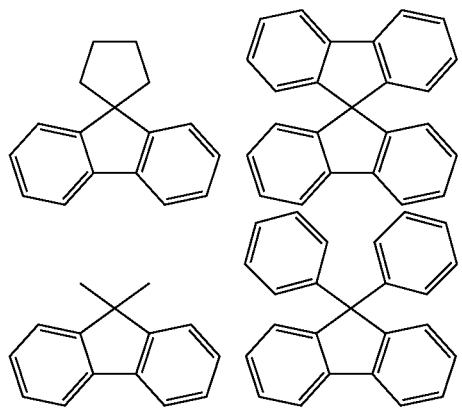

In the specification, a heterocyclic group means a functional group or substituent derived from a ring including one or more of B, O, N, P, Si, and S as a hetero atom. The heterocyclic group includes an aliphatic heterocyclic group and an aromatic heterocyclic group. The aromatic heterocyclic group may be a heteroaryl group. The aliphatic heterocyclic group and the aromatic heterocyclic group may be monocyclic or polycyclic.

In the specification, the heterocyclic group may include one or more of B, O, N, P, Si, and S as a hetero atom. In case that the heterocyclic group includes two or more hetero atoms, the two or more hetero atoms may be the same or different from each other. The heterocyclic group may be a monocyclic heterocyclic group or a polycyclic heterocyclic group and include a heteroaryl group. The number of ring-forming carbon atoms of the heterocyclic group may be about 2 to about 30, about 2 to about 30, about 2 to about 20, or about 2 to about 10.

In the specification, the aliphatic heterocyclic group may include one or more of B, O, N, P, Si, and S as a hetero atom. The number of ring-forming carbon atoms of the aliphatic heterocyclic group may be about 2 to about 30, about 2 to about 20, or about 2 to about 10. Examples of the aliphatic heterocyclic group may be an oxirane group, a thiran group, a pyrrolidine group, a piperidine group, a tetrahydrofuran group, a tetrahydrothiophene group, a thian group, a tetrahydropyran group, a 1,4-dioxane group, and the like, but are not limited thereto.

In the specification, the heteroaryl group may include one or more of B, O, N, P, Si, and S as a hetero atom. In case that the heteroaryl group includes two or more hetero atoms, the two or more hetero atoms may be the same or different from each other. The heteroaryl group may be a monocyclic heterocyclic group or a polycyclic heterocyclic group. The number of ring-forming carbon atoms of the heteroaryl group may be about 2 to about 30, about 2 to about 20, or about 2 to about 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazinyl group, a pyrazinyl group, a quinoline group, a quinazoline group, a quinoxaline group, a phenothiazine group, a phthalazine group, a pyrido pyrimidine group, a pyrido pyrazine group, a pyrazino pyrazine group, an isoquinoline group, an indole group, a carbazole group, an N-arylcarbazol group, an N-heteroarylcarbazole group, an N-alkylcarbazol group, a benzooxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilol group, a dibenzofuran group, and the like, but are not limited thereto.

In the specification, the above-described description of an aryl group may be applied to the arylene group except that the arylene group is a divalent group. The above-described description of a heteroaryl group may be applied to the heteroarylene group except that the heteroarylene group is a divalent group.

In the specification, the silyl group includes an alkylsilyl group and an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the specification, the alkenyl group may be linear or branched. The number of carbon atoms of the alkenyl group is not limited, but is about 2 to about 30, about 2 to about 20, or about 2 to about 10. Examples of the alkenyl group include a vinyl group, a 1-butenyl group, a 1-pentenyl group, a 1,3-butadienylaryl group, a styrenyl group, a styryl vinyl group, and the like, but are not limited thereto.

In the specification, the number of carbon atoms of the amine group is not particularly limited, but may be about 1 to about 30. The amine group may include an alkylamine group and an arylamine group. Examples of the amine group include a methylamine group, a dimethylamine group, a phenylamine group, a diphenylamine group, a naphthylamine group, a 9-methyl-anthracenylamine group, a triphenylamine group, and the like, but are not limited thereto.

In the specification, an alkyl group in an alkylthio group, an alkylsulfoxy group, an alkylaryl group, an alkylamino group, an alkyl boron group, an alkyl silyl group, and alkyl amine group is the same as the examples of the alkyl group described above.

In the specification, an aryl group in an aryloxy group, an arylthio group, an arylsulfoxy group, an arylamino group, an aryl boron group, an aryl silyl group, and an aryl amine group is the same as the examples of the aryl group described above.

In the specification, a direct linkage may mean a single bond.

In the specification, "—*" or

indicates a connecting position.

Hereinafter, embodiments of the disclosure will be described with reference to the accompanying drawings.

Figure 2:
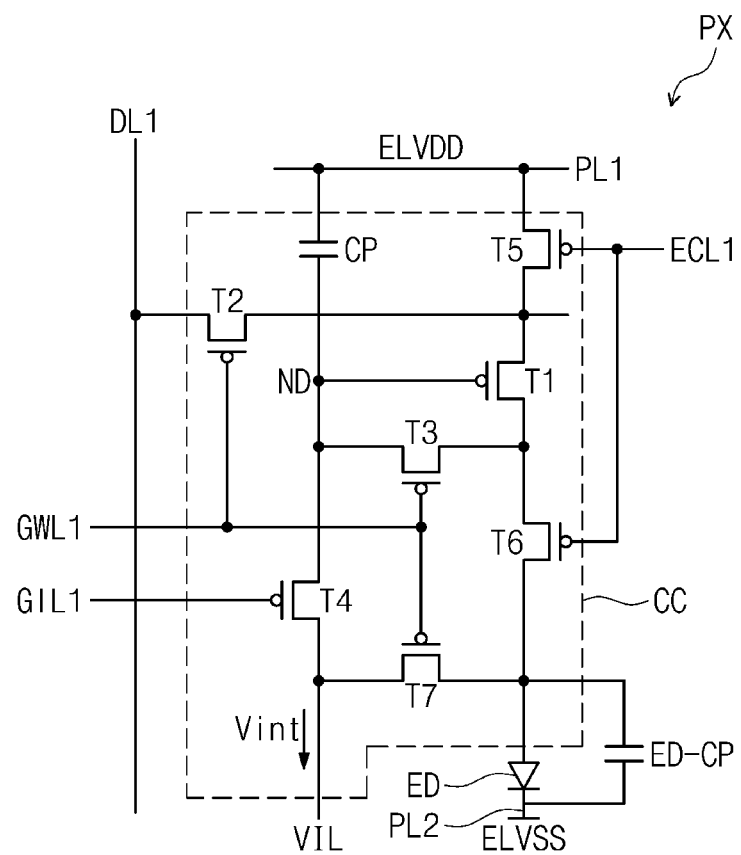
FIG. 2 is a schematic diagram of an equivalent circuit of a pixel illustrated in FIG. 1.

FIG. 1 is a schematic block diagram of a display device DD according to an embodiment. FIG. 2 is a schematic diagram of an equivalent circuit of a pixel illustrated in FIG. 1.

Referring to FIGS. 1 and 2, the display device DD includes a control unit (or control part) 100 and a driving unit (or driving part) 200. The driving part 200 controls the driving of a display panel DP. The driving part 200 may include a gate driving part 210 and a data driving part 220.

The control part 100 controls the driving of the driving part 200. The control part 100 converts the data format of input image signals to match interface specifications with the data driving part 220, thereby generating image data RGB. The control part 100 outputs the image data RGB, and various control signals DCS and GCS.

The gate driving part 210 receives a gate control signal GCS from the control part 100. The gate control signal GCS may include a vertical start signal which starts the operation of the gate driving part 210, a clock signal which determines the output timing of signals, and the like. The gate driving part 210 generates gate signals and sequentially outputs the gate signals to gate lines GIL1 to GILn and GWL1 to GWLn to be described below. The gate driving part 210 generates light emission control signals in response to the gate control signal GCS and outputs the light emission control signals to light emission control lines ECL1 to ECLn to be described below.

FIG. 1 illustrates that gate signals and light emission control signals are output from a gate driving part 210. However, the disclosure is not limited thereto. As an example of the disclosure, a driving circuit generating and outputting gate signals and a driving circuit generating and outputting light emission control signals may be separately provided.

The data driving part 220 receives a data control signal DCS and the image data RGB from the control part 100. The data driving part 220 converts the image data RGB into data signals and outputs the data signals to data lines DL1 to DLm to be described below. The data signals are analog voltages corresponding to a grayscale value of the image data RGB.

The display panel DP includes the gate lines GIL1 to GILn and GWL1 to GWLn, the light emission control lines ECL1 to ECLn, the data lines DL1 to DLm, and pixels PX. The gate lines GIL1 to GILn and GWL1 to GWLn extend in a first direction DR1 and are arranged in a second direction DR2 orthogonal to the first direction DR1. Each of the light emission lines ECL1 to ECLn may be arranged to be parallel to a corresponding gate line among the gate lines GIL1 to GILn and GWL1 to GWLn. The data lines DL1 to DLm intersect the gate lines GIL1 to GILn and GWL1 to GWLn while being insulated therefrom.

Each of the pixels PX is electrically connected to corresponding gate lines among the gate lines GIL1 to GILn and GWL1 to GWLn, a corresponding light emission line among the light emission lines ECL1 to ECLn, and a corresponding data line among the data lines DL1 to DLm. FIG. 1 illustrates an example in which each of the pixels PX is electrically connected to two gate lines among the gate lines GIL1 to GILn and GWL1 to GWLn, but the disclosure is not limited thereto. For example, each pixel PX may be electrically connected to three gate lines among the gate lines GIL1 to GILn and GWL1 to GWLn.

The display panel DP receives a first driving voltage ELVDD and a second driving voltage ELVSS. The first driving voltage ELVDD may be provided to the pixels PX through a first power line PL1. The second driving voltage ELVSS may be provided to the pixels PX through electrodes (not shown) formed on the display panel DP or a second power line PL2 (see FIG. 2).

The display panel DP receives an initialization voltage Vint. The initialization voltage Vint may be provided to the pixels PX through an initialization voltage line VIL.

Referring to FIG. 2, each of the pixels PX includes an organic electroluminescence device ED and a circuit part CC configured to control the light emission of the organic electroluminescence device ED. Each of the pixels PX may include red pixels configured to emit red light, green pixels configured to emit green light, and blue pixels configured to emit blue light. The organic electroluminescence device ED of a red pixel, the organic electroluminescence device ED of a green pixel, and the organic electroluminescence device ED of a blue pixel may include organic emission layers of different materials.

The circuit part CC may include transistors T1 to T7 and a capacitor CP. The transistors T1 to T7 and the capacitor CP may control the amount of current flowing in the organic electroluminescence device ED in response to a data signal and a gate signal.

Each of the transistors T1 to T7 may include a source (or an input electrode region), a drain (or an output electrode region), and a connection signal line (or a connection electrode). In the specification, one of the source and the drain may be referred to as a first portion, and the other thereof may be referred to as a second portion, for convenience of description. Hereinafter, for convenience of description, the transistors T1 to T7 are referred to as first to seventh transistors T1 to T7.

A first portion of the first transistor T1 may be electrically connected to the first power line PL1 via the fifth transistor T5. The first driving voltage ELVDD is provided to the first power line PL1. A second portion of the first transistor T1 is electrically connected to a first portion of the organic electroluminescence device ED via the sixth transistor T6.

The first transistor T1 may control the amount of current flowing in the organic electroluminescence device ED in response to a voltage applied to a connection signal line of the first transistor T1.

The second transistor T2 is electrically connected between a first data line DL1 and the first portion of the first transistor T1. A connection signal line of the second transistor T2 is electrically connected to a first current gate line GWL1. In case that a first current gate signal is provided to the first current gate line GWL1, the second transistor T2 is turned on to electrically connect the first data line DL1 and the first portion of the first transistor T1.

The third transistor T3 is electrically connected between the second portion of the first transistor T1 and the connection signal line of the first transistor T1. A connection signal line of the third transistor T3 is electrically connected to the first current gate line GWL1. In case that the first current gate signal is provided to the first current gate line GWL1, the third transistor T3 is turned on to electrically connect the second portion of the first transistor T1 and the connection signal line of the first transistor T1. Accordingly, in case that the third transistor T3 is turned on, the first transistor T1 is electrically connected in the form of a diode (or diode-connected).

The fourth transistor T4 is electrically connected between a node ND and an initialization voltage line VIL. A connection signal line of the fourth transistor T4 is electrically connected to a first previous gate line GILL The node ND may be a node to which the fourth transistor T4 and the connection signal line of the first transistor T1 are electrically connected. In case that a first previous gate signal is provided to the first previous gate line GILL the fourth transistor T4 is turned on to provide an initialization voltage Vint to the node ND.

The fifth transistor T5 is electrically connected between the first power line PL1 and the first portion of the first transistor T1. The sixth transistor T6 is electrically connected between the second portion of the first transistor T1 and the first portion of the organic electroluminescence device ED. A connection signal line of the fifth transistor T5 and a connection signal line of the sixth transistor T6 are electrically connected to a first light emission control line ECL1.

The seventh transistor T7 is electrically connected between the initialization voltage line VIL and the first portion of the organic electroluminescence device ED. A connection signal line of the seventh transistor T7 is electrically connected to the first current gate line GWL1. In case that the first current gate signal is provided to the first current gate line GWL1, the seventh transistor T7 is turned on to provide the initialization voltage Vint to the first portion of the organic electroluminescence device ED.

The seventh transistor T7 may improve the ability of the pixel PX to express black. Specifically, in case that the seventh transistor T7 is turned on, a parasitic capacitor ED-CP of the organic electroluminescence device ED is discharged. In case that black luminance is implemented, the organic electroluminescence device ED does not emit light because of a leakage current from the first transistor T1, and accordingly, the ability to express black may be improved.

FIG. 2 also illustrates that the connection signal line of the seventh transistor T7 is electrically connected to the first current gate line GWL1, but the disclosure is not limited thereto. For example, the connection signal line of the seventh transistor T7 may be electrically connected to a different gate line (for example, a second current gate line GWL2 (see FIG. 1)) which provides a different gate signal from the first current gate signal.

FIG. 2 illustrates that the first to seventh transistors T1 to T7 are each a P-channel metal oxide semiconductor (PMOS) transistor, but the embodiment of the disclosure is not limited thereto. For example, for example, some or all of the first to seventh transistors T1 to T7 forming (or constituting) the circuit part CC may each be configured to be an N-channel metal oxide semiconductor (NMOS) transistor.

The capacitor CP is disposed between the first power line PL1 and the node ND. The capacitor CP stores a voltage corresponding to a data signal. In case that the fifth transistor T5 and the sixth transistor T6 are turned on, the amount of current flowing through the first transistor T1 may be determined in accordance with a voltage stored in the capacitor CP.

The organic electroluminescence device ED may be electrically connected to the sixth transistor T6 and the second power line PL2. The first portion of the organic electroluminescence device ED is electrically connected to the sixth transistor T6, and a second portion of the organic electroluminescence device ED is electrically connected to the second power line PL2. The second driving voltage ELVSS may be applied to the second power line PL2. The second driving voltage ELVSS has a lower level than the first driving voltage ELVDD. Therefore, the organic electroluminescence device ED may emit light to a voltage corresponding to the difference between a signal transmitted through the sixth transistor T6 and the second driving voltage ELVSS received through the second power line PL2.

As the capacity of the capacitor ED-CP of the organic electroluminescence device ED decreases, the driving rate of the organic electroluminescence device ED may increase.

Figure 3:
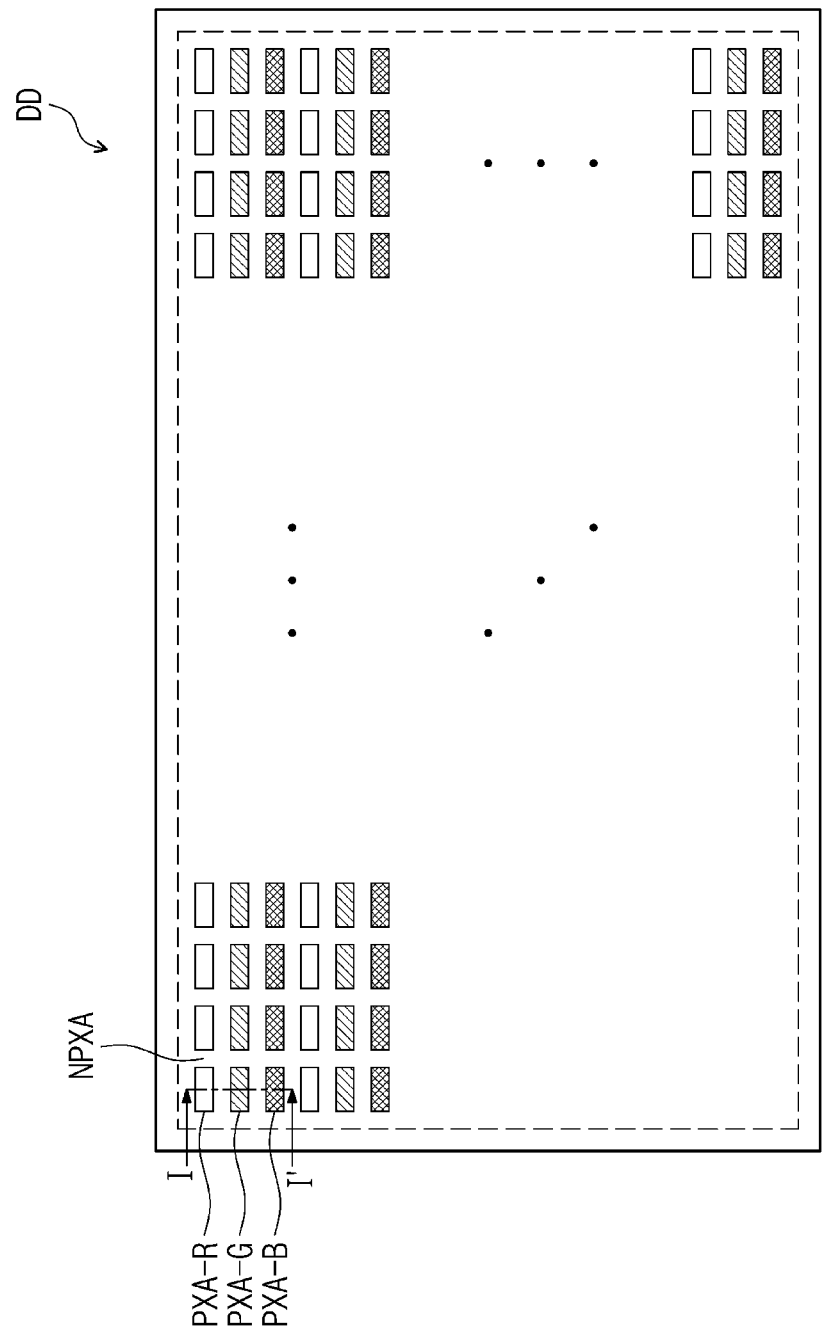
FIG. 3 is a plan view schematically illustrating an embodiment of a display device.
Figure 4:
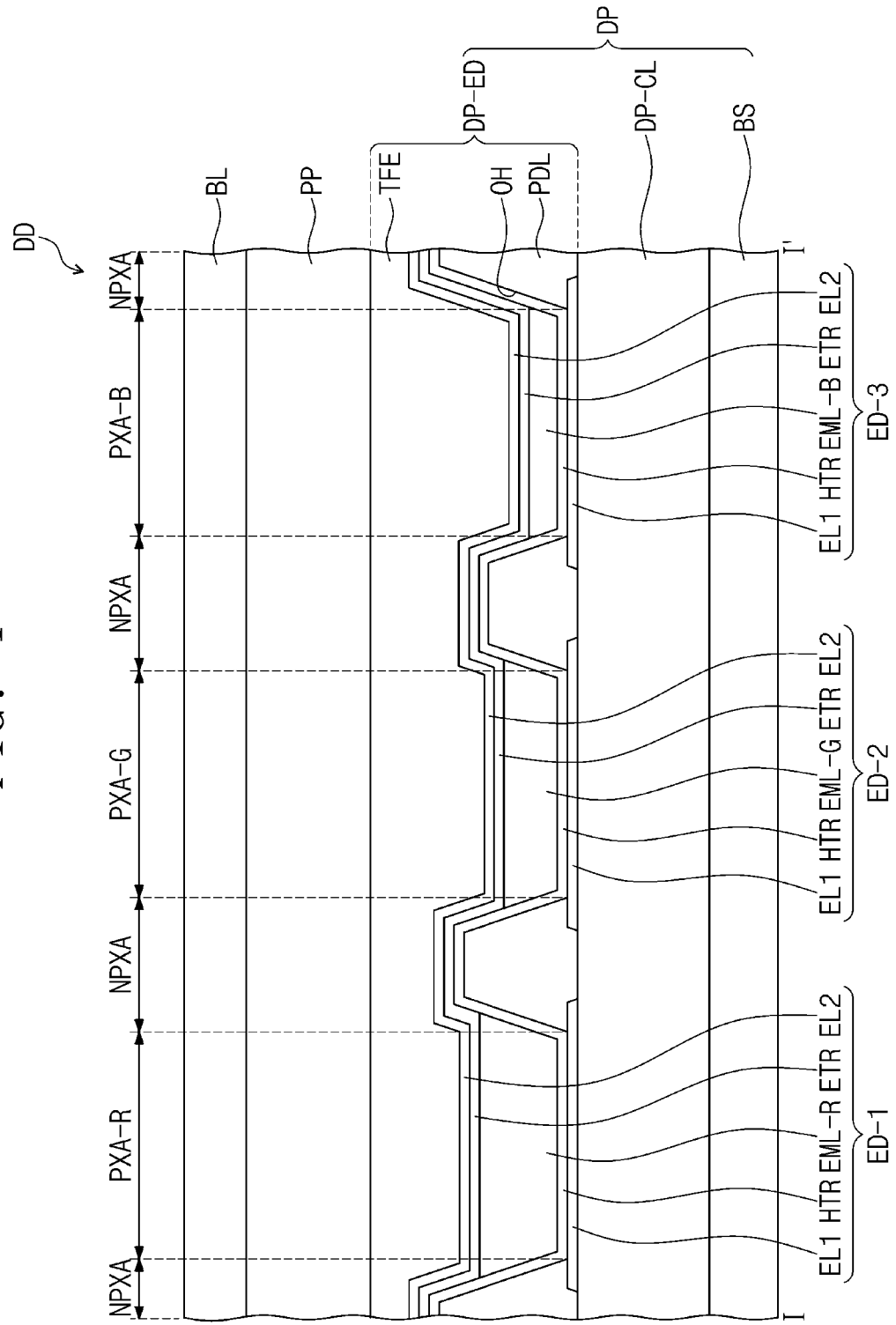
FIG. 4 is a schematic cross-sectional view of a display device of an embodiment.
Figure 5:
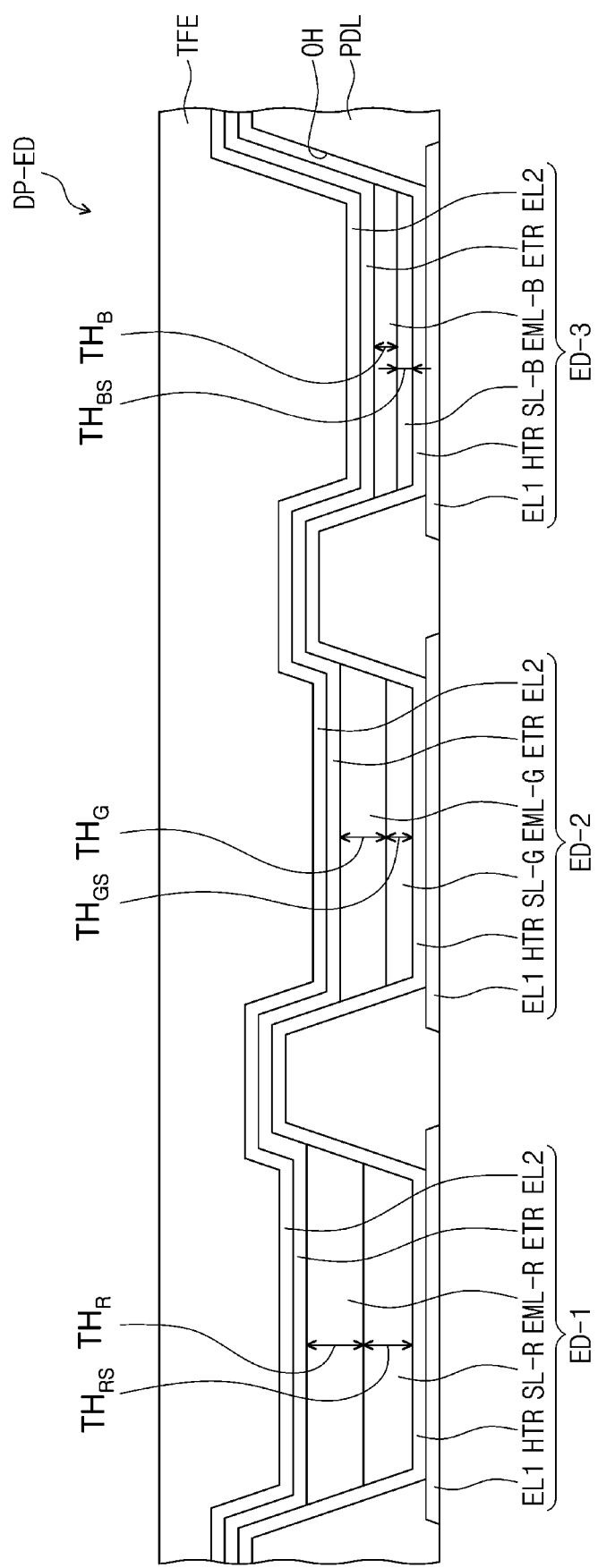
FIG. 5 is a schematic enlarged cross-sectional view of a portion of a display device.

FIG. 3 is a plan view schematically illustrating an embodiment of the display device DD. FIG. 4 is a schematic cross-sectional view of the display device DD of an embodiment. FIG. 4 is a cross-sectional view schematically illustrating a portion corresponding to line I-I' of FIG. 3. FIG. 5 is a schematic enlarged cross-sectional view of a portion of the display device DD.

Referring FIGS. 3 to 5, the display device DD may include the display panel DP and an optical layer PP disposed on the display panel DP. The display panel DP includes organic electroluminescence devices ED-1, ED-2, and ED-3. The display device DD may include organic electroluminescence devices ED-1, ED-2, and ED-3. The optical layer PP may be disposed on the display panel DP to control reflective light in the display panel DP caused by external light. The optical layer PP may include, for example, a polarizing layer or a color filter layer. Unlike what is illustrated in the drawings, the optical layer PP may be omitted from the display device DD of an embodiment.

On the optical layer PP, a base substrate BL may be disposed. The base substrate BL may be a member which provides a base surface on which the optical layer PP is disposed. The base substrate BL may be a glass substrate, a metal substrate, a plastic substrate, or the like. However, the embodiment of the disclosure is not limited thereto, and the base substrate BL may be an inorganic layer, an organic layer, or a composite material layer (or composite layer). Unlike what is illustrated in the drawings, the base substrate BL may be omitted in an embodiment.

The display device DD according to an embodiment may further include a filling layer (not shown). The filling layer may be disposed between a display element layer DP-ED and the base substrate BL. The filling layer may be an organic material layer (or organic layer). The filling layer may include at least one of an acrylic resin, a silicone-based resin, and an epoxy resin.

The display panel DP may include a base layer BS, a circuit layer DP-CL provided on the base layer BS, and the display element layer DP-ED. The display element layer DP-ED may include a pixel definition film PDL, the organic electroluminescence devices ED-1, ED-2, and ED-3 disposed between portions of the pixel definition film PDL, and an encapsulation layer TFE disposed on the organic electroluminescence devices ED-1, ED-2, and ED-3.

The base layer BS may be a member which provides a base surface on which the display element layer DP-ED is disposed. The base layer BS may be a glass substrate, a metal substrate, a plastic substrate, and the like. However, the embodiment of the disclosure is not limited thereto. The base layer BS may be an inorganic layer, an organic layer, or a composite layer.

In an embodiment, the circuit layer DP-CL is disposed on the base layer BS, and the circuit layer DP-CL may include the transistors T1 to T7. Each of the transistors T1 to T7 may include a control electrode, an input electrode, and an output electrode. For example, the circuit layer DP-CL may include a switching transistor and a driving transistor for driving the organic electroluminescence devices ED-1, ED-2, and ED-3 of the display element layer DP-ED.

Each of the organic electroluminescence devices ED-1, ED-2, and ED-3 may have a structure of the organic electroluminescence device ED of an embodiment in accordance with FIGS. 6 to 8 to be described below. Each of the organic electroluminescence devices ED-1, ED-2, and ED-3 may include a first electrode EL1, a hole transport region HTR, emission layers EML-R, EML-G, and EML-B, an electron transport region ETR, and a second electrode EL2.

FIG. 5 illustrates an embodiment in which the emission layers EML-R, EML-G, and EML-B of the organic electroluminescence devices ED-1, ED-2, and ED-3 are disposed in an opening OH defined in (or on) the pixel definition film PDL, and the hole transport region HTR, the electron transport region ETR, and the second electrode EL2 are provided as a common layer throughout the organic electroluminescence devices ED-1, ED-2, and ED-3. However, the embodiment of the disclosure is not limited thereto. Unlike what is illustrated in FIG. 2, the hole transport region HTR and the electron transport region ETR may be patterned inside the opening OH defined on the pixel definition film PDL and provided in an embodiment. For example, in an embodiment, the hole transport region HTR, the emission layers EML-R, EML-G, and EML-B, the electron transport region ETR, and the like of the organic electroluminescence devices ED-1, ED-2, and ED-3 may be patterned by an inkjet printing method and provided.

The encapsulation layer TFE may cover (or overlap) the organic electroluminescence devices ED-1, ED-2, and ED-3. The encapsulation layer TFE may seal the display element layer DP-ED. The encapsulation layer TFE may be a thin-film encapsulation layer. The encapsulation layer TFE may be a single layer or multiple layers stacked. The encapsulation layer TFE includes at least one insulation layer. The encapsulation layer TFE according to an embodiment may include at least one inorganic film (hereinafter referred to as an inorganic encapsulation film) The encapsulation layer TFE according to an embodiment may include at least one organic film (hereinafter referred to as an organic encapsulation film) and at least one inorganic encapsulation film.

The inorganic encapsulation film protects the display element layer DP-ED from moisture/oxygen, and the organic encapsulation film protects the display element layer DP-ED from foreign materials such as dust particles. The inorganic encapsulation film may include silicon nitride, silicon oxynitride, silicon oxide, titanium oxide, aluminum oxide, or the like, but the material thereof is not particularly limited thereto. The organic encapsulation film may include an acrylic compound, an epoxy-based compound, and the like. The organic encapsulation film may include a photopolymerizable organic material, but the material thereof is not particularly limited thereto.

The encapsulation layer TFE is disposed on the second electrode EL2 and may fill the opening OH.

Referring to FIGS. 3 and 4, the display device DD may include a non-light emitting regions NPXA and light emitting regions PXA-R, PXA-G, and PXA-B. Each of the light emitting regions PXA-R, PXA-G, and PXA-B may be a region in which light generated from each of the organic electroluminescence devices ED-1, ED-2, and ED-3 is emitted. The light emitting regions PXA-R, PXA-G, and PXA-B may be spaced apart from each other in a plan view.

Each of the light emitting regions PXA-R, PXA-G, and PXA-B may be a region separated by the pixel defining film PDL. The non-light emitting regions NPXA may be regions between the adjacent light emitting regions PXA-R, PXA-G, and PXA-B and may be regions corresponding to the pixel defining film PDL. In the specification, each of the light emitting regions PXA-R, PXA-G, and PXA-B may correspond to a pixel. The pixel definition film PDL may separate the organic electroluminescence devices ED-1, ED-2, and ED-3. The emission layers EML-R, EML-G, and EML-B of the organic electroluminescence devices ED-1, ED-2, and ED-3 may be disposed in the opening OH defined in the pixel definition film PDL and separated.

The light emitting regions PXA-R, PXA-G, and PXA-B may be separated into groups according to the color of light generated from the organic electroluminescence devices ED-1, ED-2, and ED-3. In the display device DD of an embodiment illustrated in FIGS. 1 and 2, three light emitting regions PXA-R, PXA-G, and PXA-B which respectively emit red light, green light, and blue light are illustrated as an example. For example, the display device DD of an embodiment may include a red light emitting region PXA-R, a green light emitting region PXA-G, and a blue light emitting region PXA-B separated from each other.

In the display device DD according to an embodiment, the organic electroluminescence devices ED-1, ED-2, and ED-3 may emit light of different wavelength regions. For example, in an embodiment, the display device DD may include a first organic electroluminescence device ED-1 which emits red light, a second organic electroluminescence device ED-2 which emits green light, and a third organic electroluminescence device ED-3 which emits blue light. For example, the red light emitting region PXA-R, the green light emitting region PXA-G, and the blue light emitting region PXA-B may respectively correspond to the first organic electroluminescence device ED-1, the second organic electroluminescence device ED-2, and the third organic electroluminescence device ED-3.

However, the embodiment of the disclosure is not limited thereto. The first to third organic electroluminescence devices ED-1, ED-2, and ED-3 may emit light of a same wavelength region, or at least one thereof may emit light of a different wavelength region. For example, the first to third organic electroluminescence devices ED-1, ED-2, and ED-3 may emit blue light.

In the display device DD according to an embodiment, the light emitting regions PXA-R, PXA-G, and PXA-B may be arranged in a stripe shape. Referring to FIG. 3, each of red light emitting regions PXA-R, green light emitting regions PXA-G, and blue light emitting regions PXA-B may be aligned in the second direction DR2. The red light emitting region PXA-R, the green light emitting region PXA-G, and the blue light emitting region PXA-B may be alternately arranged in the order of the red light emitting region PXA-R, the green light emitting region PXA-G, and the blue light emitting region PXA-B in the first direction DR1.

FIGS. 3 and 4 illustrate that areas of the light emitting regions PXA-R, PXA-G, and PXA-B are identical or similar, but the embodiment of the disclosure is not limited thereto. The areas of the light emitting regions PXA-R, PXA-G, and PXA-B may be different from each other depending on the wavelength region of emitted light. The areas of the light emitting regions PXA-R, PXA-G, and PXA-B may mean areas when viewed in a plan defined by the first direction DR1 and the second direction DR2.

The arrangement type of the light emitting regions PXA-R, PXA-G, and PXA-B is not limited to what is illustrated in FIG. 3. The order in which the red light emitting region PXA-R, the green light emitting region PXA-G, and the blue light emitting region PXA-B are arranged may be provided in various combinations depending on the characteristics of display quality required in the display device DD. For example, the arrangement shape of the light emitting regions PXA-R, PXA-G, and PXA-B may be a PenTile® arrangement shape, or a diamond arrangement shape.

The areas of the light emitting regions PXA-R, PXA-G, and PXA-B may be different from each other. For example, in an embodiment, the area of the green light emitting region PXA-G may be smaller than that of the blue light emitting region PXA-B, but the embodiment of the disclosure is not limited thereto.

The emission layers EML-R, EML-G, and EML-B may have different thicknesses. For example, a thickness THR of a first emission layer EML-R may be greater than a thickness $TH_G$ of a second emission layer EML-G. The thickness $TH_G$ of the second emission layer EML-G may be greater than a thickness THB of a third emission layer EML-B. For example, the thickness may decrease in the order of the first emission layer EML-R, the second emission layer EML-G, and the third emission layer EML-B.

The emission layers EML-R, EML-G, and EML-B may have different thicknesses. For example, a thickness THR of a first emission layer EML-R may be greater than a thickness $TH_G$ of a second emission layer EML-G. The thickness $TH_G$ of the second emission layer EML-G may be greater than a thickness THB of a third emission layer EML-B. For example, the thickness may decrease in the order of the first emission layer EML-R, the second emission layer EML-G, and the third emission layer EML-B.

Referring to FIG. 5, the display device DD of an embodiment may further include auxiliary resonance layers SL-R, SL-G, and SL-B disposed between the emission layers EML-R, EML-G, and EML-B and the hole transport region HTR. The auxiliary resonance layers SL-R, SL-G, and SL-B may be auxiliary layers which adjust the distance between the first electrode EL1 and the second electrode EL2 to cause constructive interference of light emitted from the emission layers EML-R, EML-G, and EML-B and light reflected from the first electrode EL1 to occur.

The display device DD of an embodiment may have a structure in which light emitted from the emission layers EML-R, EML-G, and EML-B resonates. As for a resonance structure, a resonance distance may vary depending on the wavelength of light emitted from the emission layers EML-R, EML-G, and EML-B. Therefore, the auxiliary resonance layers SL-R, SL-G, and SL-B may be disposed on a lower portion of the emission layers EML-R, EML-G, and EML-B to adjust a resonance distance. The auxiliary resonance layers SL-R, SL-G, and SL-B may have difference thicknesses depending on the wavelength of light emitted from the emission layers EML-R, EML-G, and EML-B. The thickness $TH_{RS}$ of a first auxiliary resonance layer SL-R may be greater than the thickness $TH_G s$ of a second auxiliary resonance layer SL-G, and the thickness $TH_G s$ of the second auxiliary resonance layer SL-G may be greater than the thickness THBs of a third auxiliary resonance layer SL-B. For example, the thickness may decrease in the order of the first auxiliary resonance layer SL-R, the second auxiliary resonance layer SL-G, the third auxiliary resonance layer SL-B. However, this is only illustrative, and the embodiment of the disclosure is not limited thereto. In case that the emission layers EML-R, EML-G, and EML-B emit light of a same wavelength, the thicknesses of the first auxiliary resonance layer SL-R, the second auxiliary resonance layer SL-G, the third auxiliary resonance layer SL-B may be the same.

Figure 6:
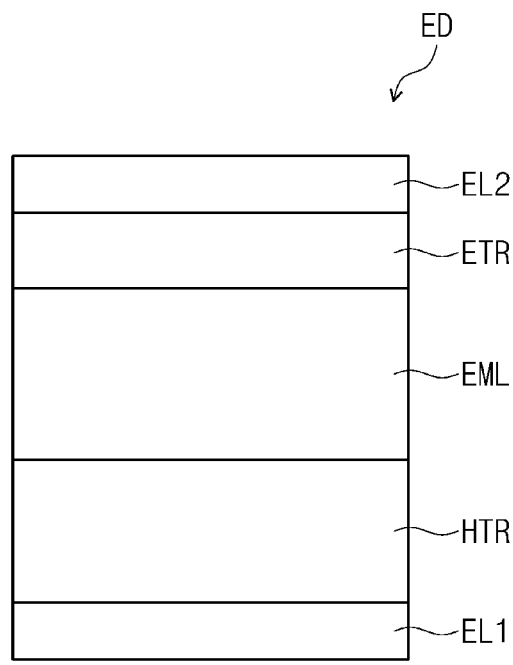
FIG. 6 is a schematic cross-sectional view schematically illustrating an organic electroluminescence device according to an embodiment of the disclosure.

FIG. 6 is a cross-sectional view schematically illustrating an organic electroluminescence device according to an embodiment. FIG. 7 is a cross-sectional view schematically illustrating an organic electroluminescence device according to an embodiment. FIG. 8 is a cross-sectional view schematically illustrating a portion of an organic electroluminescence device according to an embodiment. FIG. 8 is a cross-sectional view schematically illustrating a portion corresponding to a hole transport layer of FIG. 6. As described above, each of the organic electroluminescence devices ED-1, ED-2, and ED-3 included in the display device DD illustrated in FIGS. 4 and 5 and the like may have a structure of the organic electroluminescence device ED illustrated in FIGS. 6 to 8. Hereinafter, referring to FIGS. 6 to 8, an organic electroluminescence device of an embodiment will be described in detail.

Figure 7:
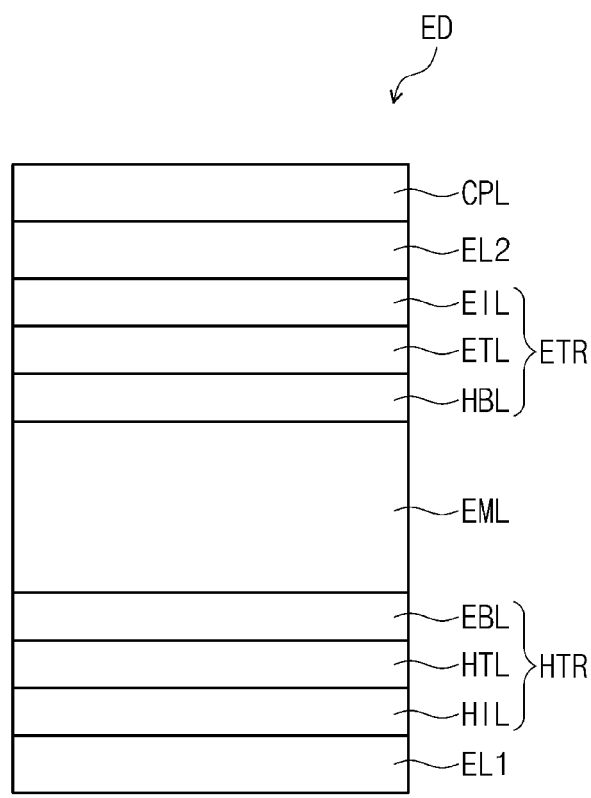
FIG. 7 is a cross-sectional view schematically illustrating an organic electroluminescence device according to an embodiment of the disclosure.
Figure 8:
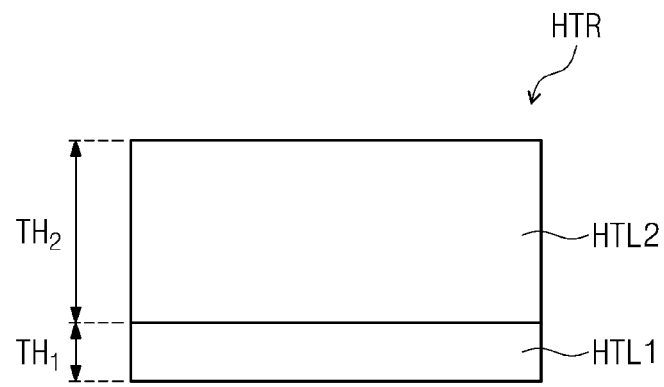
FIG. 8 is a cross-sectional view schematically illustrating a portion of an organic electroluminescence device according to an embodiment of the disclosure.

Referring to FIGS. 6 to 8, the organic electroluminescence device ED according to an embodiment includes the first electrode EL1, the hole transport region HTR disposed on an upper side of the first electrode EL1, an emission layer EML disposed on an upper side of the hole transport region HTR, the electron transport region ETR disposed on an upper side of the emission layer EML, and the second electrode EL2 disposed on an upper side of the electron transport region ETR. The hole transport region HTR may include hole transport regions HTL1 and HTL2. The hole transport regions HTL1 and HTL2 may have different dielectric constants.

The first electrode EL1 has conductivity. The first electrode EL1 may be formed of a metal material, a metal alloy, or a conductive compound. The first electrode EL1 may be an anode or a cathode. However, the embodiment of the disclosure is not limited thereto. In case that the first electrode EL1 is a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, or a compound or a mixture thereof (for example, a mixture of Ag and Mg). As another example, the first electrode EL1 may be of a multi-layered structure including a reflective film or a transflective film, both formed of the above-described materials, and a transparent conductive film formed of indium tin oxide (ITO), indium zinc oxide (IZO), zinc oxide (ZnO), indium tin zinc oxide (ITZO), or the like. For example, the first electrode EL1 may have a three-layered structure of ITO/Ag/ITO, but is not limited thereto. The embodiment of the disclosure is not limited thereto. The first electrode EL1 may include one of the above-described metal materials, a combination of two or more selected from the above-described metal materials, an oxide of one of the above-described metal materials, or the like. The thickness of the first electrode EL1 may be about 700 Å to about 10,000 Å. For example, the thickness of the first electrode EL1 may be about 1,000 Å to about 3,000 Å.

A hole transport region HTR is provided on the first electrode ELL The hole transport region HTR may include the hole transport regions HTL1 and HTL2 having different dielectric constants. The hole transport region HTR may further include at least one of a hole injection layer HIL, a buffer layer or an auxiliary light emitting layer, and an electron blocking layer EBL. The thickness of the hole transport region HTR may be, for example, about 50 Å to about 15,000 Å.

FIGS. 7 and 8 illustrate that the hole transport region HTR includes the hole injection layer HIL and the hole transport layers HTL1 and HTL2, but the hole transport region HTR may not include the hole injection layer HIL, and the hole transport layers HTL1 and HTL2 may be directly disposed on the first electrode ELL However, this is only illustrative, and the embodiment of the disclosure is not limited thereto. In an embodiment, the hole transport region HTR may have a structure in which a buffer layer (not shown) is disposed on a hole transport layer HTL, or a structure in which the electron blocking layer EBL is disposed on an upper portion of the hole transport layer HTL.

The hole transport region HTR may be formed using various methods such as vacuum deposition, spin coating, casting, Langmuir-Blodgett (LB), inkjet printing, laser printing, and laser induced thermal imaging (LITI).

In an embodiment, the hole transport region HTR may include a first hole transport layer HTL1 and a second hole transport layer HTL2 disposed on an upper portion of the first hole transport layer HTL1. The first hole transport layer HTL1 may include a first organic compound having a first dielectric constant, and the second hole transport layer HTL2 may include a second organic compound having a second dielectric constant. The second dielectric constant may be greater than the first dielectric constant. The ratio of the first dielectric constant to the second dielectric constant may be about 1:1.20 to about 1:2.25. The difference between the first dielectric constant and the second dielectric constant may be about 0.6 to about 2.5. The first dielectric constant may be about 2.0 to about 2.8, and the second dielectric constant may be about 3.4 to about 4.5. In case that the first dielectric constant has a value similar to that of the second dielectric constant, and thus, the difference between the first and second dielectric constants is smaller than about 0.6, the decrease in capacity due to a low dielectric constant and the high-speed driving of the organic electroluminescence device ED may not be implemented. In case that the first dielectric constant has a smaller dielectric constant value, and thus, the difference between the first and second dielectric constants is greater than about 2.5, there is a disadvantage in that the mobility of holes is reduced to cause a driving voltage to increase.

For example, the organic electroluminescence device ED of the embodiment includes the first hole transport layer HTL1 having a relatively small dielectric constant, thereby having a small capacity, so that charging time is short to allow a driving rate of 240 Hz to be implemented. In addition, by including the second hole transport layer HTL2 having a relatively large dielectric constant, it is possible to prevent the decrease in other device properties caused by a low dielectric constant. For example, in case that only a hole transport layer having a low dielectric constant is included, the mobility of holes may be reduced to cause a driving voltage to increase.

The ratio of a thickness $TH_1$ of the first hole transport layer HTL1 to a thickness $TH_2$ of the second hole transport layer HTL2 may be about 1:1 to about 1:12. The thickness $TH_1$ of the first hole transport layer HTL1 may be about 100 Å to about 600 Å, and the thickness $TH_2$ of the second hole transport layer HTL2 may be about 600 Å to about 1,200 Å. The ratio of the thicknesses $TH_1$ and $TH_2$ (i.e., $TH_1:TH_2$) of the first and second hole transport layers HTL1 and HTL2 may be adjusted to an optimal range according to the wavelength of light emitted from the emission layer EML, display quality required in the display device DD (see FIG. 3), and types of hole transport materials used in each of the hole transport layers HTL1 and HTL2 of the hole transport region HTR.

In an embodiment, the first hole transport layer HTL1 may be directly disposed on an upper side of the first electrode EL1. The second hole transport layer HTL2 may be directly disposed on a lower side of the emission layer EML.

In an embodiment, the first hole transport layer HTL1 may include a first organic compound represented by Formula 1 below.

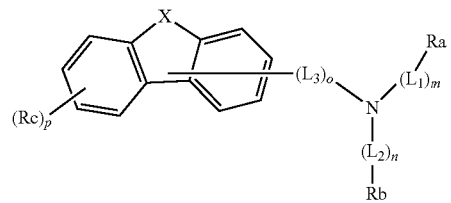

[Formula 1]

Characters m to o may each independently be 0 or 1. In case that m is 0, Ra may be directly bonded to nitrogen atoms of amine, and in case that m is 1, Ra may be bonded to nitrogen atoms of amine through $L_1$. In case that n is 0, Rb may be directly bonded to nitrogen atoms of amine, and in case that n is 1, Rb1 may be bonded to nitrogen atoms of

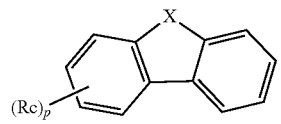

amine through $L_2$. In case that o is 0, may be directly bonded to nitrogen atoms of amine. In case that o is 1, Re may be directly bonded to nitrogen atoms of amine through $L_3$. Ra and Rb may each independently be a hydrogen atom, a deuterium atom, a halogen atom, a substituted or unsubstituted aryl group having about 6 to about 30 ring-forming carbon atoms, or a substituted or unsubstituted amine group.

Character p may be an integer of 1 to 4. In case that p is 1, an Rc may be substituted on a benzene ring which is not bonded to $L_3$ in

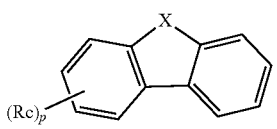

.

In case that p is 2, two Rcs may be substituted on a benzene ring which is not bonded to $L_3$ in

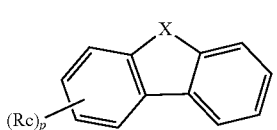

.

In case that p is 3, three Rcs may be substituted on a benzene ring which is not bonded to $L_3$ in

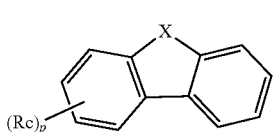

.

In case that p is 4, four Rcs may be substituted on a benzene ring which is not bonded to $L_3$ in

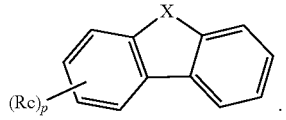

Rc may each independently be a hydrogen atom, a deuterium atom, a halogen atom, a substituted or unsubstituted aryl group having about 6 to about 30 ring-forming carbon atoms, or a substituted or unsubstituted amine group.

$L_1$ to $L_3$ may each independently be a substituted or unsubstituted arylene group having about 6 to about 30 ring-forming carbon atoms. In case that m is 0, Ra may be directly bonded to nitrogen atoms of amine. In case that m is 1, Ra may be directly bonded to nitrogen atoms of amine through $L_1$. In case that n is 0, Rb may be directly bonded to nitrogen atoms of amine. In case that n is 1, Rb may be directly bonded to nitrogen atoms of amine through $L_2$.

In Formula 1, X may be N, $NR_1$, or $CR_2R_3$. $R_1$ to $R_3$ may each independently be a substituted or unsubstituted alkyl group having about 1 to about 10 carbon atoms, or a substituted or unsubstituted aryl group having about 6 to about 30 ring-forming carbon atoms. In case that X is N or $NR_1$, at least one of Ra and Rb may be a substituted or unsubstituted cyclohexyl group, a substituted or unsubstituted triphenylsilyl group, a fluorenyl group containing a substituted or unsubstituted alkyl group having about 2 to about 16 carbon atoms as a substituent, or an aryl group having about 6 to about 30 ring-forming carbon atoms containing a substituted or unsubstituted cyclohexyl group as a substituent.

In case that X is $CR_2R_3$, at least one of $R_2$ and $R_3$ may each independently be a substituted or unsubstituted alkyl group having about 6 to about 10 carbon atoms, or at least one of Ra and Rb may be a substituted or unsubstituted cyclohexyl group, a substituted or unsubstituted triphenylsilyl group, a fluorenyl group containing a substituted or unsubstituted alkyl group having about 2 to about 16 carbon atoms as a substituent, or an aryl group having about 6 to about 30 ring-forming carbon atoms containing a substituted or unsubstituted cyclohexyl group as a substituent.

In case that at least one of Ra and Rb includes a substituted or unsubstituted cyclohexyl group, a substituted or unsubstituted triphenylsilyl group, a fluorenyl group containing a substituted or unsubstituted alkyl group having about 2 to about 16 carbon atoms as a substituent, or an aryl group having about 6 to about 30 ring-forming carbon atoms containing a substituted or unsubstituted cyclohexyl group as a substituent, the steric hindrance of the substituent may cause the packing density of the compound to decrease, and as a result, the charge density of the first hole transport layer HTL1 provided with the first organic compound decreases, so that the first hole transport layer HTL1 may have a low dielectric constant.

In case that X is $CR_2R_3$, even in case that $R_2$ and $R_3$ are alkyl groups having about 6 or more carbon atoms, the steric hindrance of the substituent may cause the packing density of the compound to decrease, and as a result, the charge density of the first hole transport layer HTL1 provided with the first organic compound decreases, so that the first hole transport layer HTL1 may have a low dielectric constant.

In an embodiment, Formula 1 may be a compound represented by one of Formula 2 to Formula 4.

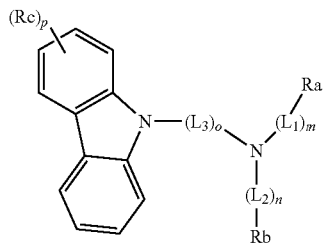

[Formula 2]

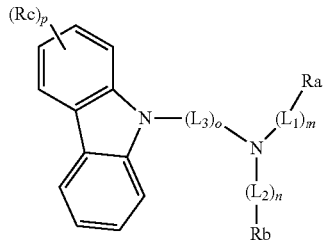

[Formula 3]

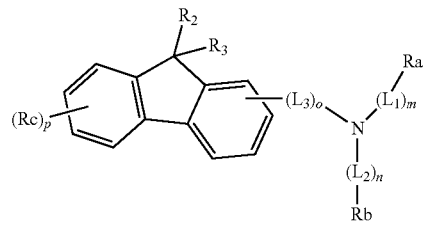

[Formula 4]

Formula 2 is a case in which X is N in Formula 1, and X is bonded to $L_3$. Formula 3 is a case in which X is $NR_1$ in Formula 1. Formula 4 is a case in which X is $CR_2R_3$ in Formula 1. Characters m to p, Ra to Rc, $L_1$ to $L_3$ in Formula 2 to Formula 4, $R_1$ in Formula 3, and $R_2$ and $R_3$ in Formula 4 may be the same as defined in Formula 1.

In an embodiment, Formula 4 may be represented by Formula 4-1 below.

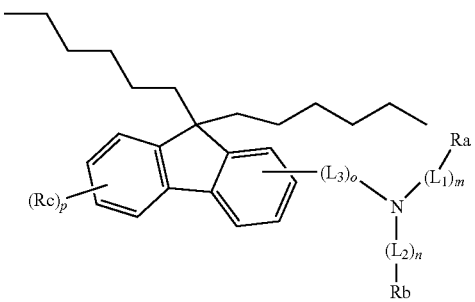

[Formula 4-1]

Formula 4-1 is a case in which both $R_2$ and $R_3$ are alkyl groups having about 6 or more carbon atoms in Formula 4. In case that both $R_2$ and $R_3$ are alkyl groups having about 6 or more carbon atoms, the steric hindrance of the substituent may cause the packing density of the compound to decrease, and as a result, the charge density of the first hole transport layer HTL1 provided with the first organic compound decreases, so that the first hole transport layer HTL1 may have a low dielectric constant.

In Formula 4-1, Ra to Rc, $L_1$ to $L_3$, and m to p may be the same as defined in Formula 1.

In an embodiment, Formula 1 may be a compound represented by Formula 5 below.

[Formula 5]

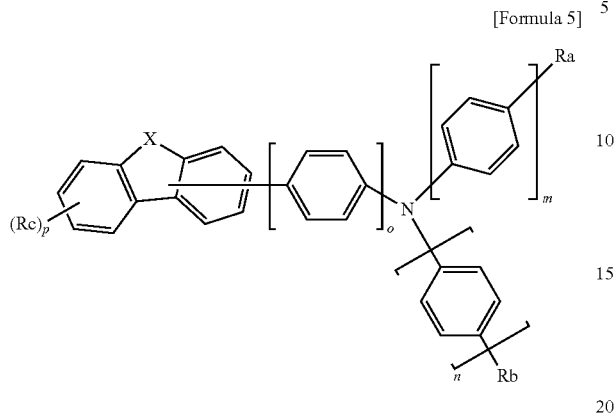

Formula 5 is a case in which $L_1$ to $L_3$ are each a phenylene group in Formula 1. In Formula 5, m to p, Ra to Rc, and X may be as defined in Formula 1.

In Formula 1, Ra and Rb may each independently be a compound represented by one of Formula 6 to Formula 13 below.

[Formula 6]

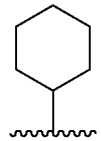

[Formula 7]

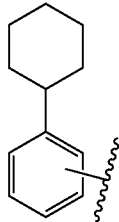

[Formula 8]

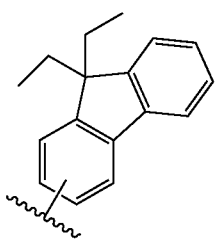

[Formula 9]

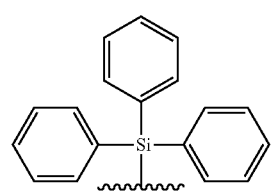

[Formula 10]

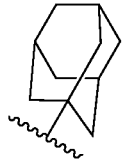

[Formula 11]

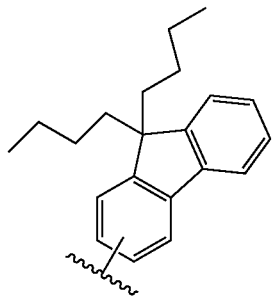

[Formula 12]

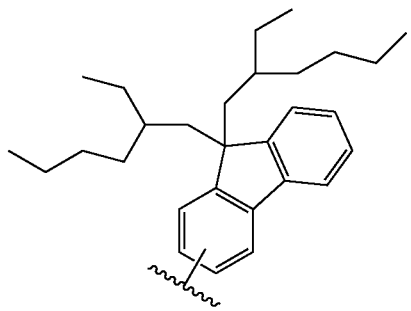

[Formula 13]

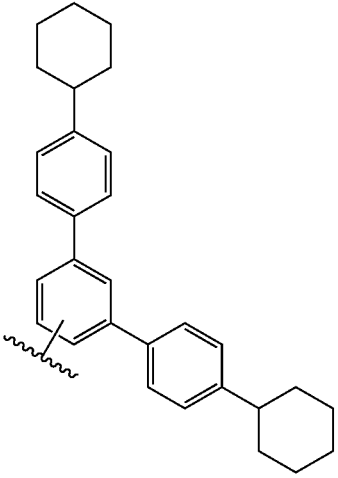

In Formula 6 to Formula 13 above,

may be a position at which Ra is bonded to $L_1$, or a position at which Rb is bonded to $L_2$.

In an embodiment, the first organic compound may be represented by one of compounds of Compound group 1 below.

[Compound Group 1]
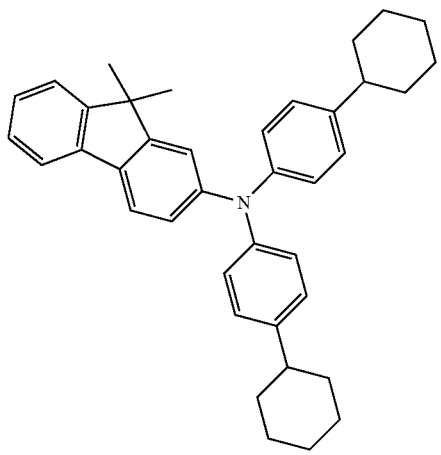
1
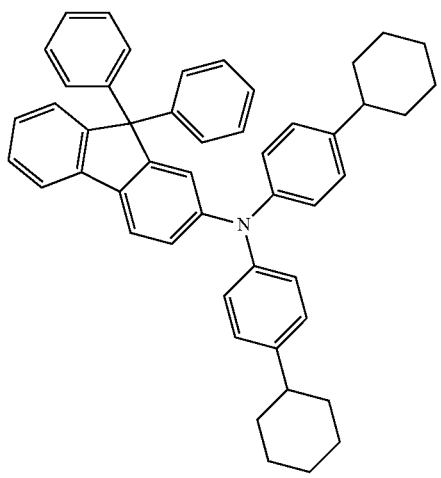
2
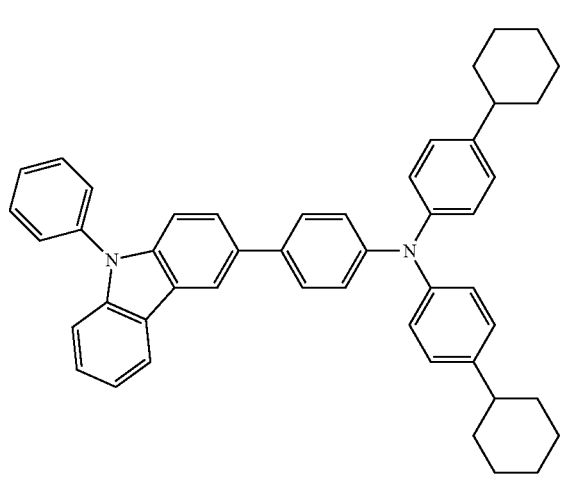
3
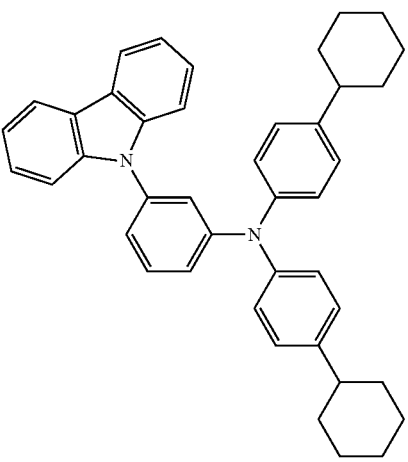
4
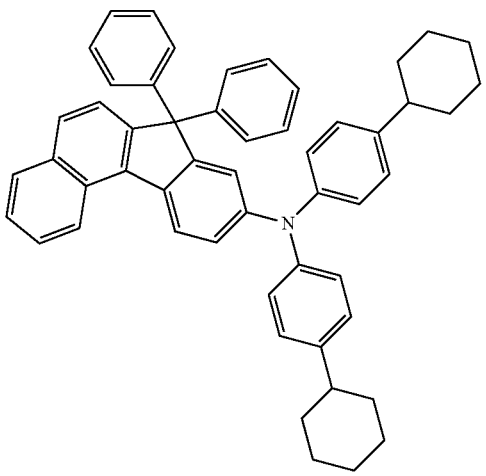
5
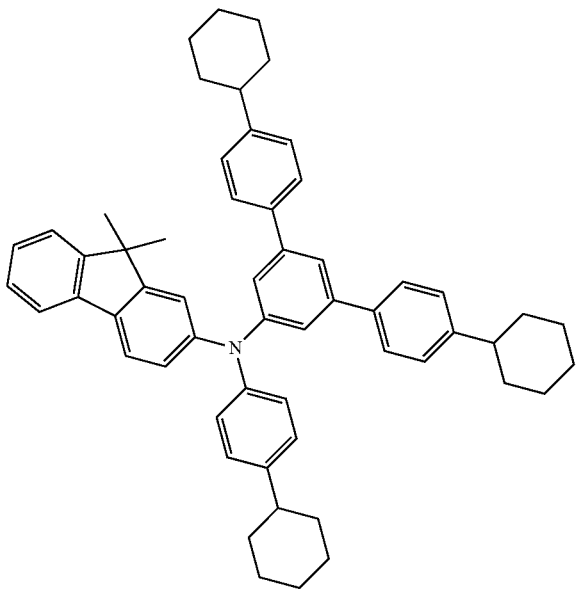
6

7
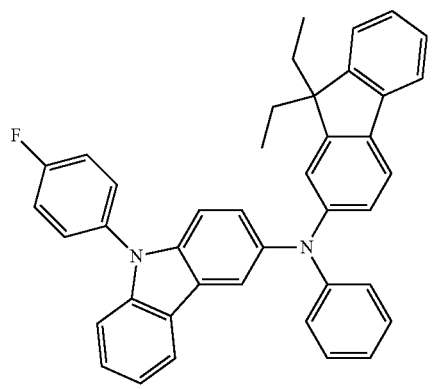
8
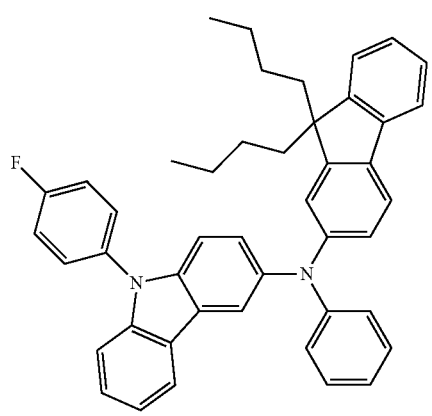
9
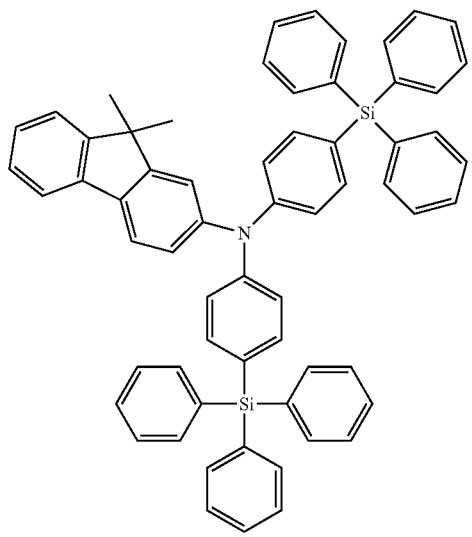
10
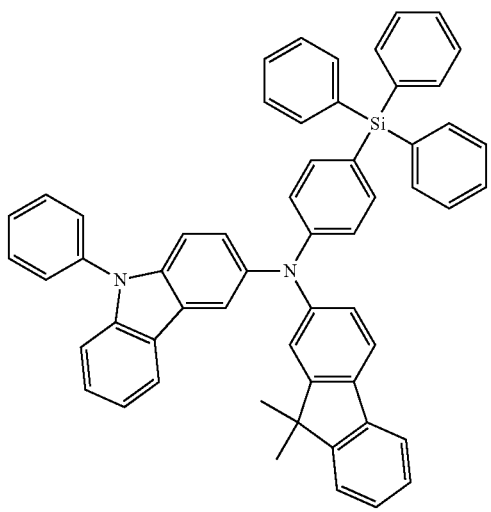
11
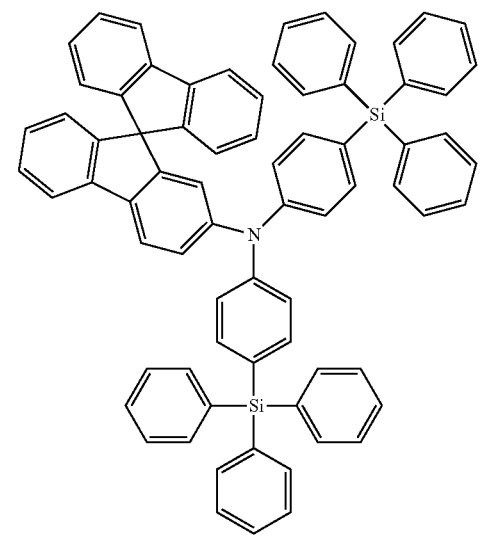
12
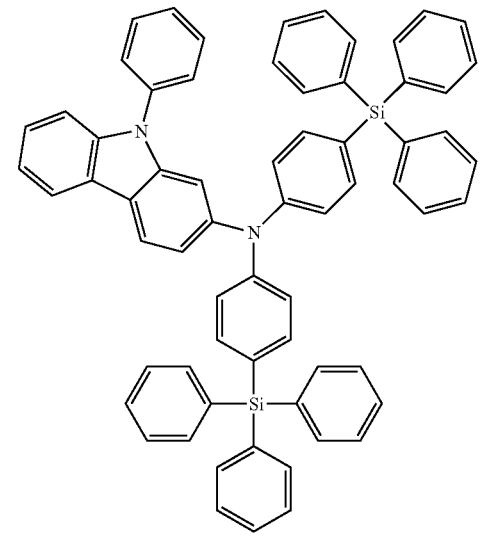

13

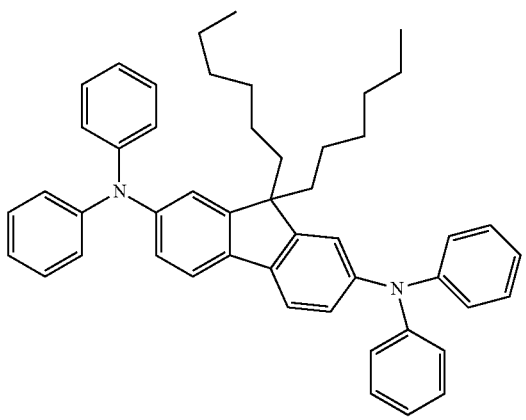

14

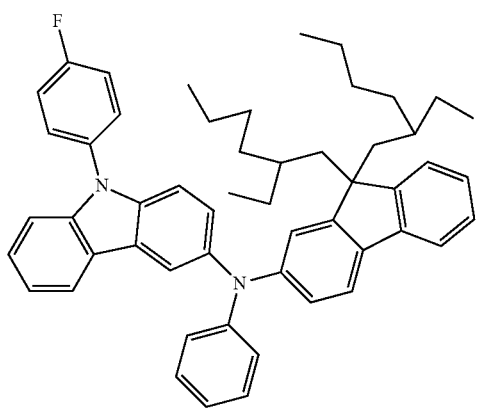

15

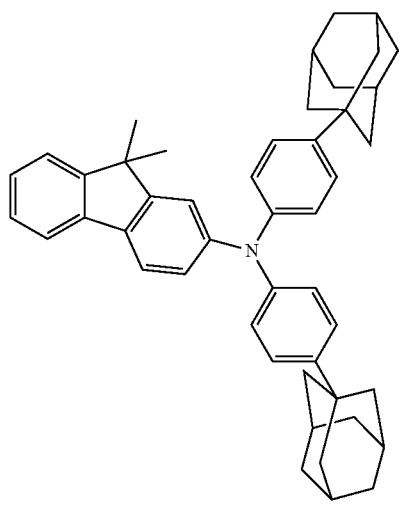

The second hole transport layer HTL2 may include a second organic compound represented by Formula H-1 below.

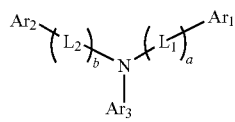

[Formula H-1]

In Formula H-1 above, $L_1$ and $L_2$ may each independently be a direct linkage, a substituted or unsubstituted arylene group having about 6 to about 30 ring-forming carbon atoms, or a substituted or unsubstituted heteroarylene group having about 2 to about 30 ring-forming carbon atoms. Characters a and b may each independently be an integer of 0 to 10. In case that a or b is an integer of 2 or greater, $L_1$ and $L_2$ may each independently be a substituted or unsubstituted arylene group having about 6 to about 30 ring-forming carbon atoms, or a substituted or unsubstituted heteroarylene group having about 2 to about 30 ring-forming carbon atoms.

In Formula H-1, $Ar_1$ and $Ar_2$ may each independently be a substituted or unsubstituted aryl group having about 6 to about 30 ring-forming carbon atoms, or a substituted or unsubstituted heteroaryl group having about 2 to about 30 ring-forming carbon atoms. In Formula H-1, $Ar_3$ may be a substituted or unsubstituted aryl group having about 6 to about 30 ring-forming carbon atoms.

The compound represented by Formula H-1 above may be a monoamine compound. As another example, the compound represented by Formula H-1 above may a diamine compound in which at least one of $Ar_1$ to $Ar_3$ contains an amine group as a substituent. The compound represented by Formula H-1 above may be a carbazole-based compound containing a substituted or unsubstituted carbazole group in at least one of $Ar_1$ and $Ar_2$, or a fluorene-based compound containing a substituted or unsubstituted fluorene group in at least one of $Ar_1$ and $Ar_2$.

The compound represented by Formula H-1 may be represented by one of compounds of Compound group H below. However, the compounds listed in Compound group H below are only illustrative. The compound represented by Formula H-1 is not limited to those listed in Compound group H below.

[Compound Group 2]

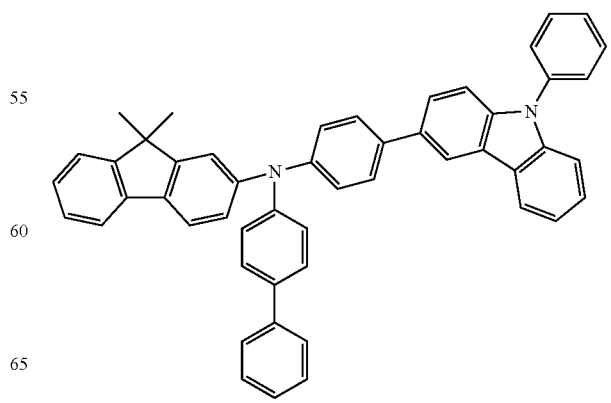

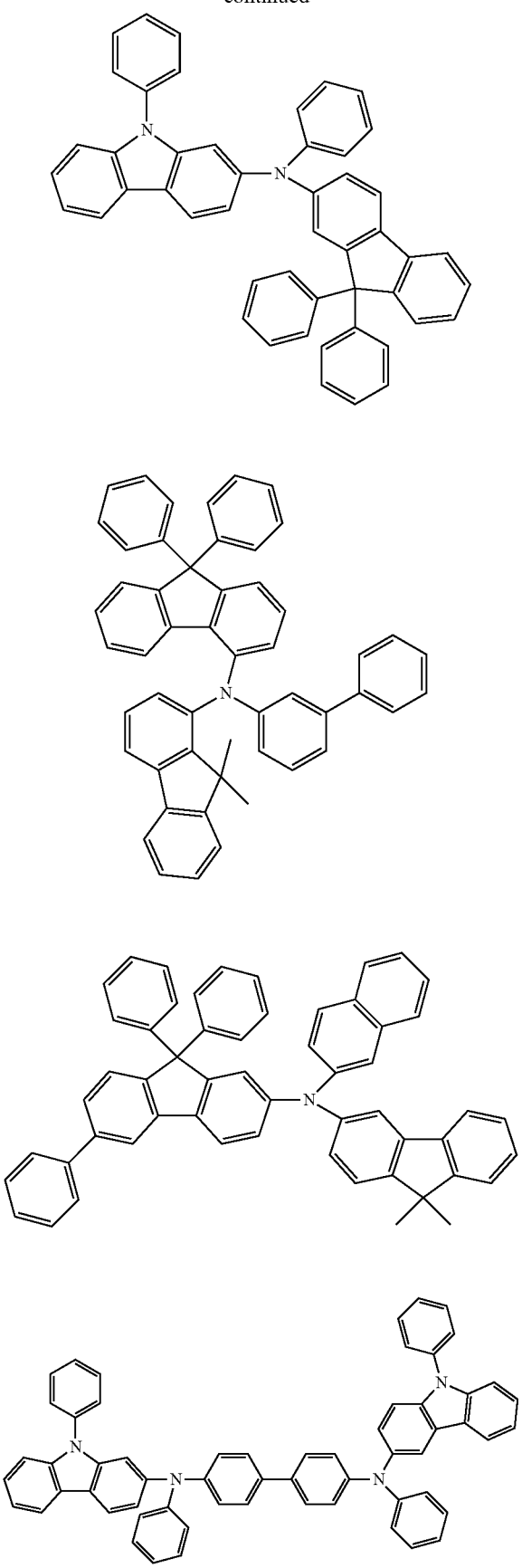
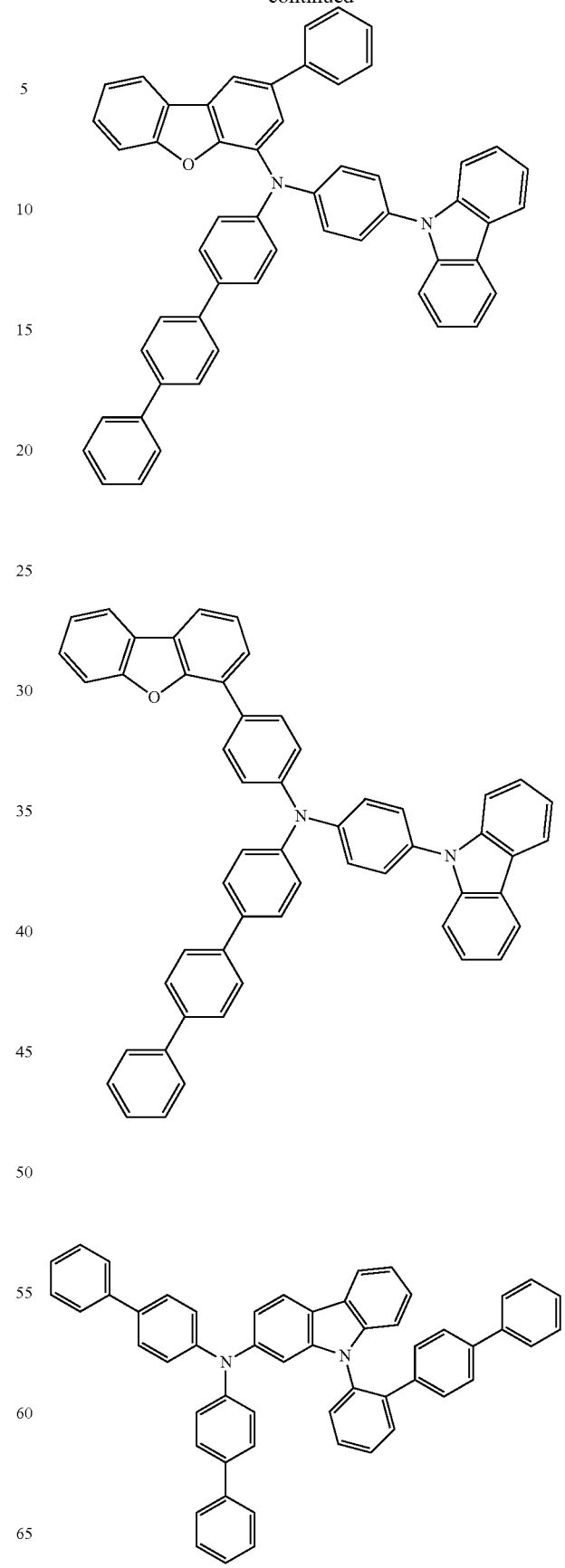

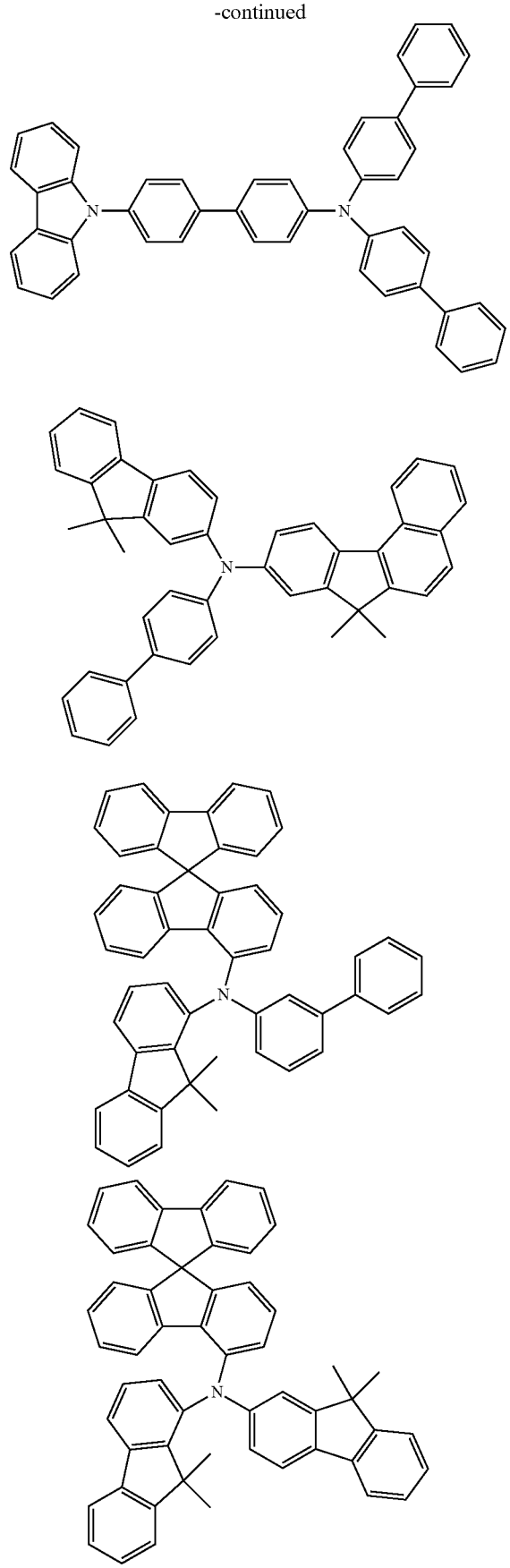
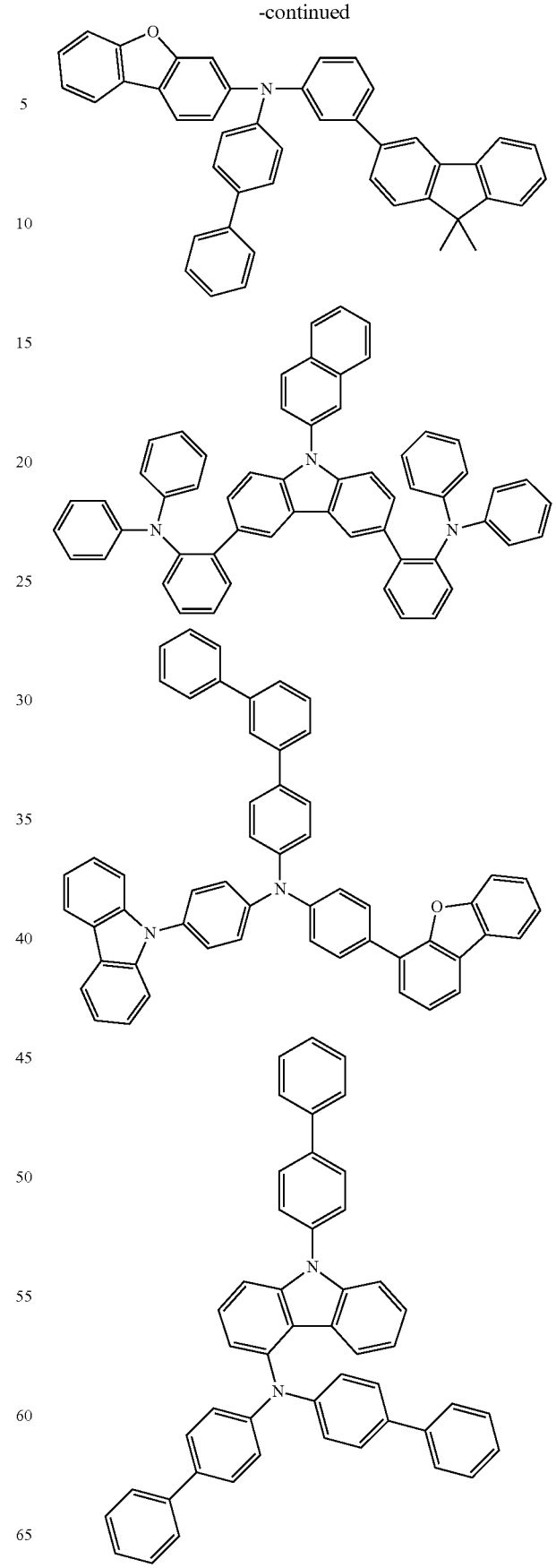

-continued

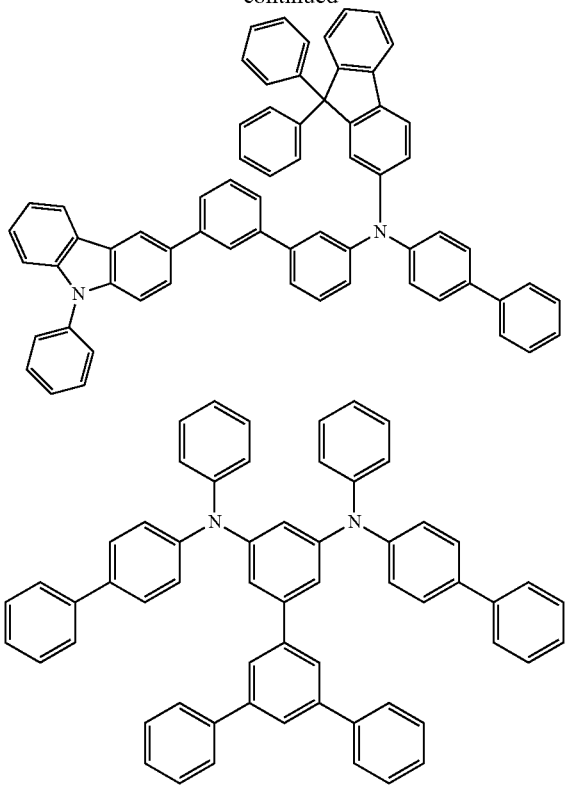

The second hole transport layer HTL2 may include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium [tetrakis(pentafluorophenyl)borate], dipyrazino [2,3-f: 2',3'-h] quinoxaline-2,3,6,7,10,11-hexacarbonitrile (HATCN), and the like.

The second hole transport layer HTL2 may include a carbazole-based derivative such as N-phenylcarbazole and polyvinylcarbazole, a fluorene-based derivative, a triphenylamine-based derivative such as N,N-bis(3-methylphenyl)-N,N-diphenyl-[1,1-biphenyl]-4,4'-diamine (TPD) and 4,4',4"-tris(N-carbazolyl)triphenylamine (TCTA), N,N-di(naphthalene-1-yl)-N,N-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), and the like.

The second hole transport layer HTL2 may include a carbazole-based derivative such as N-phenylcarbazole and polyvinylcarbazole, a fluorene-based derivative, a triphenylamine-based derivative such as N,N-bis(3-methylphenyl)-N,N-diphenyl-[1,1-biphenyl]-4,4'-diamine (TPD) and 4,4',4"-tris(N-carbazolyl)triphenylamine (TCTA), N,N-di(naphthalene-1-yl)-N,N-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), or the like.

In the specification, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers.

The emission layer EML is provided on the hole transport region HTR. The emission layer EML may have a thickness of about 100 Å to about 1,000 Å, or about 100 Å to about 300 Å. The emission layer EML may have a single-layered structure having a single layer formed of a single material, a single-layered structure having a single layer formed of different materials, or a multi-layered structure having layers formed of different materials.

In the organic electroluminescence device ED of an embodiment, the emission layer EML may include an anthracene derivative, a pyrene derivative, a fluoranthene derivative, a chrysene derivative, a dihydrobenz anthracene derivative, or a triphenylene derivative. Specifically, the emission layer EML may include an anthracene derivative or a pyrene derivative.

In the organic electroluminescence device ED of an embodiment illustrated in FIGS. 6 to 8, the emission layer EML may include a host and a dopant, and the emission layer EMT may include a compound represented by Formula E-1 below. The compound represented by Formula E-1 above may be used as a fluorescent host material.

[Formula E-1]

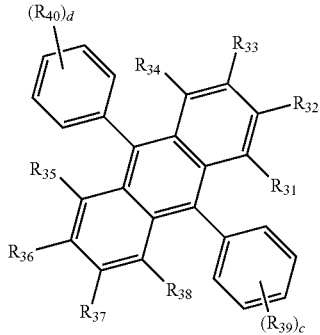

In Formula E-1, $R_{31}$ to $R_{40}$ may each independently be a hydrogen atom, a deuterium atom, a halogen atom, a substituted or unsubstituted silyl group, a substituted or unsubstituted alkyl group having about 1 to about 10 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group. $R_{31}$ to $R_{40}$ may be bonded to an adjacent group to form a saturated hydrocarbon ring or an unsaturated hydrocarbon ring.

In Formula E-1, c and d may each independently be an integer of 0 to 5.

E1
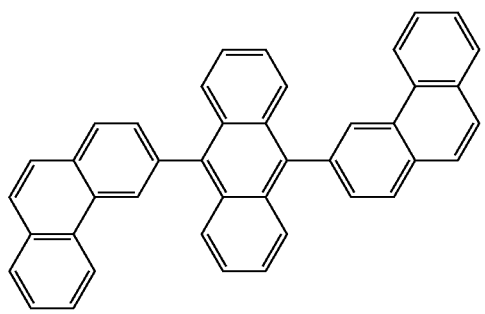
E2
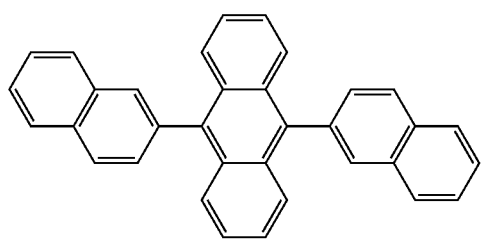
E3
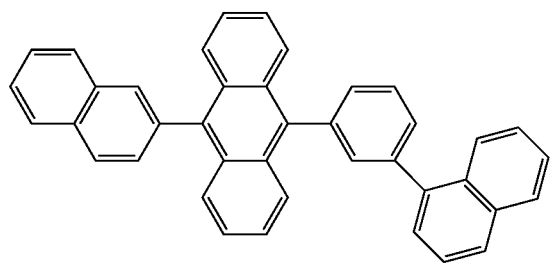
E4
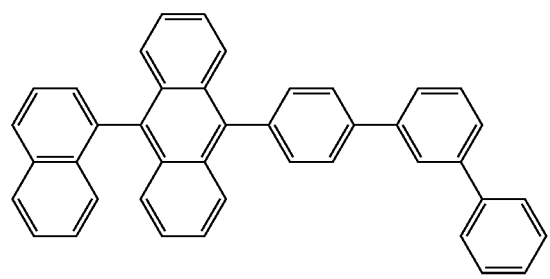
E5
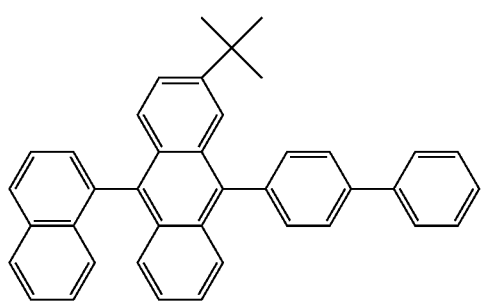
E6
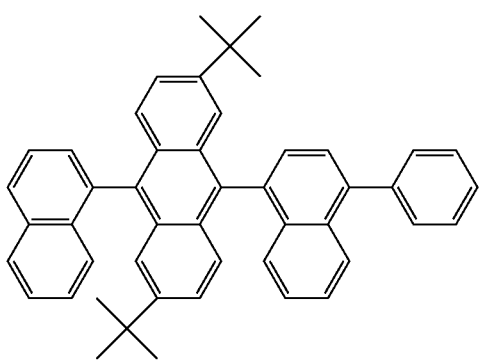
E7
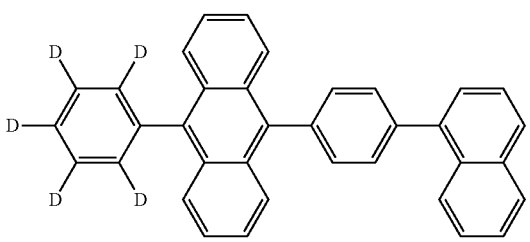
E8
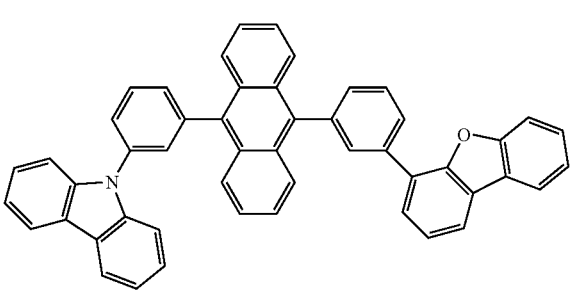
E9
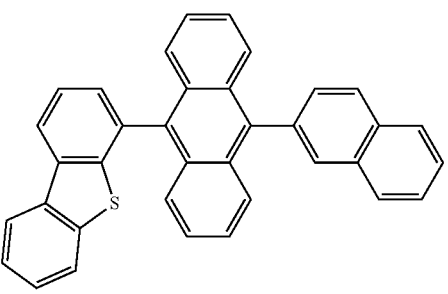
E10
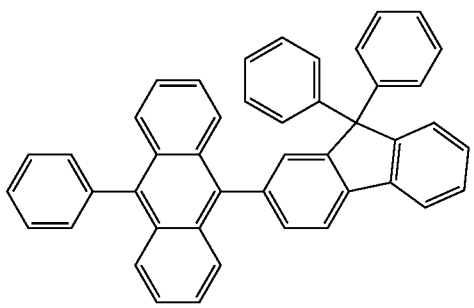

-continued
E11
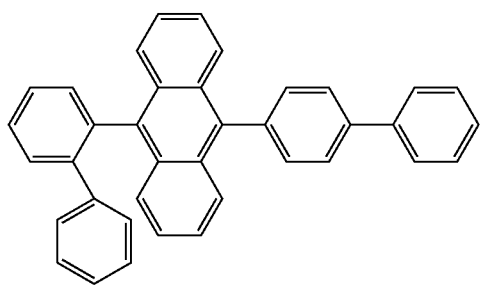
E12
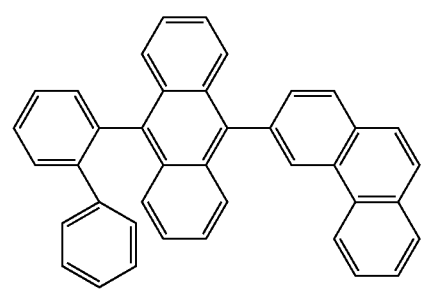
E13
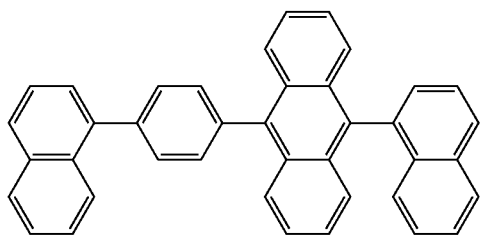
E14
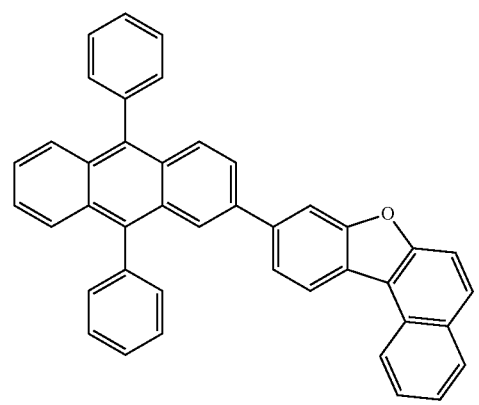
-continued
E15
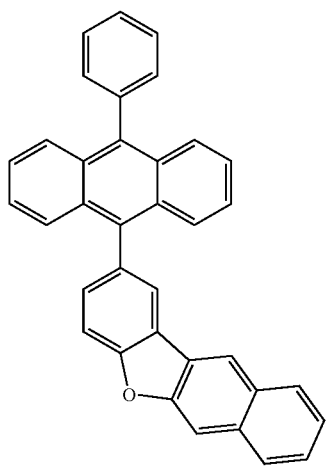
E16
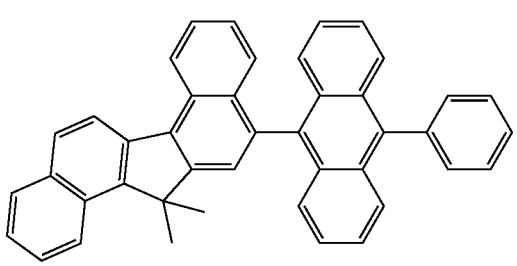
E17
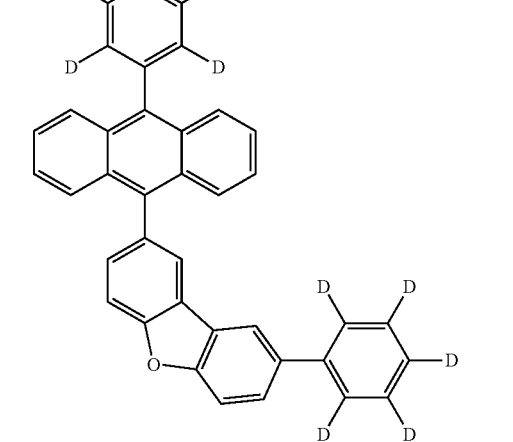

E18

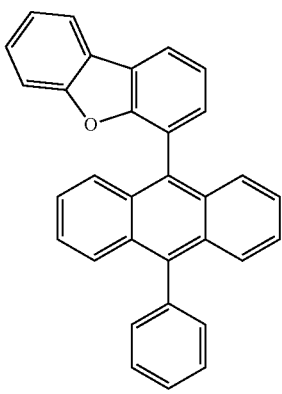

In an embodiment, the emission layer EML may include a compound represented by Formula E-2a or Formula E-2b below. The compound represented by Formula E-2a or Formula E-2b below may be used as a phosphorescent host material.

[Formula E-2a]

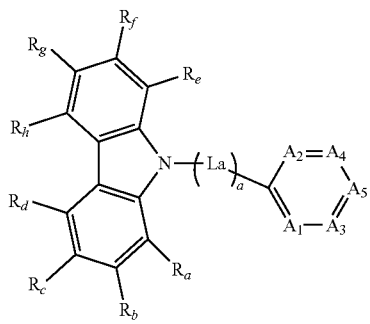

In Formula E-2a, character a may be an integer of about 0 to about 10, $L_a$ may be a direct linkage, a substituted or unsubstituted arylene group having about 6 to about 30 ring-forming carbon atoms, or a substituted or unsubstituted heteroarylene group having about 2 to about 30 ring-forming carbon atoms. In case that a is an integer of 2 or greater, $L_a$s may each independently be a substituted or unsubstituted arylene group having about 6 to about 30 ring-forming carbon atoms, or a substituted or unsubstituted heteroarylene group having about 2 to about 30 ring-forming carbon atoms.

In Formula E-2a, $A_1$ to $A_5$ may each independently be N or $CR_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having about 1 to about 10 carbon atoms, a substituted or unsubstituted alkenyl group having about 2 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group. $R_a$ to $R_1$ may be bonded to an adjacent group to form a hydrocarbon ring, or a hetero ring containing N, O, S, and the like as a ring-forming atom.

In Formula E-2a, two or three selected from $A_1$ to $A_5$ may be N, and the rest thereof may be $CR_i$.

[Formula E-2b]

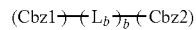

In Formula E-2b, Cbz1 and Cbz2 may each independently be an unsubstituted carbazole group, or a carbazole group substituted with an aryl group having about 6 to about 30 ring-forming carbon atoms. Character $L_b$ may be a direct linkage, a substituted or unsubstituted arylene group having about 6 to about 30 ring-forming carbon atoms, or a substituted or unsubstituted heteroarylene group having about 2 to about 30 ring-forming carbon atoms. b is an integer of 0 to 10, and in case that b is an integer of 2 or greater, $L_b$s may each independently be a substituted or unsubstituted arylene group having about 6 to about 30 ring-forming carbon atoms, or a substituted or unsubstituted heteroarylene group having about 2 to about 30 ring-forming carbon atoms.

The compound represented by Formula E-2a or Formula E-2b may be represented by one of compounds of Compound group E-2 below. However, the compounds listed in Compound group E-2 below are only illustrative. The compound represented by Formula E-2a or Formula E-2b is not limited to those listed in Compound group E-2 below.

[Compound group E-2]

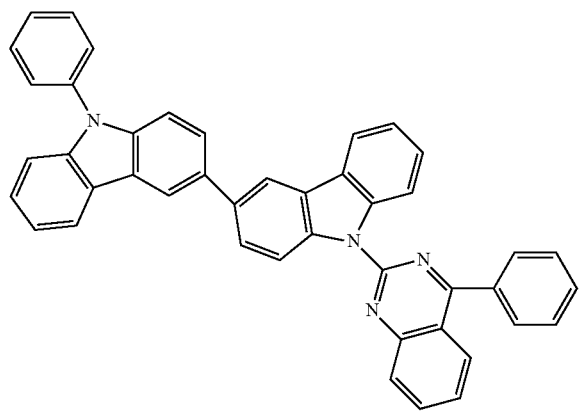

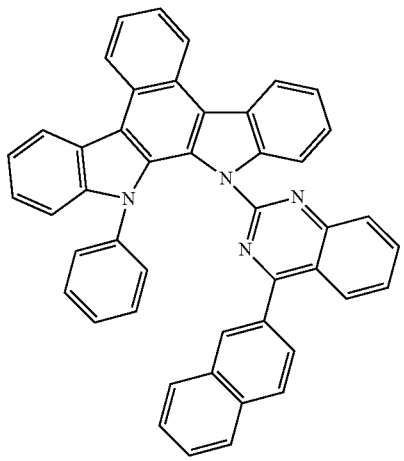

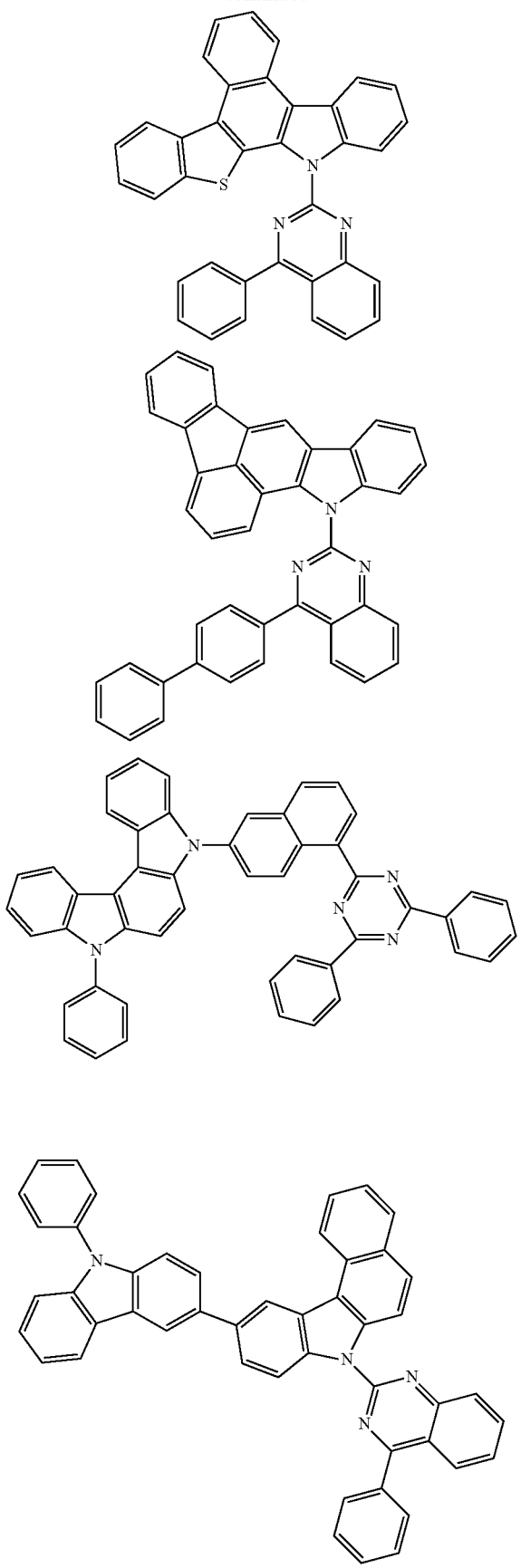
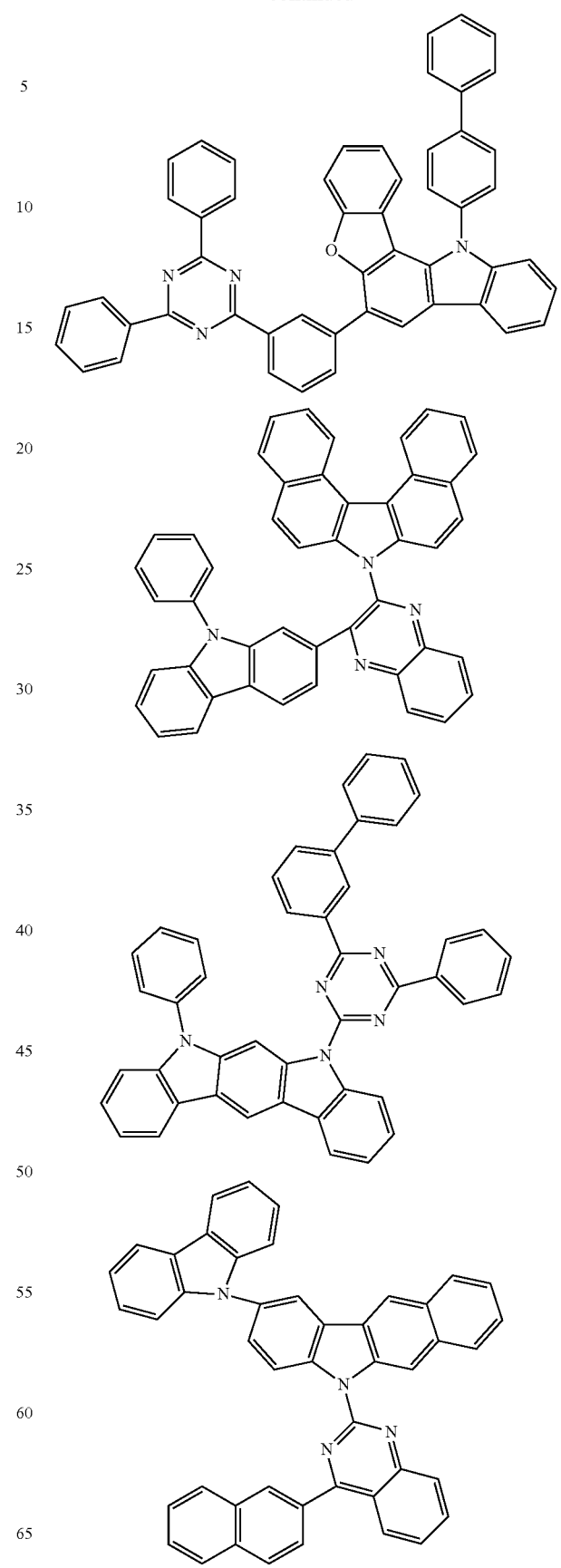

51
-continued
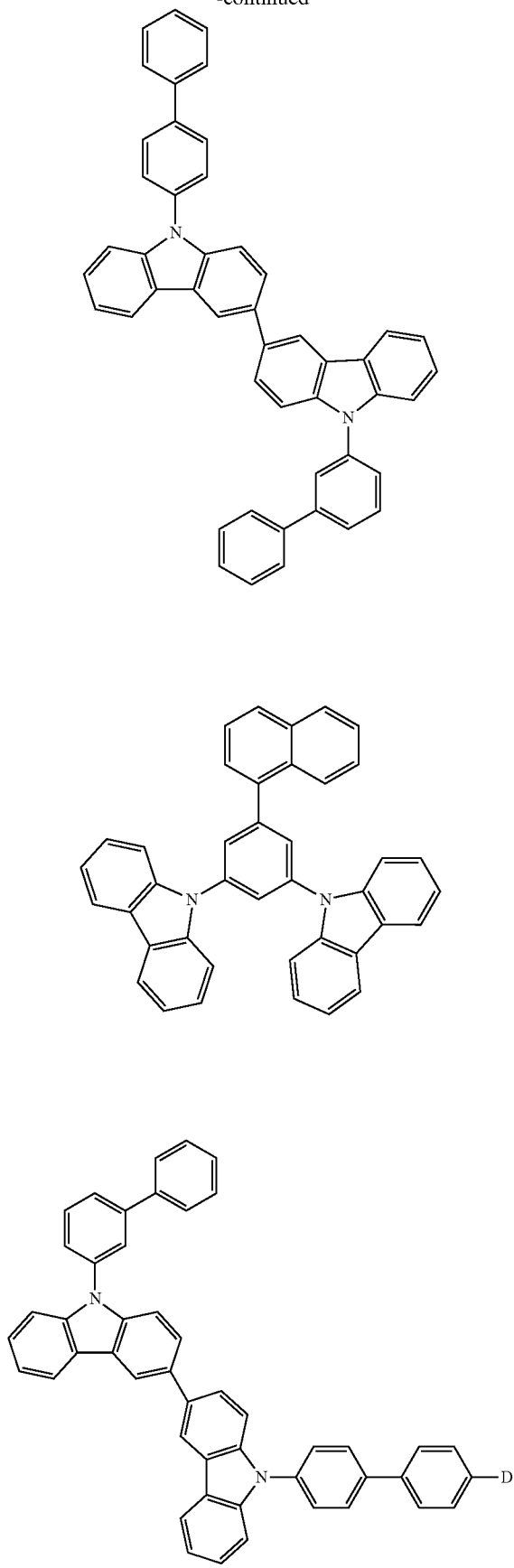
52
-continued
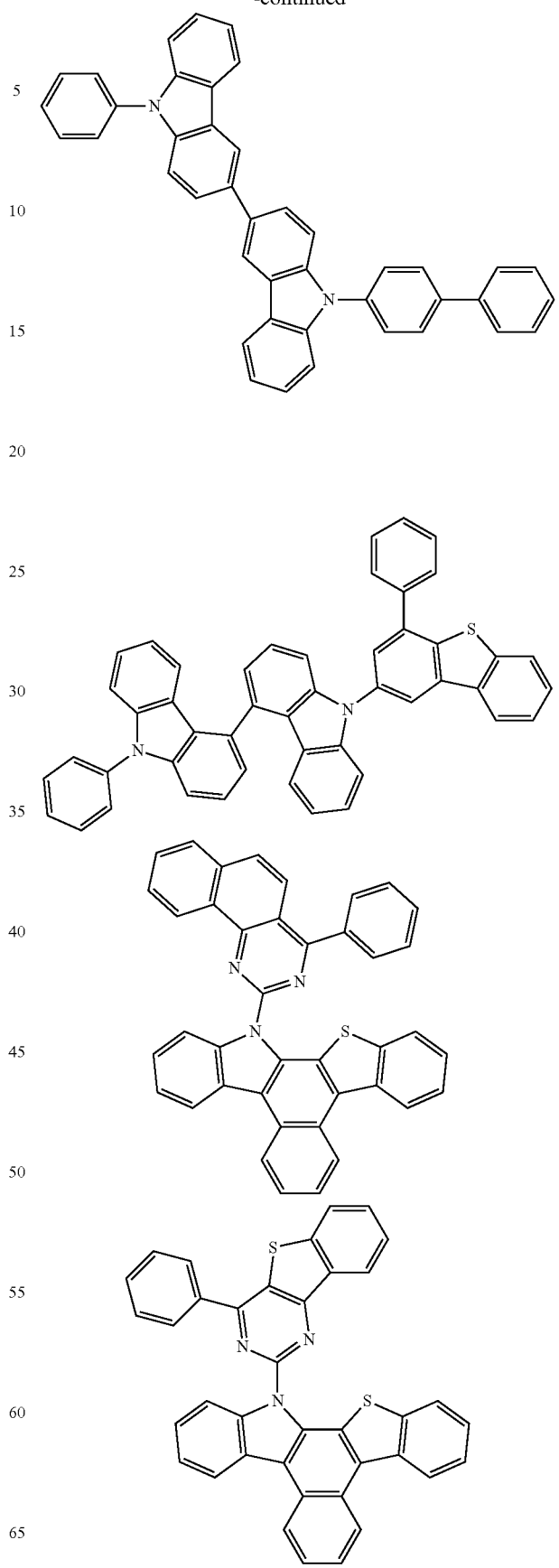

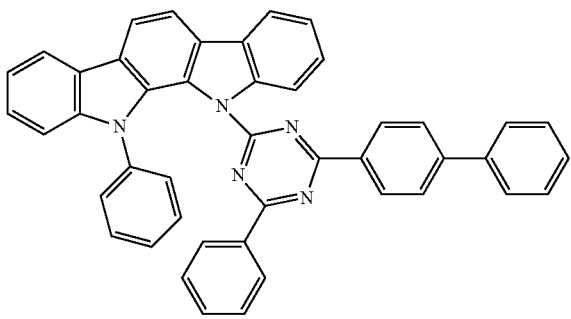

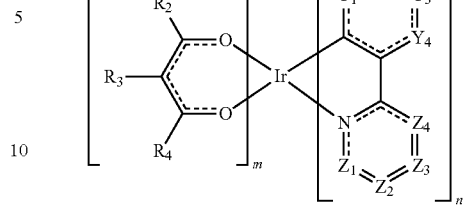

[Formula M-a]

In Formula M-a, $Y_1$ to $Y_4$ and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having about 1 to about 10 carbon atoms, a substituted or unsubstituted alkenyl group having about 2 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group. In Formula M-a, m is 0 or 1, and n is 2 or 3. In Formula M-a, in case that m is 0, n is 3, and in case that m is 1, n is 2.

The compound represented by Formula M-a may be used as a red phosphorescent dopant or a green phosphorescent dopant.

The emission layer EML may further include a common material known in the art as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis (carbazol-9-yl)benzene (mCP), 2,8-bis(diphenylphosphoryl) dibenzo[b,d]furan (PPF), 4,4',4"-tris(carbazol-9-yl)-triphenylamine (TCTA), or 1,3,5-tris(1-phenyl-1H-benzo[d] imidazole-2-yl)benzene (TPBi). However, the embodiment of the disclosure is not limited thereto. For example, tris(8-hydroxyquinolino)aluminum ($Alq_3$), 4,4'-bis(N-carbazolyl)-1,1'-biphenyl (CBP), poly(N-vinylcabazole (PVK), 9,10-di (naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), and the like may be used as a host material.

The emission layer EML may include a compound represented by Formula M-a or Formula M-b below. The compound represented by Formula M-a or Formula M-b below may be used as a phosphorescent dopant material.

The compound represented by Formula M-a may be represented by one of compounds M-a1 to M-a5 below. However, the compounds M-a1 to M-a5 below are only illustrative. The compound represented by Formula M-a is not limited to those represented by the compounds M-a1 to M-a5 below.

M-a1

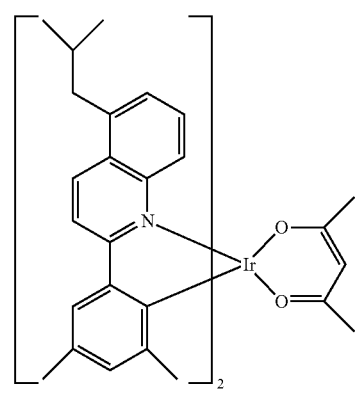

M-a2

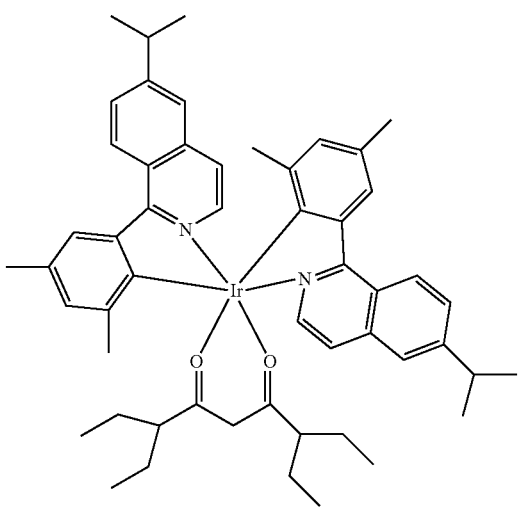

M-a3

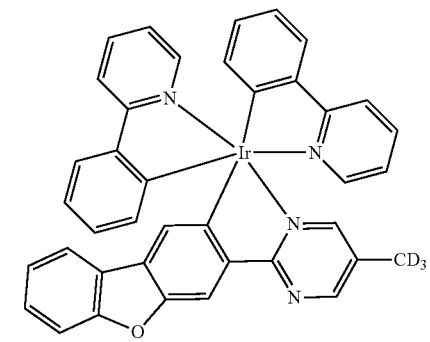

M-a4

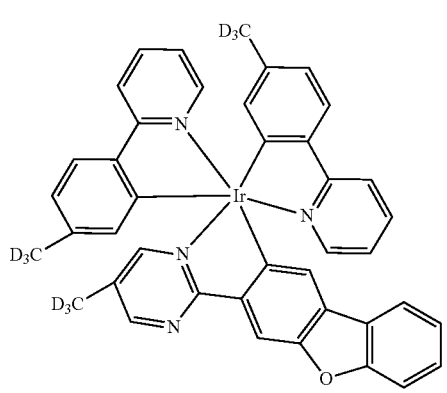

M-a5

A compound M-a1 and a compound M-a2 may be used as a red dopant material, and a compound M-a3 to a compound M-a5 may be used as a green dopant material.

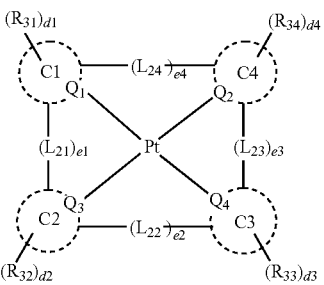

[Formula M-b]

In Formula M-b, $Q_1$ to $Q_4$ are each independently C or N, and C1 to C4 are each independently a substituted or unsubstituted hydrocarbon ring having about 5 to about 30 ring-forming carbon atoms, or a substituted or unsubstituted hetero ring having about 2 to about 30 ring-forming carbon atoms. Characters $L_{21}$ to $L_{24}$ are each independently a direct linkage,

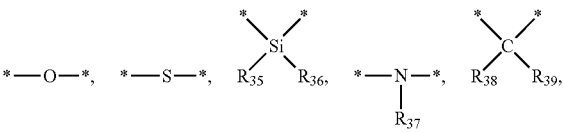

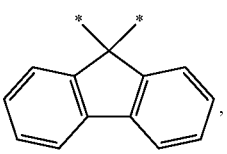

a substituted or unsubstituted alkyl group having about 1 to about 20 carbon atoms, a substituted or unsubstituted arylene group having about 6 to about 30 ring-forming carbon atoms, or a substituted or unsubstituted heteroarylene group having about 2 to about 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group, and d1 to d4 are each independently an integer of 0 to 4.

The compound represented by Formula M-b may be used as a blue phosphorescent dopant or a green phosphorescent dopant.

The compound represented by Formula M-b may be represented by one of compounds below. However, the compounds below are only illustrative. The compound represented by Formula M-b is not limited to the compounds below.

-continued
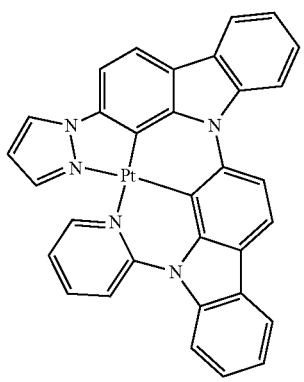
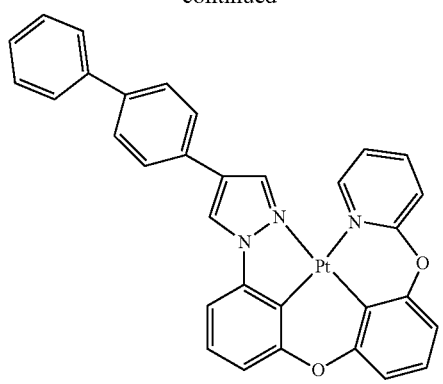
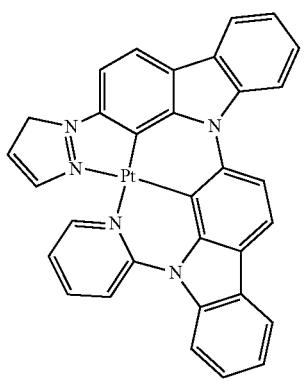
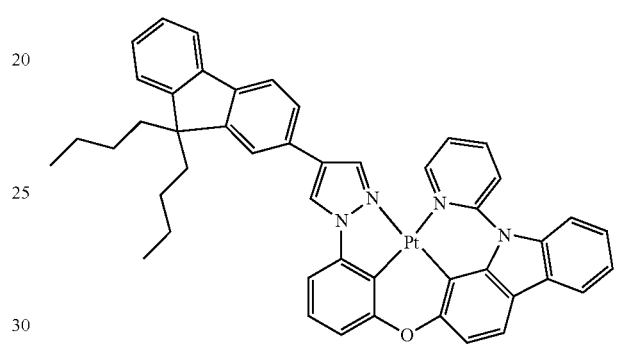
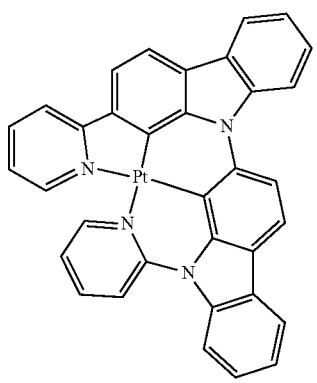
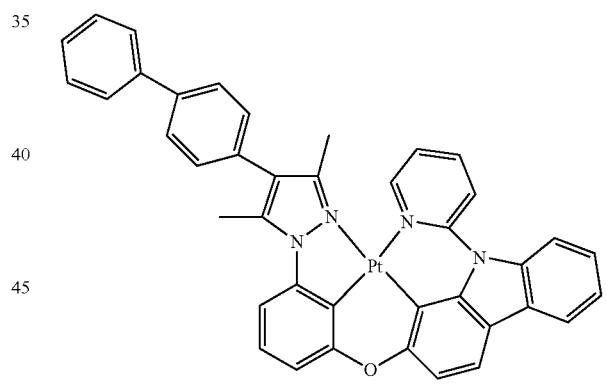
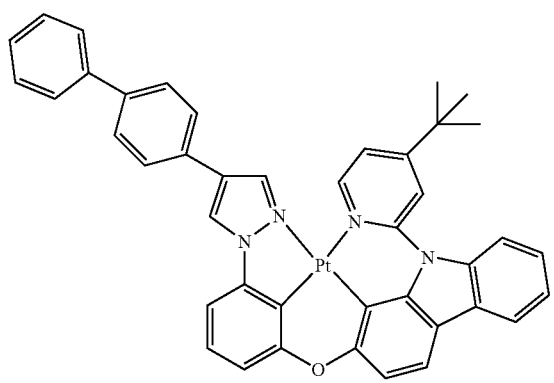
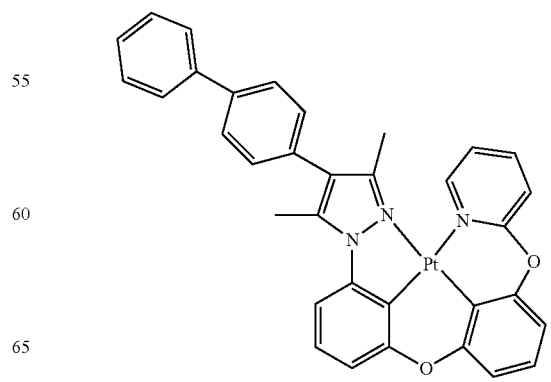

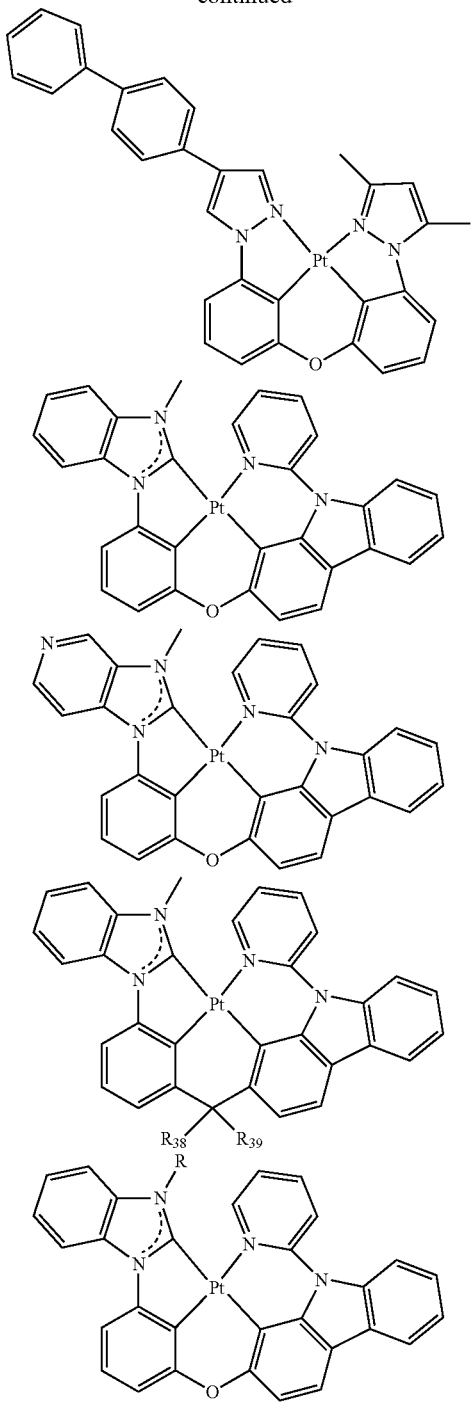

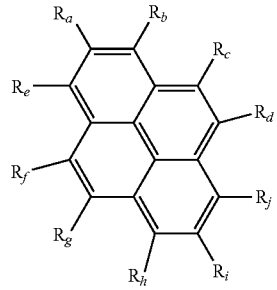

[Formula F-a]

In Formula F-a above, two selected from $R_a$ to $R_j$ may each independently be substituted with *—$NAr_1Ar_2$. The rest of $R_a$ to $R_j$ which are not substituted with *—$NAr_1Ar_2$ may each independently be a hydrogen atom, a deuterium atom, a halogen atom, a cyano group, a substituted or unsubstituted amine group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms. In *—$NAr_1Ar_2$, $Ar_1$ and $Ar_2$ may each independently be a substituted or unsubstituted aryl group having about 6 to about 30 ring-forming carbon atoms, or a substituted or unsubstituted heteroaryl group having about 2 to about 30 ring-forming carbon atoms. For example, at least one of $Ar_1$ and $Ar_2$ may be a heteroaryl group containing O or S as a ring-forming atom.

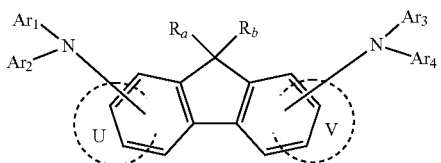

[Formula F-b]

In Formula F-b above, $R_a$ and $R_b$ may each independently be a hydrogen atom, a deuterium atom, a substituted or unsubstituted alkyl group having about 1 to about 20 carbon atoms, a substituted or unsubstituted alkenyl group having about 2 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group.

In Formula F-b, U and V may each independently be a substituted or unsubstituted hydrocarbon ring having about 5 to about 30 ring-forming carbon atoms, or a substituted or unsubstituted hetero ring having about 2 to about 30 ring-forming carbon atoms.

In Formula F-b, the number of rings represented by U and V may each independently be 0 or 1. For example, in Formula F-b, in case that the number of U or V is 1, a ring constitutes a condensed ring at a portion described as U or V, and in case that the number of U or V is 0, it means that a ring described as U or V is not present. Specifically, in case In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms.

The emission layer EML may include a compound represented by one of Formula F-a to Formula F-c below. The compound represented by Formula F-a to Formula F-c below may be used as a fluorescent dopant material.

that the number of U is 0 and the number of V is 1, or the number of U is 1 and the number of V is 0, a condensed ring having a fluorene core of Formula F-b may be a tetracyclic compound. In case that the number of U and the number of V are all 0, a condensed ring of Formula F-b may be a tricyclic compound. In case that the number of U and the number of V are all 1, the condensed ring having a fluorene core of Formula F-b may be a pentacyclic compound.

[Formula F-c]

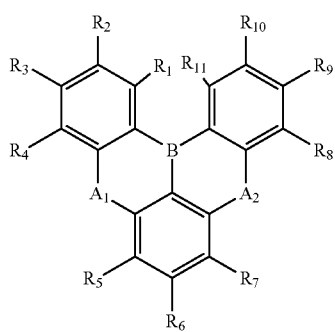

In Formula F-c, $A_1$ and $A_2$ may each independently be O, S, Se, or $NR_m$, $R_m$ may be a hydrogen atom, a deuterium atom, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group.

In Formula F-c, $A_1$ and $A_2$ may each independently be bonded to substituents of adjacent rings to form a condensed ring. For example, in case that $A_1$ and $A_2$ are each independently $NR_m$, $A_1$ may be bonded to $R_4$ or $R_5$ to form a ring. $A_2$ may be bonded to $R_7$ or $R_8$ to form a ring.

The emission layer EML may include a compound represented by Formula M-a or Formula M-b below. The compound represented by Formula M-a or Formula M-b below may be used as a phosphorescent dopant material.

[Formula M-a]

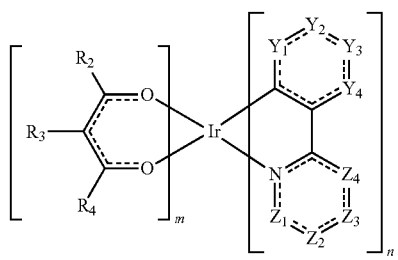

In Formula M-a, $Y_1$ to $Y_4$ and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having about 1 to about 20 carbon atoms, a substituted or unsubstituted alkenyl group having about 2 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group. In Formula M-a, m is 0 or 1, and n is 2 or 3. In Formula M-a, in case that m is 0, n is 3, and in case that m is 1, n is 2.

The compound represented by Formula M-a may be used as a red phosphorescent dopant or a green phosphorescent dopant.

The compound represented by Formula M-a may be represented by one of compounds M-a1 to M-a5 below. However, the compounds M-a1 to M-a5 below are only illustrative. The compound represented by Formula M-a is not limited to those represented by the compounds M-a1 to M-a5 below.

M-a1

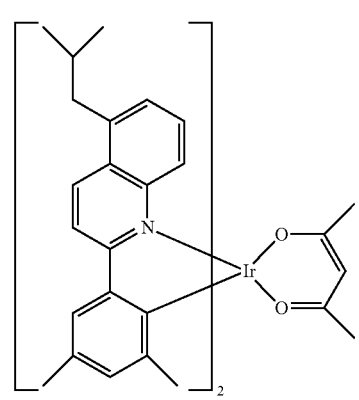

M-a2

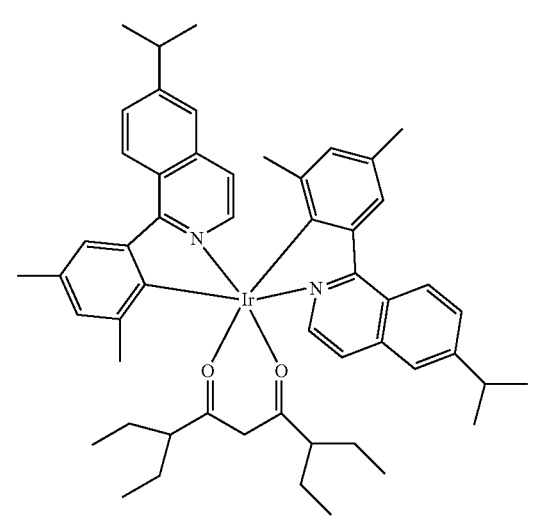

M-a3

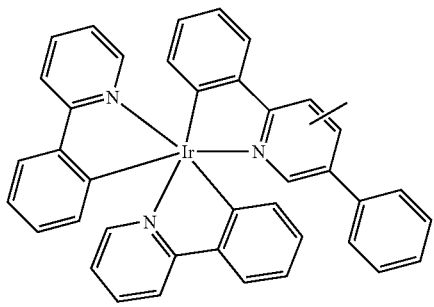

M-a4

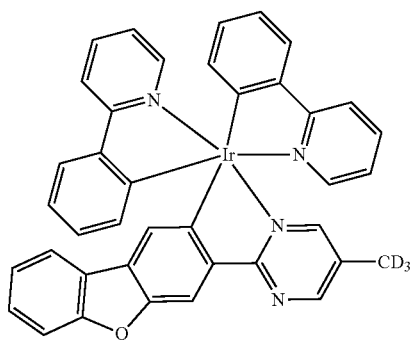

M-a5

A compound M-a1 and a compound M-a2 may be used as a red dopant material, and a compound M-a3 to a compound M-a5 may be used as a green dopant material.

[Formula M-b]

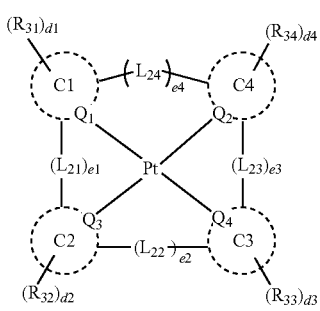

In Formula M-b, $Q_1$ to $Q_4$ are each independently C or N, and C1 to C4 are each independently a substituted or unsubstituted hydrocarbon ring having about 5 to about 30 ring-forming carbon atoms, or a substituted or unsubstituted hetero ring having about 2 to about 30 ring-forming carbon atoms. Characters $L_{21}$ to $L_{24}$ are each independently a direct linkage,

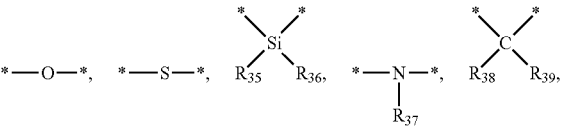

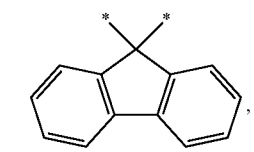

a substituted or unsubstituted alkyl group having about 1 to about 20 carbon atoms, a substituted or unsubstituted arylene group having about 6 to about 30 ring-forming carbon atoms, or a substituted or unsubstituted heteroarylene group having about 2 to about 30 ring-forming carbon atoms, and e1 to e4 are each independently 0 or 1. Characters $R_{31}$ to $R_{39}$ are each independently a hydrogen atom, a deuterium atom, a halogen atom, a cyano group, a substituted or unsubstituted amine group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group, and d1 to d4 are each independently an integer of 0 to 4.

The compound represented by Formula M-b may be used as a blue phosphorescent dopant or a green phosphorescent dopant.

The compound represented by Formula M-b may be represented by one of compounds below. However, the compounds below are only illustrative. The compound represented by Formula M-b is not limited to the compounds below.

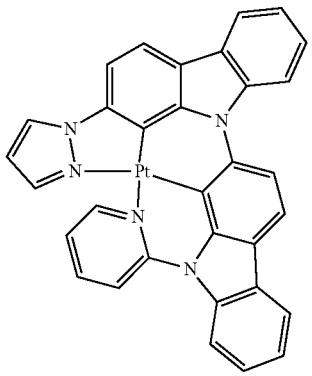

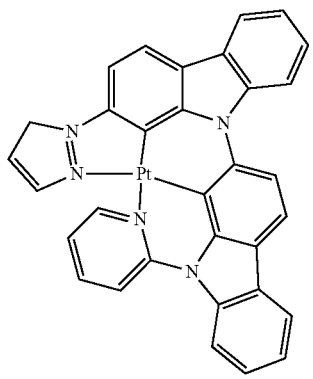
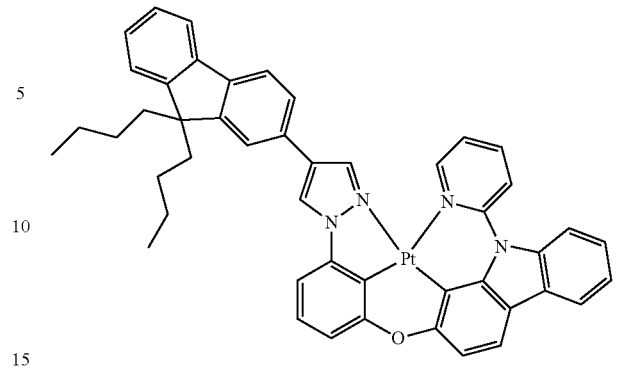
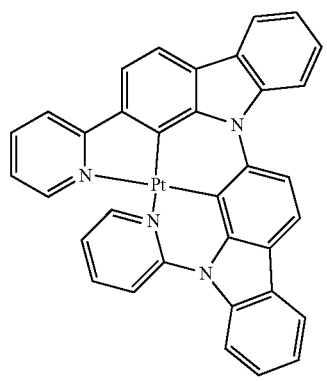
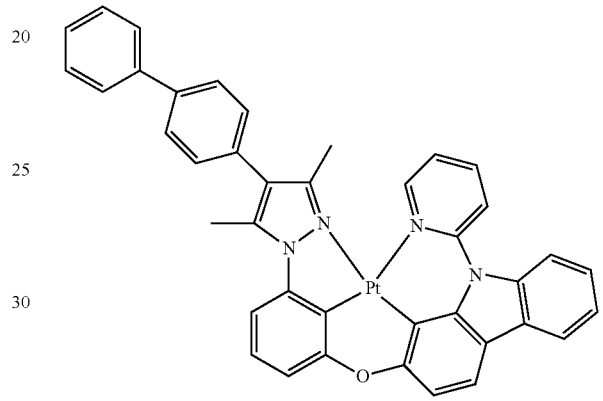
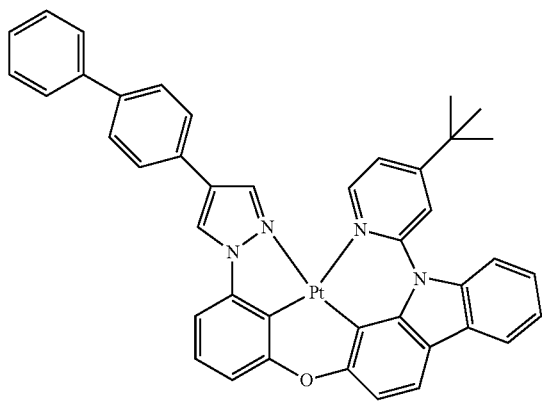
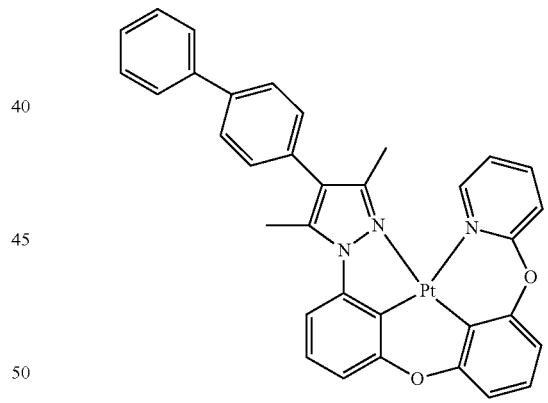
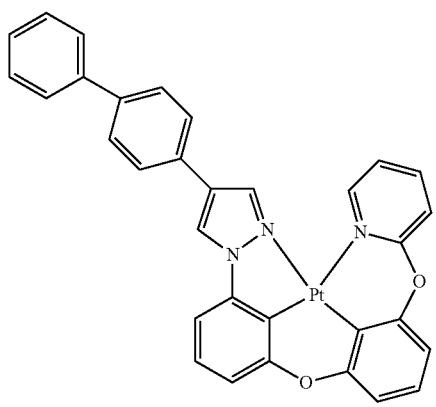
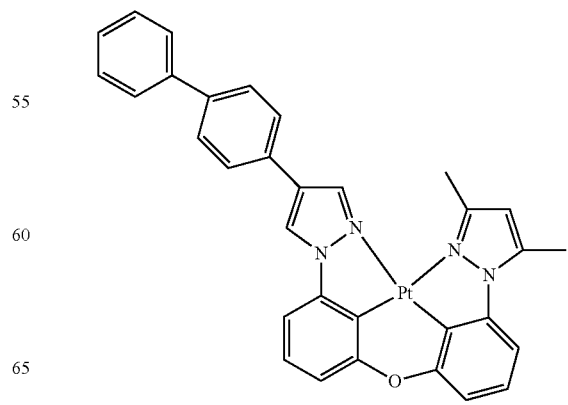

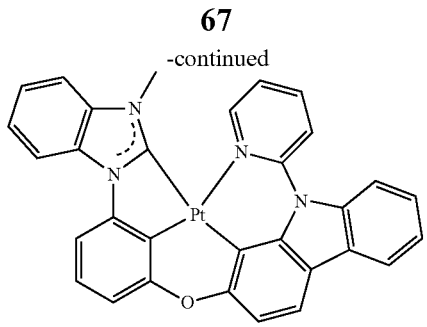

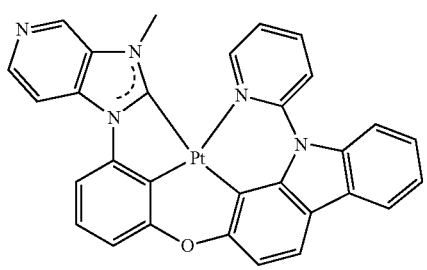

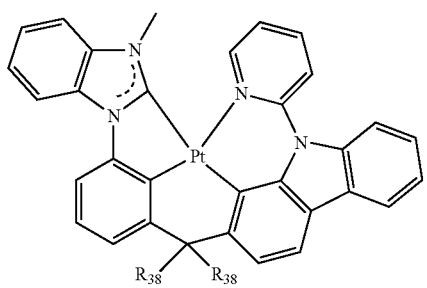

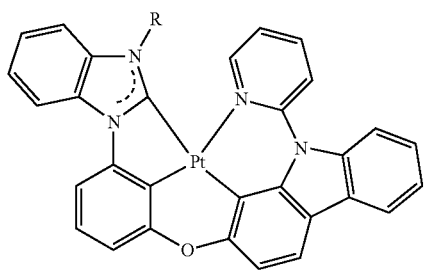

In the compounds above, R, R$_{38}$, and R$_{39}$ may each independently be a hydrogen atom, a deuterium atom, a halogen atom, a cyano group, a substituted or unsubstituted amine group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms.

The emission layer EML may include a compound represented by one of Formula F-a to Formula F-c below. The compound represented by Formula F-a to Formula F-c below may be used as a fluorescent dopant material.

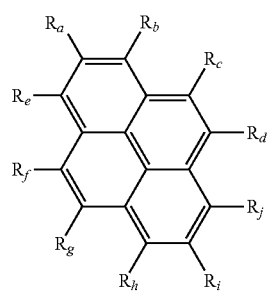

[Formula F-a]

In Formula F-a above, two selected from R$_a$ to R$_j$ may each independently be substituted with *—NAr$_1$Ar$_2$. The rest of R$_a$ to R$_j$ which are not substituted with *—NAr$_1$Ar$_2$ may each independently be a hydrogen atom, a deuterium atom, a halogen atom, a cyano group, a substituted or unsubstituted amine group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms. In *—NAr$_1$Ar$_2$, Ar$_1$ and Ar$_2$ may each independently be a substituted or unsubstituted aryl group having about 6 to about 30 ring-forming carbon atoms, or a substituted or unsubstituted heteroaryl group having about 2 to about 30 ring-forming carbon atoms. For example, at least one of Ar$_1$ and Ar$_2$ may be a heteroaryl group containing O or S as a ring-forming atom.

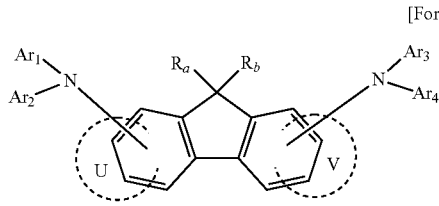

[Formula F-b]

In Formula F-b above, R$_a$ and R$_b$ may each independently be a hydrogen atom, a deuterium atom, a substituted or unsubstituted alkyl group having about 1 to about 20 carbon atoms, a substituted or unsubstituted alkenyl group having about 2 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group.

In Formula F-b, U and V may each independently be a substituted or unsubstituted hydrocarbon ring having about 5 to about 30 ring-forming carbon atoms, or a substituted or unsubstituted hetero ring having about 2 to about 30 ring-forming carbon atoms.

In Formula F-b, the number of rings represented by U and V may each independently be 0 or 1. For example, in Formula F-b, in case that the number of U or V is 1, a ring constitutes a condensed ring at a portion represented by U or V, and in case that the number of U or V is 0, it means that a ring represented by U or V is not present. Specifically, in case that the number of U is 0 and the number of V is 1, or the number of U is 1 and the number of V is 0, a condensed ring having a fluorene core of Formula F-b may be a tetracyclic compound. In case that the numbers of U and V are all 0, a condensed ring of Formula F-b may be a tricyclic compound. In case that the numbers of U and V are all 1, the condensed ring having a fluorene core of Formula F-b may be a pentacyclic compound.

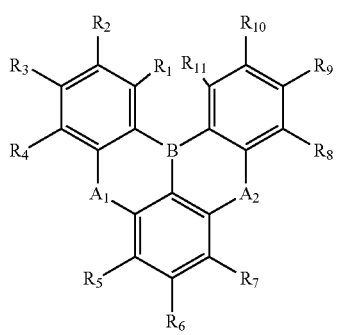

[Formula F-c]

In Formula F-c, $A_1$ and $A_2$ may each independently be O, S, Se, or $NR_m$, $R_m$ may be a hydrogen atom, a deuterium atom, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms, or may form a ring by being bonded to an adjacent group.

In Formula F-c, $A_1$ and $A_2$ may each independently be bonded to substituents of adjacent rings to form a condensed ring. For example, in case that $A_1$ and $A_2$ are each independently $NR_m$, $A_1$ may be bonded to $R_4$ or $R_5$ to form a ring. $A_2$ may be bonded to $R_7$ or $R_8$ to form a ring.

The emission layer EML may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), terbium (Tb), or thulium (Tm) may be used. Specifically, iridium(III) bis(4,6-difluorophenylpyridinato-N,C2 (FIrpic), bis(2,4-difluorophenylpyridinato)-tetrakis(1-pyrazolyl)borate iridium(III) (FIr6), or platinum octaethyl porphyrin (PtOEP) may be used as the phosphorescent dopant. However, the embodiment of the disclosure is not limited thereto.

In the organic electroluminescence device ED of an embodiment, the electron transport region ETR is provided on the emission layer EML. The electron transport region ETR may include at least one of a hole blocking layer, an electron transport layer ETL, and an electron injection layer EIL, but the embodiment of the disclosure is not limited thereto.

The electron transport region ETR may have a single-layered structure having a single layer formed of a single material, a single-layered structure having a single layer formed of different materials, or a multi-layered structure having layers formed of different materials.

For example, the electron transport region ETR may have a single-layered structure having a single layer of an electron injection layer EIL or an electron transport layer ETL, or a single-layered structure having a single layer formed of an electron injection material and an electron transport material. The electron transport region ETR may have a single-layered structure having a single layer formed of different materials, or have a structure of the electron transport layer ETL/the electron injection layer EIL, or a hole blocking layer HBL/the electron transport layer ETL/the electron injection layer EIL, sequentially stacked from the emission layer EML, but the embodiment of the disclosure is not limited thereto. The thickness of the electron transport region ETR may be, for example, about 1,000 Å to about 1,500 Å.

The electron transport region ETR may be formed by various methods such as vacuum deposition, spin coating, casting, Langmuir-Blodgett (LB), inkjet printing, laser printing, and laser induced thermal imaging (LITI).

The electron transport region ETR may include a compound represented by Formula ET-1 below.

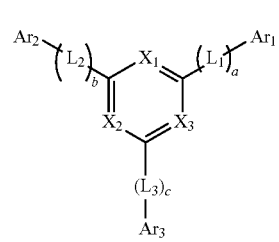

[Formula ET-1]

In Formula ET-1, at least one of $X_1$ to $X_3$ is N, and the rest thereof is $CR_a$. $R_a$ may be a hydrogen atom, a deuterium atom, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms. $Ar_1$ to $Ar_3$ may each independently be a hydrogen atom, a deuterium atom, a substituted or unsubstituted alkyl group having about 1 to about 20 carbon atoms, a substituted or unsubstituted aryl group having about 6 to about 30 ring-forming carbon atoms, or a substituted or unsubstituted heteroaryl group having about 2 to about 30 ring-forming carbon atoms.

In Formula ET-1, a to c may each independently be an integer of 0 to 10. In Formula ET-1, $L_1$ to $L_3$ may each independently be a direct linkage, a substituted or unsubstituted arylene group having about 6 to about 30 ring-forming carbon atoms, or a substituted or unsubstituted heteroarylene group having about 2 to about 30 ring-forming carbon atoms. In case that a to c are integers of 2 or greater, $L_1$ to $L_3$ may each independently be a substituted or unsubstituted arylene group having about 6 to about 30 ring-forming carbon atoms, or a substituted or unsubstituted heteroarylene group having about 2 to about 30 ring-forming carbon atoms.

The electron transport region ETR may include an anthracene-based compound. However, the embodiment of the disclosure is not limited thereto. The electron transport region ETR may be, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq$_2$), 9,10-di(naphthalene-2-yl)anthracene (ADN), 1,3-bis[3,5-di(pyridin-3-yl)phenyl]benzene (BmPyPhB), and a mixture thereof.

The electron transport region ETR may include a halogenated metal such as LiF, NaCl, CsF, RbCl, RbI, CuI, and KI, a lanthanum group metal such as Yb, or a co-deposition material formed of the above halogenated metal and the lanthanum group metal. For example, the electron transport region ETR may include KI:Yb, RbI:Yb, and the like as the co-deposition material. As the electron transport region ETR, a metal oxide such as Li$_2$O and BaO, or 8-hydroxyl-Lithium quinolate (Liq) and the like may be used, but the embodiment of the disclosure is not limited thereto. The electron transport region ETR may also be composed of a mixture of an electron transport material and an insulating organo metal salt. The organo metal salt may be a material having an energy band gap of about 4 eV or greater. Specifically, for example, the organo metal salt may include metal acetate, metal benzoate, metal acetoacetate, metal acetylacetonate, or metal stearate.

The electron transport region ETR may further include at least one of 2,9-dimethyl-4,7-diphenyl-1,10-phenanthroline (BCP) and 4,7-diphenyl-1,10-phenanthroline (Bphen), but the embodiment of the disclosure is not limited thereto.

The electron transport region ETR may include the above-described compounds of the electron transport region in at least one of the electron injection layer EIL, the electron transport layer ETL, and the hole blocking layer HBL.

In case that the electron transport region ETR includes the electron transport layer ETL, the thickness of the electron transport layer ETL may be about 100 Å to about 1,000 Å, for example, about 150 Å to about 500 Å. In case that the thickness of the electron transport layer ETL satisfies the above-described range, satisfactory electron transport properties may be obtained without a substantial increase in driving voltage. In case that the electron transport region ETR includes the electron injection layer EIL, the thickness of the electron injection layer EIL may be about 1 Å to about 100 Å, for example, about 3 Å to about 90 Å. In case that the thickness of the electron injection layer EIL satisfies the above-described range, satisfactory electron injection properties may be obtained without a substantial increase in driving voltage.

The second electrode EL2 is provided on the electron transport region ETR. The second electrode EL2 may be a common electrode. The second electrode EL2 may also be a cathode or an anode, but the embodiment of the disclosure is not limited thereto. For example, in case that the first electrode EL1 is an anode, the second electrode EL2 may be a cathode, and in case that the first electrode EL1 is a cathode, the second electrode EL2 may be an anode.

The second electrode EL2 may be a transmissive electrode, or a transflective electrode. In case that the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), or the like.

In case that the second electrode EL2 is a transflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or a mixture thereof (for example, AgMg, AgYb, or MgAg). As another example, the second electrode EL2 may have a multi-layered structure including a reflective film or a transflective film, both formed of the above-described materials, and a transparent conductive film formed of indium tin oxide (ITO), indium zinc oxide (IZO), zinc oxide (ZnO), indium tin zinc oxide (ITZO), or the like. For example, the second electrode EL2 may include one of the above-described metal materials, a combination of two or more selected from the above-described metal materials, an oxide of one of the above-described metal materials, or the like.

Although not illustrated in the drawings, the second electrode EL2 may be electrically connected to an auxiliary electrode. In case that the second electrode EL2 is electrically connected to the auxiliary electrode, the resistance of the second electrode EL2 may be reduced.

On the second electrode EL2 of the organic electroluminescence device ED of an embodiment, a capping layer CPL may be further disposed. The capping layer CPL may include a multi-layer or single layer.

In an embodiment, the capping layer CPL may be an organic layer or an inorganic layer. For example, in case that the capping layer CPL includes an inorganic substance, the inorganic substance may include an alkaline metal compound such as LiF, an alkaline earth metal compound such as MgF$_2$, SiON, SiN$_x$, SiO$_y$, or the like.

For example, in case that the capping layer CPL includes an organic substance, the organic substance may include α-NPD, NPB, TPD, m-MTDATA, Alq$_3$, CuPc, N4,N4,N4',N4'-tetra(biphenyl-4-yl)biphenyl-4,4'-diamine (TPD15), 4,4',4"-tris(carbazol sol-9-yl)triphenylamine (TCTA), and the like, or may include an epoxy resin, or an acrylate such as a methacrylate. However, the embodiment of the disclosure is not limited thereto. The capping layer CPL may include at least one of compounds P1 to P5.

P1

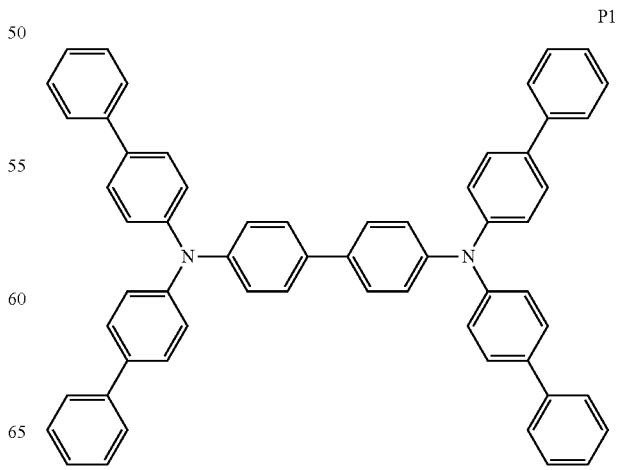

P2

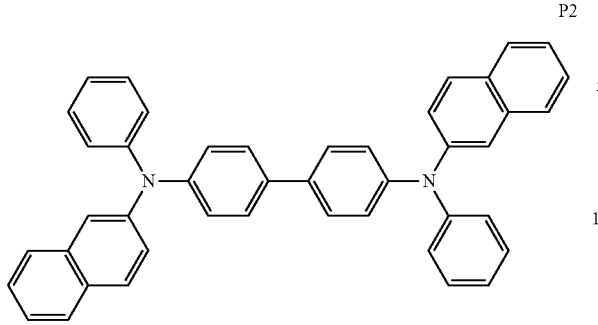

P3

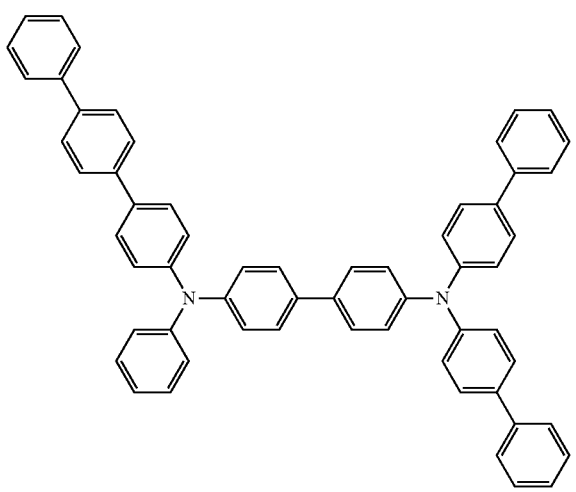

P4

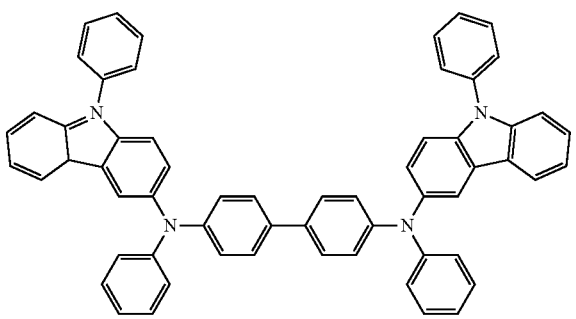

P5

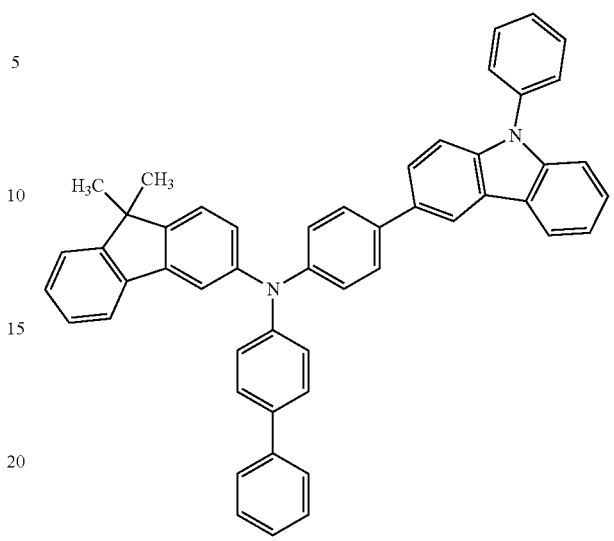

The refractive index of the capping layer CPL may be about 1.6 or greater. Specifically, for light in a wavelength region of about 550 nm to about 660 nm, the refractive index of the capping layer CPL may be about 1.6 or greater.

Figure 9:
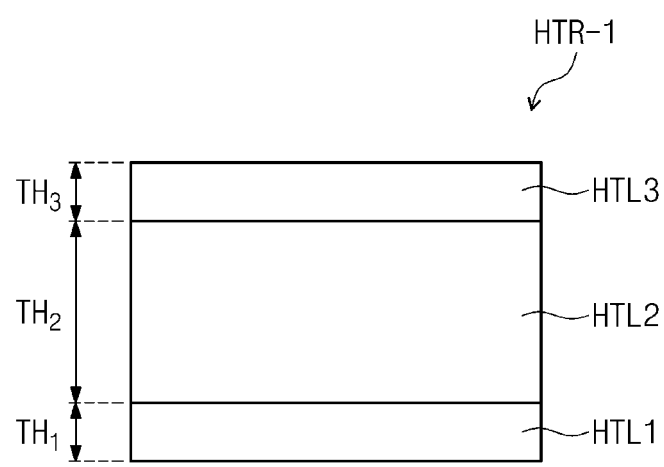
FIG. 9 is a cross-sectional view schematically illustrating a portion of an organic electroluminescence device according to an embodiment of the disclosure.

FIG. 9 is a schematic cross-sectional view illustrating a portion of an organic electroluminescence device according to an embodiment. FIG. 9 is a schematic cross-sectional view illustrating a portion corresponding to the hole transport layer HTL of FIG. 7. Hereinafter, referring to FIG. 9, a hole transport region included in an organic electroluminescence device according to an embodiment will be described in detail. The same contents as those described with reference to FIGS. 6 to 8 will not be described again. Hereinafter, differences will be mainly described.

There is a difference at least in that unlike the hole transport region HTR illustrated in FIG. 8, a hole transport region HTR-1 included in an organic electroluminescence device according to an embodiment illustrated in FIG. 9 further includes a third hole transport layer HTL3 disposed on an upper portion of the second hole transport layer HTL2.

Referring to FIG. 9, in an embodiment, the hole transport region HTR-1 may further include the third hole transport layer HTL3 disposed on an upper portion of the second hole transport layer HTL2. The third hole transport layer HTL3 may include the first organic compound included in the first hole transport layer HTL1. For example, the first hole transport layer HTL1 and the third hole transport layer HTL3 may have a same dielectric constant. The ratio of thicknesses $TH_1:TH_2:TH_3$ of the first hole transport layer HTL1, the second hole transport layer HTL2, and the third hole transport layer HTL3 may be about 1:2:1 to about 1:11:1. The thickness $TH_1$ of the first hole transport layer HTL1 may be about 10 nm to about 30 nm, the thickness $TH_2$ of the second hole transport layer HTL2 may be about 60 nm to about 110 nm, and a thickness $TH_3$ of the third hole transport layer HTL3 may be about 10 nm to about 30 nm. The ratio of the thicknesses $TH_1:TH_2:TH_3$ of the first to third hole transport layers HTL1, HTL2, and HTL3 may be adjusted to an optimal range according to the wavelength of light emitted from the emission layer EML, display quality required in the display device DD (see FIG. 3), and types of hole transport materials used in each of the hole transport layers HTL1, HTL2, and HTL3.

Figure 10:
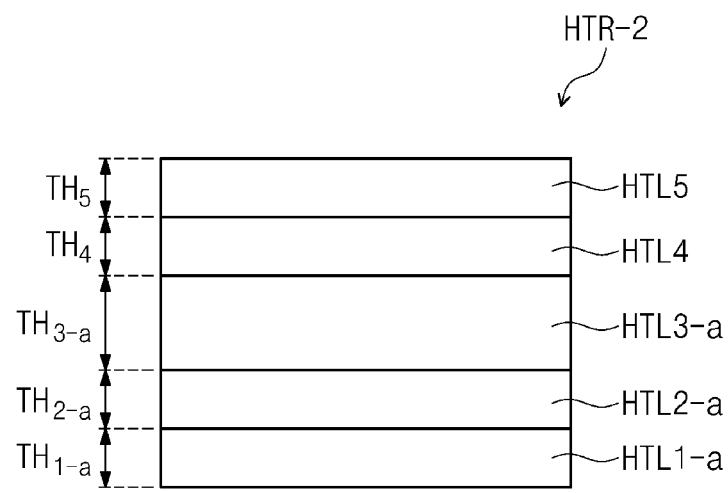
FIG. 10 is a cross-sectional view schematically illustrating a portion of an organic electroluminescence device according to an embodiment of the disclosure.

FIG. 10 is a schematic cross-sectional view illustrating a portion of an organic electroluminescence device according to an embodiment. FIG. 10 is a schematic cross-sectional view illustrating a portion corresponding to a hole transport region HTR of FIG. 7. Hereinafter, referring to FIG. 10, a hole transport region included in an organic electroluminescence device according to an embodiment will be described in detail. The same contents as those described with reference to FIGS. 6 to 8 will not be described again. Hereinafter, differences from the hole transport layers HTL and HTL-1 illustrated in FIG. 9 will be mainly described.

There is a difference at least in that unlike the hole transport regions HTR and HTR-1 illustrated in FIG. 8 and FIG. 9, a hole transport region HTR-2 according to an embodiment illustrated in FIG. 10 further includes a fourth hole transport layer HTL4 disposed on an upper portion of a third hole transport layer HTL3-*a* and a fifth hole transport layer HTL5 disposed on an upper portion of a fourth hole transport layer HTL4.

Referring to FIG. 10, in an embodiment, the hole transport region HTR-2 may further include the fourth hole transport layer HTL4 disposed between the third hole transport layer HTL3-*a* and the emission layer EML (see FIG. 6) and the fifth hole transport layer HTL5 disposed between the fourth hole transport layer HTL4 and the emission layer EML (see FIG. 6). The fourth hole transport layer HTL4 may include a second organic compound, and the fifth hole transport layer HTL5 may include a first organic compound. For example, the fourth hole transport layer HTL4 may include an organic compound identical to that included in a second hole transport layer HTL2-*a*, and the fifth hole transport layer HTL5 may include an organic compound identical to that included in a first hole transport layer HTL1-*a* and the third hole transport layer HTL3-*a*.

The ratio of thicknesses $TH_{1-a}:TH_{2-a}$ of the first hole transport layer HTL1-*a* and the second hole transport layer HTL2-*a* may be about 1:0.5 to about 1:3. The ratio of thicknesses $TH_1$-a:$TH_3$-a of the first hole transport layer HTL1-*a* and the third hole transport layer HTL3-*a* may be about 1:1 to about 1:5. The ratio of thicknesses $TH_{1-a}:TH_4$ of the first hole transport layer HTL1-*a* and the fourth hole transport layer HTL4 may be about 1:0.5 to about 1:3. The ratio of thicknesses $TH_{1-a}:TH_5$ of the first hole transport layer HTL1-*a* and the fifth hole transport layer HTL5 may be about 1:0.5 to about 1:2. The thicknesses $TH_{1-a}$ and $TH_5$ of the first hole transport layer HTL1-*a* and the fifth hole transport layer HTL5 may each be about 10 nm to about 20 nm. The thicknesses $TH_2$-a of the second hole transport layer HTL2-*a* and the thickness $TH_4$ of the fourth hole transport layer HTL4 may each be about 10 nm to about 30 nm. The thickness $TH_3$-a of the third hole transport layer HTL3-*a* may be about 20 nm to about 50 nm. The thickness of each of the first to fifth hole transport layers HTL1-*a*, HTL2-*a*, HTL3-*a*, HTL4, and HTL5 and the ratio of the thicknesses thereof may be adjusted to an optimal range according to the wavelength region of light emitted from the emission layer EML, display quality required in the display device DD (see FIG. 1), and types of hole transport materials used in each of the hole transport layers HTL1-*a*, HTL2-*a*, HTL3-*a*, HTL4, and HTL5 of the hole transport region HTR-2.

Figure 11:
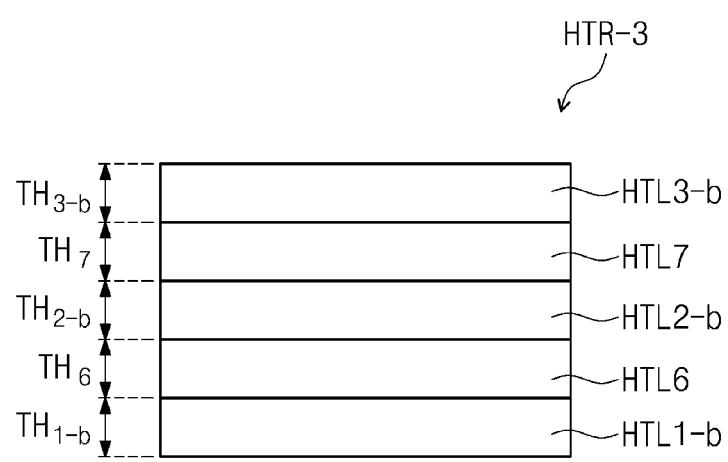
FIG. 11 is a cross-sectional view schematically illustrating a portion of an organic electroluminescence device according to an embodiment of the disclosure.

There is a difference at least in that unlike the hole transport layers HTL and HTL-1 illustrated in FIG. 8 and FIG. 9, a hole transport region HTR-3 according to an embodiment illustrated in FIG. 11 further includes a sixth hole transport layer HTL6 disposed between a first hole transport layer HTL1-*b* and a second hole transport layer HTL2-*b* and a seventh hole transport layer HTL7 disposed between the second hole transport layer HTL2-*b* and a third hole transport layer HTL3-*b*.

Referring to FIG. 11, the hole transport region HTR-3 included in an organic electroluminescence device according to an embodiment may further include the sixth hole transport layer HTL6 disposed between the first hole transport layer HTL1-*b* and the second hole transport layer HTL2-*b* and including a first organic compound and a second organic compound and the seventh hole transport layer HTL7 disposed between the second hole transport layer HTL2-*b* and the third hole transport layer HTL3-*b* and including a first organic compound and a second organic compound. For example, the sixth hole transport layer HTL6 and the seventh hole transport layer HTL7 may all include an organic compound identical to that included in the first hole transport layer HTL1-*b* and an organic compound identical to that included in the second hole transport layer HTL2-*b*. The volume ratio of the first organic compound to the second organic compound included in the sixth hole transport layer HTL6 and the seventh hole transport layer HTL7 may be about 2:8 to about 8:2. The volume ratio of the first organic compound to the second organic compound may be the volume ratio of the first organic compound to the second organic compound provided when deposited on the sixth hole transport layer HTL6 and the seventh hole transport layer HTL7. The dielectric constant of the sixth hole transport layer HTL6 and the dielectric constant of the seventh hole transport layer HTL7 may each be about 2.3 to about 3.3.

A thickness $TH_{1-b}$ of the first hole transport layer HTL1-*b* and a thickness $TH_{3-b}$ of the third hole transport layer HTL3-*b* may be about 10 nm to about 20 nm, a thickness $TH_{2-b}$ of the second hole transport layer HTL2-*b* may be about 20 nm to about 50 nm, and a thickness $TH_6$ of the sixth hole transport layer HTL6*b* and a thickness $TH_7$ of the seventh hole transport layer HTL7 may be about 10 nm to about 30 nm. The thickness of each of the first, second, third, sixth, and seventh hole transport layers HTL1-*b*, HTL2-*b*, HTL3-*b*, HTL6, and HTL7 and the ratio of the thicknesses thereof may be adjusted to an optimal range according to the wavelength region of light emitted from the emission layer EML, display quality required in the display device DD (see FIG. 3), and types of hole transport materials used in each of the hole transport layers HTL1-*b*, HTL2-*b*, HTL3-*b*, HTL6, and HTL7 of the hole transport region HTR-3.

Figure 12:
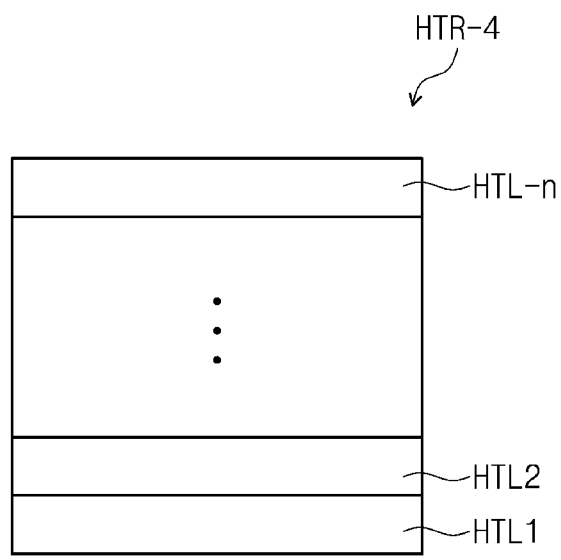
FIG. 12 is a cross-sectional view schematically illustrating a portion of an organic electroluminescence device according to an embodiment of the disclosure.

The organic electroluminescence device described with reference to FIGS. 6 to 11 includes two, three, or five hole transport layers in a hole transport region, but this is only illustrative. The embodiment of the disclosure is not limited thereto. For example, referring to FIG. 12, a hole transport region HTR-4 included in an organic electroluminescence device of an embodiment may include n hole transport layers HTL1, HTL2, . . . , and HTLn (where n is an integer of 5 or greater), and the hole transport layers HTL1, HTL2, . . . , and HTLn adjacent to each other may have different dielectric constants. The hole transport layers HTL1, HTL2, . . . , and HTLn not adjacent to each other may have a same dielectric constant. For example, in the first hole transport layer HTL1, the second hole transport layer HTL2, and the third hole transport layer (not shown) sequentially stacked, the second hole transport layer HTL2 may have a different dielectric constant from the first hole transport layer HTL1 and the third hole transport layer (not shown). The first hole transport layer HTL1 and the third hole transport layer (not shown) may have a same dielectric constant. In the specification, "being adjacent" refers to a layer closest to another layer in a cross-sectional view.

Hereinafter, referring to Examples and Comparative Examples, an organic compound according to an embodiment and a light emitting element including the organic compound according to an embodiment will be described in detail. The following Examples are for illustrative purposes only to facilitate the understanding of the disclosure, and thus, the scope of the disclosure is not limited thereto.

EXAMPLES

Manufacturing and evaluation of Organic Electroluminescence Device

1. Manufacture of First Organic Electroluminescence Device—Example 1

A substrate in which ITO/Ag/ITO are deposited to a thickness of about 70 Å/about 1,500 Å/about 70 Å on a glass substrate was washed with ultra-pure water and cleaned with ultrasonic waves and then irradiated with UV for about 30 minutes, followed by being subjected to an ozone treatment to form a first electrode. On the first electrode, a compound HT1 of an embodiment was deposited to a thickness of about 100 Å to form a first hole transport layer, and a compound $X_1$ was deposited to a thickness of about 1,200 Å to form a second hole transport layer, and thus a hole transport region was formed. The mCBP was deposited on the hole transport region to form an electron blocking layer having a thickness of about 50 Å. On the electron blocking layer, TCTA was deposited to a thickness of 470 Å to form a first auxiliary resonance layer, and on the first auxiliary resonance layer, p-TPATHZ as a host and Ir(piq))2(acac) as a red dopant were deposited to a thickness of about 150 Å in a volume ratio of 100:4 to form a red emission layer. On an upper portion of the red emission layer, TPBi was deposited to a thickness of about 50 Å to form a buffer layer, and on an upper portion of the buffer layer, PBD and Liq were co-deposited in a ratio of about 1:1 to form an electron transport layer having a thickness of about 280 Å. On an upper portion of the electron transport layer, AgMg was deposited to form a second electrode having a thickness of about 130 Å, and on an upper portion of the second electrode, alpha-NPD was deposited to a thickness of about 800 Å to form a capping layer, and a first organic electroluminescence device is manufactured.

2. Manufacturing of Second Organic Electroluminescence Device—Example 2

A substrate in which ITO/Ag/ITO are deposited to a thickness of about 70 Å/about 1,500 Å/about 70 Å on a glass substrate was washed with ultra-pure water and cleaned with ultrasonic waves and then irradiated with UV for about 30 minutes, followed by being subjected to an ozone treatment to form a first electrode. On the first electrode, a compound HT1 of an embodiment was deposited to a thickness of about 100 Å to form a first hole transport layer, and on the first hole transport layer, a compound $X_1$ was deposited to a thickness of about 1,200 Å to form a second hole transport layer, and a hole transport region is formed. The mCBP was deposited on the hole transport region to form an electron blocking layer having a thickness of about 50 Å. On the electron blocking layer, N-(9,9-dimethyl-9H-fluoren-3-yl)-1-methyl-N-(naphthalen-2-yl)-6,9,9-triphenyl-9H-fluoren-2-amine was deposited to a thickness of about 300 Å to form a second auxiliary resonance layer, and on the second auxiliary resonance layer, m-CF-PhCz as a host and Ir(piq)3 as a green dopant were deposited to a thickness of about 150 Å in a volume ratio of about 100:8 to form a green emission layer. On an upper portion of the green emission layer, TPBi was deposited to a thickness of about 50 Å to form a buffer layer, and on an upper portion of the buffer layer, PBD and Liq were co-deposited in a ratio of about 1:1 to form an electron transport layer having a thickness of about 280 Å. On an upper portion of the electron transport layer, AgMg was deposited to form a second electrode having a thickness of about 130 Å, and on an upper portion of the second electrode, alpha-NPD was deposited to a thickness of about 800 Å to form a capping layer, and a second organic electroluminescence device is manufactured.

3. Manufacturing of Third Organic Electroluminescence Device—Example 3

A substrate in which ITO/Ag/ITO are deposited to a thickness of about 70 Å/about 1,500 Å/about 70 Å on a glass substrate was washed with ultra-pure water and cleaned with ultrasonic waves and then irradiated with UV for about 30 minutes, followed by being subjected to an ozone treatment to form a first electrode. Thereafter, on the first electrode, a compound HT1 of an embodiment was deposited to a thickness of about 100 Å to form a first hole transport layer, on the first hole transport layer, and a compound $X_1$ was deposited to a thickness of about 1,200 Å to form a second hole transport layer, and a hole transport region is formed. The mCBP was deposited on the hole transport region to form an electron blocking layer having a thickness of about 50 Å. On the electron blocking layer, N,N-bis(4-(dibenzo[b,d]furan-4-yl)phenyl)-[1,1':4',1''-terphenyl]-4-amine was deposited to a thickness of about 50 Å to form a third auxiliary resonance layer, and on the third auxiliary resonance layer, mCBP as a host and 3-DPADBC as a blue dopant were deposited to a thickness of about 120 Å in a volume ratio of about 100:3 to form a blue emission layer. On an upper portion of the blue emission layer, TPBi was deposited to a thickness of about 50 Å to form a buffer layer, and on an upper portion of the buffer layer, PBD and Liq were co-deposited in a ratio of about 1:1 to form an electron transport layer having a thickness of about 280 Å. On an upper portion of the electron transport layer, AgMg was deposited to form a second electrode having a thickness of about 130 Å, and on an upper portion of the second electrode, alpha-NPD was deposited to a thickness of about 800 Å to form a capping layer, and thus a third organic electroluminescence device is manufactured.

4. Manufacturing of Fourth Organic Electroluminescence Device—Comparative Example 1

Comparative Example 1 was manufactured in the same manner as in Example 1 except that a second hole transport layer was directly formed on a first electrode without a first hole transport layer.

5. Manufacturing of Fifth Organic Electroluminescence Device—Comparative Example 2

Comparative Example 2 was manufactured in the same manner as in Example 2 except that a second hole transport layer was directly formed on a first electrode without a first hole transport layer.

6. Manufacturing of Sixth Organic Electroluminescence Device—Comparative Example 3

Comparative Example 3 was manufactured in the same manner as in Example 3 except that a second hole transport layer was directly formed on a first electrode without a first hole transport layer.

In Examples 1 to 3, a hole transport region, an electron blocking layer, an emission layer, a hole blocking layer, an electron transport region, and a second electrode were formed using a vacuum deposition device.

TABLE 1

| | First hole transport layer material | Second hole transport layer material | Light emitting color |
|---|---|---|---|
| Example 1 | HT1 | X1 | Red |
| Example 2 | HT1 | X1 | Green |
| Example 3 | HT1 | X1 | Blue |
| Comparative Example 1 | — | X1 | Red |
| Comparative Example 2 | — | X1 | Green |
| Comparative Example 3 | — | X1 | Blue |

The compound used as the material of the second hole transport layer and the compound used in the manufacturing of the organic electroluminescence device in each of Examples 1 to 3 and Comparative Examples 1 to 3 are listed below.

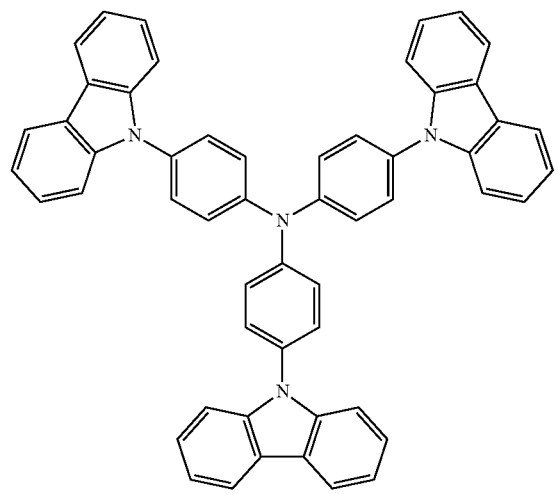

TCTA

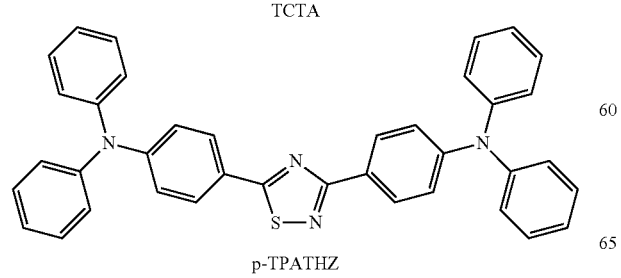

p-TPATHZ

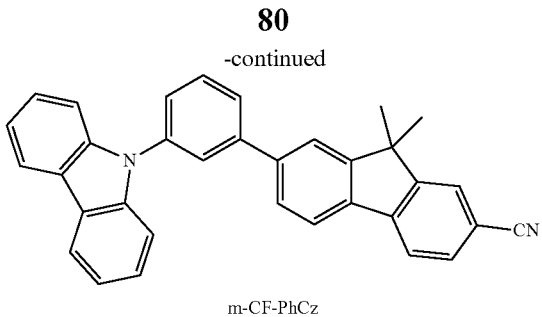

m-CF-PhCz

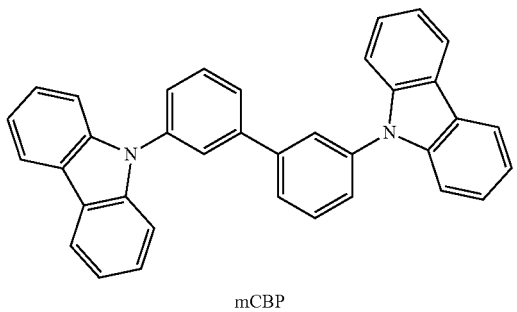

mCBP

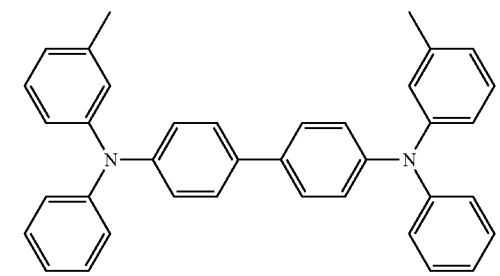

TPD

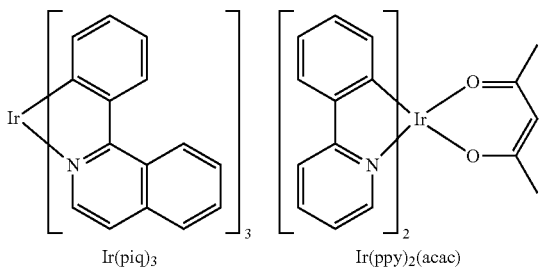

Ir(piq)$_3$    Ir(ppy)$_2$(acac)

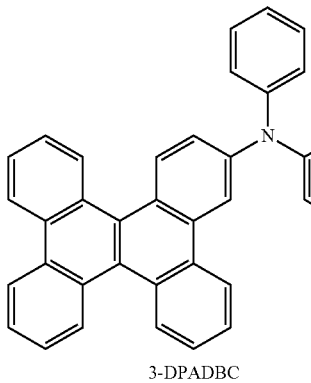

3-DPADBC

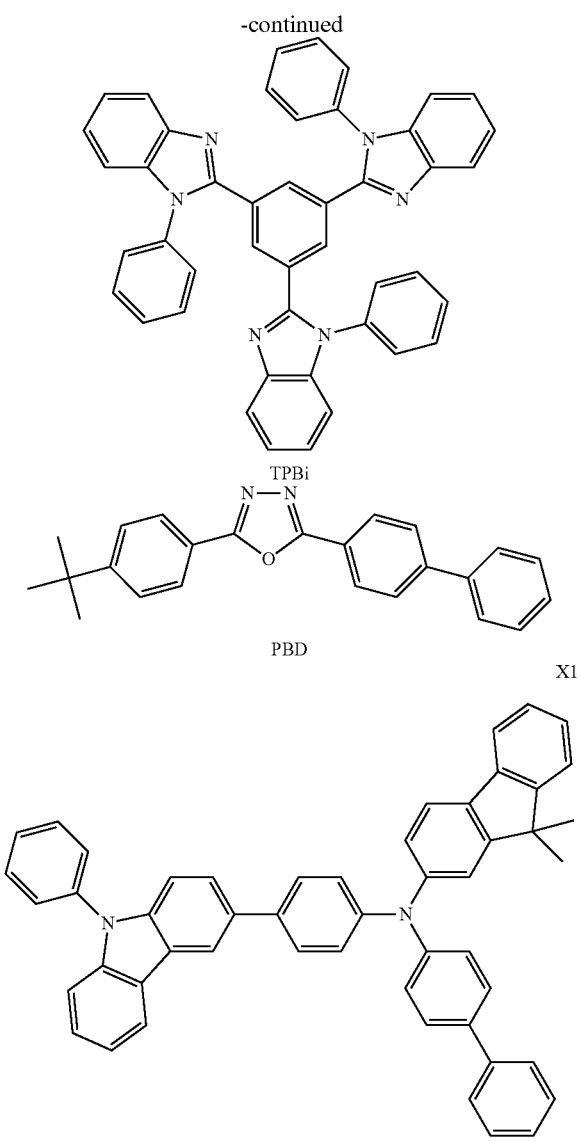

TPBi

PBD

X1

(Properties Evaluation of Organic Electroluminescence Device)

A top-emission type organic electroluminescence device was manufactured and then applied with an electric field to measure a current and luminance according to voltage intensity. In consideration of the size of a light emitting region in the device, the current efficiency at a current value exhibiting a brightness of about 1,000 cd/m² was measured, through which the efficiency of the organic electroluminescence devices of Examples 1 to 3 and Comparative Examples 1 to 3 were compared. In a same device, the electrical capacity at a voltage (or threshold voltage) at which light starts to emit and at a voltage exhibiting a brightness of about 1,000 cd/m² were measured through an impedance spectroscopy and compared.

Figure 13A:
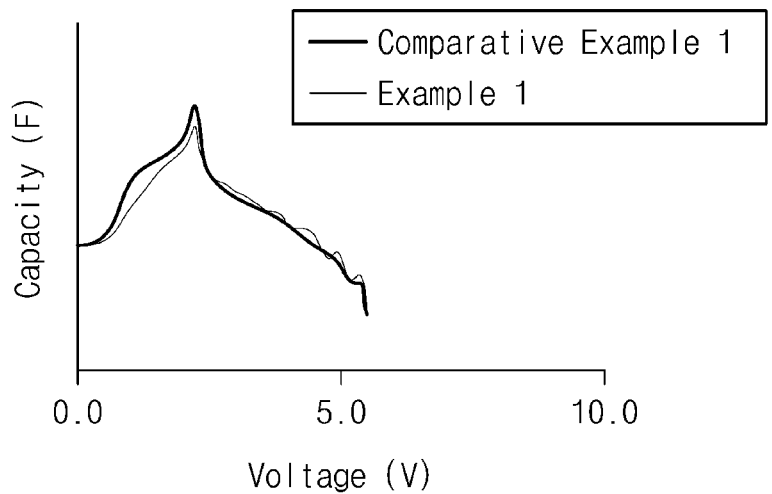
FIG. 13A to FIG. 13C are graphs schematically illustrating the capacity according to the voltage of an organic electroluminescence device included in each of Comparative Examples and Examples based on the type of the device.
Figure 13B:
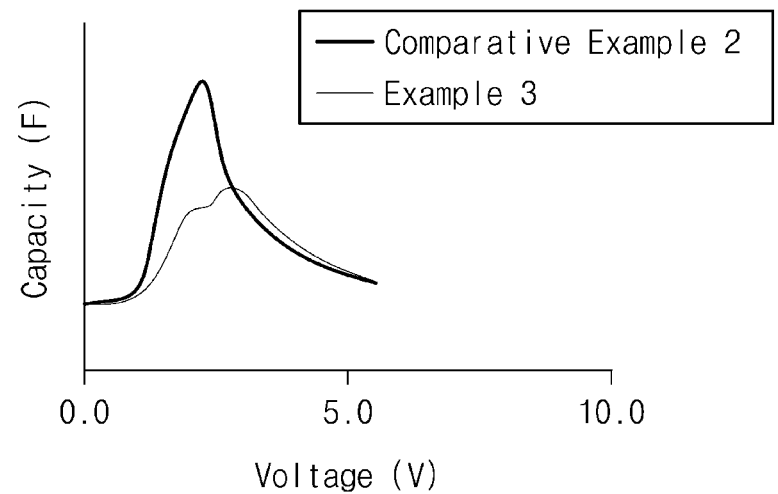
Figure 13C:
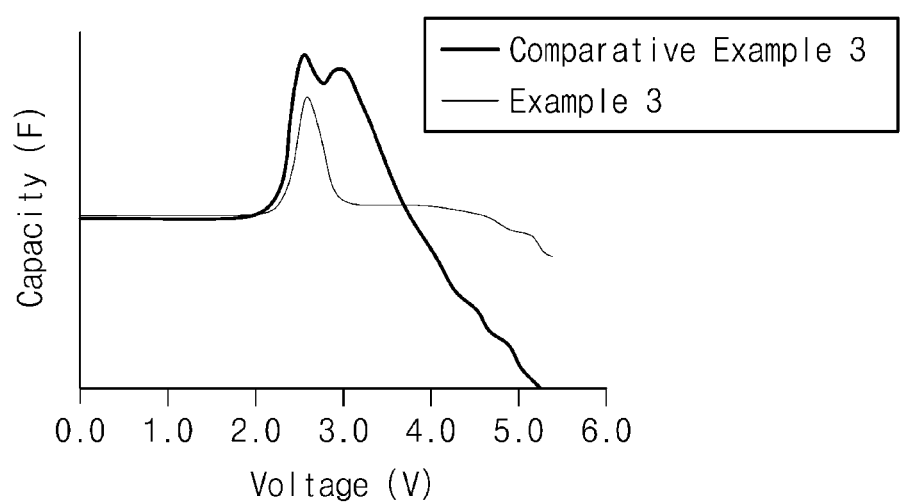

FIG. 13A is a graph showing a capacity according to a voltage for each of Example 1 and Comparative Example 1. FIG. 13B is a graph showing a capacity according to a voltage for each of Example 2 and Comparative Example 2. FIG. 13C is a graph showing a capacity according to a voltage for each of Example 3 and Comparative Example 3. The capacity illustrated in each of FIGS. 13A to 13C is the capacity of the capacitor ED-CP (see FIG. 2) connected to the organic electroluminescence device ED illustrated in FIG. 2.

As described above, Comparative Examples 1 to 3 correspond to a case in which a hole transport region only includes a second hole transport layer having a high dielectric constant of about 3.4 to about 4.5, and does not include a first hole transport layer having a low dielectric constant of about 2.0 to about 2.8. As described above, Examples 1 to 3 correspond to a case in which a hole transport region includes both a second hole transport layer having a high dielectric constant of about 3.4 to about 4.5 and a first hole transport layer having a low dielectric constant of about 2.0 to about 2.8.

FIGS. 13A to 13C illustrate that the horizontal axis represents a voltage value applied to an organic electroluminescence device, and the vertical axis represents the capacity of the organic electroluminescence device. In each graph, when respectively compared to Comparative Examples 1 to 3, Examples 1 to 3 were confirmed to exhibit a low capacity at the same voltage. For example, each of Examples 1 to 3 has a lower capacity than corresponding Comparative Examples 1 to 3, and as a result, it takes shorter time to charge the capacitor ED-CP (see FIG. 2), so that the organic electroluminescence device ED (see FIG. 2) may provide a driving rate of about 240 Hz or greater.

The organic electroluminescence device of an embodiment includes a hole transport layer having a low dielectric constant and a hole transport layer having a high dielectric constant, and thus, exhibits a low capacity. Accordingly, the organic electroluminescence device may be driven at a high speed. The display device of an embodiment includes an organic electroluminescence device having a hole transport region in which hole transport layers having different dielectric constants are stacked, and thus, may display a high-resolution image at a high speed.

An organic electroluminescence device of an embodiment includes hole transport layers, so that the organic electroluminescence device may be driven at a high speed.

A display device of an embodiment includes an organic electroluminescence device including hole transport layers having different dielectric constants, and thus, may display a high-resolution image at a high speed.

Although the disclosure has been described with reference to embodiments of the disclosure, it will be understood by those skilled in the art that various changes in form and details may be made therein without departing from the spirit and scope of the disclosure as set forth in the following claims. Accordingly, the technical scope of the disclosure is not intended to be limited to the contents set forth in the detailed description of the specification.

What is claimed is:

1. An organic electroluminescence device comprising:
a first electrode;
a hole transport region disposed on the first electrode;
an emission layer disposed on the hole transport region;
an electron transport region disposed on the emission layer; and
a second electrode disposed on the electron transport region,
wherein the hole transport region includes:
a first hole transport layer disposed adjacent to the first electrode, the first hole transport layer including a first organic compound having a first dielectric constant; and
a second hole transport layer disposed between the first hole transport layer and the emission layer, the second hole transport layer including a second organic compound having a second dielectric constant which is greater than the first dielectric constant, wherein
a ratio of a thickness of the first hole transport layer to a thickness of the second hole transport layer is in a range of about 1:1 to about 1:12.

2. The organic electroluminescence device of claim 1, wherein a ratio of the first dielectric constant to the second dielectric constant is in a range of about 1:1.20 to about 1:2.25.

3. The organic electroluminescence device of claim 1, wherein a difference between the first dielectric constant and the second dielectric constant is in a range of about 0.6 to about 2.5.

4. The organic electroluminescence device of claim 1, wherein
the first dielectric constant is in a range of about 2.0 to about 2.8, and
the second dielectric constant is in a range of about 3.4 to about 4.5.

5. The organic electroluminescence device of claim 1, wherein
a thickness of the first hole transport layer is in a range of about 10 nm to about 60 nm, and
a thickness of the second hole transport layer is in a range of about 60 nm to about 120 nm.

6. The organic electroluminescence device of claim 1, wherein the hole transport region further comprises a third hole transport layer disposed between the second hole transport layer and the emission layer, the third hole transport layer including the first organic compound.

7. The organic electroluminescence device of claim 6, wherein a ratio of a thickness of the first hole transport layer to a thickness of the second hole transport layer to a thickness of the third hole transport layer is in a range of about 1:2:1 to about 1:11:1.

8. The organic electroluminescence device of claim 6, wherein
a thickness of the first hole transport layer is in a range of about 10 nm to about 30 nm,
a thickness of the second hole transport layer is in a range of about 60 nm to about 110 nm, and
a thickness of the third hole transport layer is in a range of about 10 nm to about 30 nm.

9. The organic electroluminescence device of claim 6, wherein the hole transport region further comprises:
a fourth hole transport layer disposed between the third hole transport layer and the emission layer, the fourth hole transport layer including the second organic compound; and
a fifth hole transport layer disposed between the fourth hole transport layer and the emission layer, the fifth hole transport layer including the first organic compound.

10. The organic electroluminescence device of claim 9, wherein
a ratio of a thickness of the first hole transport layer to a thickness of the second hole transport layer is in a range of about 1:0.5 to about 1:3,
a ratio of a thickness of the first hole transport layer to a thickness of the third hole transport layer is in a range of about 1:1 to about 1:5,
a ratio of a thickness of the first hole transport layer to a thickness of the fourth hole transport layer is in a range of about 1:0.5 to about 1:3, and
a ratio of a thickness of the first hole transport layer to a thickness of the fifth hole transport layer is in a range of about 1:0.5 to about 1:2.

11. The organic electroluminescence device of claim 9, wherein
a thickness of the first hole transport layer and a thickness of the fifth hole transport layer are each in a range of about 10 nm to about 20 nm,
a thickness of the second hole transport layer and a thickness of the fourth hole transport layer are each in a range of about 10 nm to about 30 nm, and
a thickness of the third hole transport layer is in a range of about 20 nm to about 50 nm.

12. The organic electroluminescence device of claim 6, further comprising:
a sixth hole transport layer disposed between the first hole transport layer and the second hole transport layer, the sixth hole transport layer including the first organic compound and the second organic compound; and
a seventh hole transport layer disposed between the second hole transport layer and the third hole transport layer, the seventh hole transport layer including the first organic compound and the second organic compound.

13. The organic electroluminescence device of claim 12, wherein a volume ratio of the first organic compound to the second organic compound included in the sixth hole transport layer and the seventh hole transport layer is in a range of about 2:8 to about 8:2.

14. The organic electroluminescence device of claim 12, wherein a dielectric constant of the sixth hole transport layer and a dielectric constant of the seventh hole transport layer are each in a range of about 2.3 to about 3.3.

15. The organic electroluminescence device of claim 12, wherein
a thickness of the first hole transport layer and a thickness of the third transport layer are each in a range of about 10 nm to about 20 nm,
a thickness of the second hole transport layer is in a range of about 20 nm to about 50 nm, and
a thickness of the sixth hole transport layer and a thickness of the seventh hole transport layer are each in a range of about 10 nm to about 30 nm.

16. The organic electroluminescence device of claim 1, wherein
the first electrode is a reflective electrode, and
the second electrode is either a transflective or transmissive electrode.

17. The organic electroluminescence device of claim 1, wherein the first organic compound is represented by Formula 1:

[Formula 1]

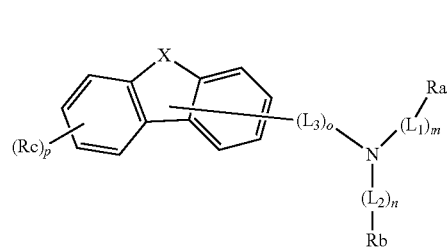

wherein, in Formula 1,
X is N, NR$_1$, or CR$_2$R$_3$,
m to o are each independently 0 or 1,
p is an integer of 0 to 4, $L_1$ to $L_3$ are each independently a substituted or unsubstituted arylene group having 6 to 30 ring-forming carbon atoms, $R_1$ to $R_3$ are each independently a substituted or unsubstituted alkyl group having 1 to 10 carbon atoms or a substituted or unsubstituted aryl group having 6 to 30 ring-forming carbon atoms, and Ra to Rc are each independently a hydrogen atom, a deuterium atom, a halogen atom, a substituted or unsubstituted aryl group having 6 to 30 ring-forming carbon atoms, or a substituted or unsubstituted amine group, wherein in case that X is N or $NR_1$, at least one of Ra and Rb is a substituted or unsubstituted cyclohexyl group, a substituted or unsubstituted triphenylsilyl group, a fluorenyl group containing a substituted or unsubstituted alkyl group having 2 to 16 carbon atoms as a substituent, or an aryl group having 6 to 30 ring-forming carbon atoms containing a substituted or unsubstituted cyclohexyl group as a substituent, and wherein in case that X is $CR_2R_3$, $R_2$ and $R_3$ are each independently a substituted or unsubstituted alkyl group having 6 to 10 carbon atoms, or at least one of Ra and Rb is a substituted or unsubstituted cyclohexyl group, a substituted or unsubstituted triphenylsilyl group, a fluorenyl group containing a substituted or unsubstituted alkyl group having 2 to 16 carbon atoms as a substituent, or an aryl group having 6 to 30 ring-forming carbon atoms containing a substituted or unsubstituted cyclohexyl group as a substituent.

18. The organic electroluminescence device of claim 17, wherein Formula 1 is represented by one of Formula 2 to Formula 4:

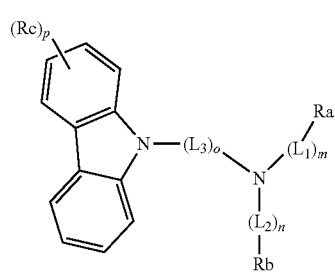

[Formula 2]

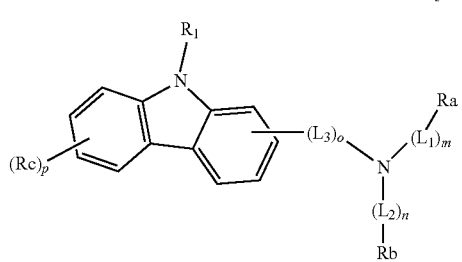

[Formula 3]

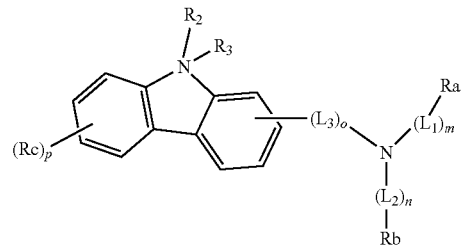

[Formula 4]

wherein m to p, Ra to Rc, $L_1$ to $L_3$ in Formula 2 to Formula 4, $R_1$ in Formula 3, and $R_2$ and $R_3$ in Formula 4 are the same as defined in Formula 1.

19. The organic electroluminescence device of claim 18, wherein Formula 4 is represented by Formula 4-1:

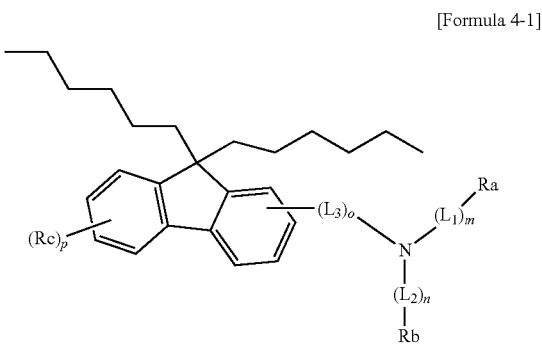

[Formula 4-1]

wherein Ra to Rc, $L_1$ to $L_3$, and m to p in Formula 4-1 are the same as defined in Formula 1.

20. The organic electroluminescence device of claim 17, wherein Formula 1 is represented by Formula 5:

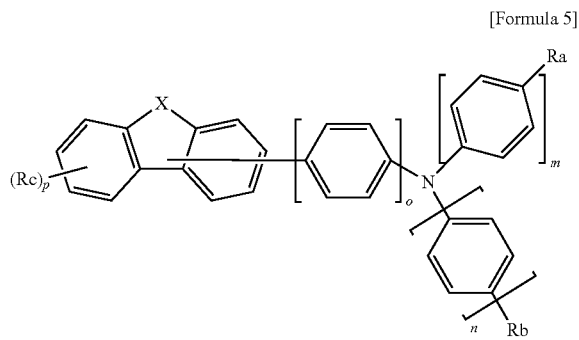

[Formula 5]

wherein m to p, Ra to Rc, and X in Formula 5 are the same as defined in Formula 1.

21. The organic electroluminescence device of claim 17, wherein in Formula 1, Ra and Rb are each independently represented by one of Formula 6 to Formula 13 below:

[Formula 6]
[Formula 7]
[Formula 8]
[Formula 9]
[Formula 10]
[Formula 11]
[Formula 12]
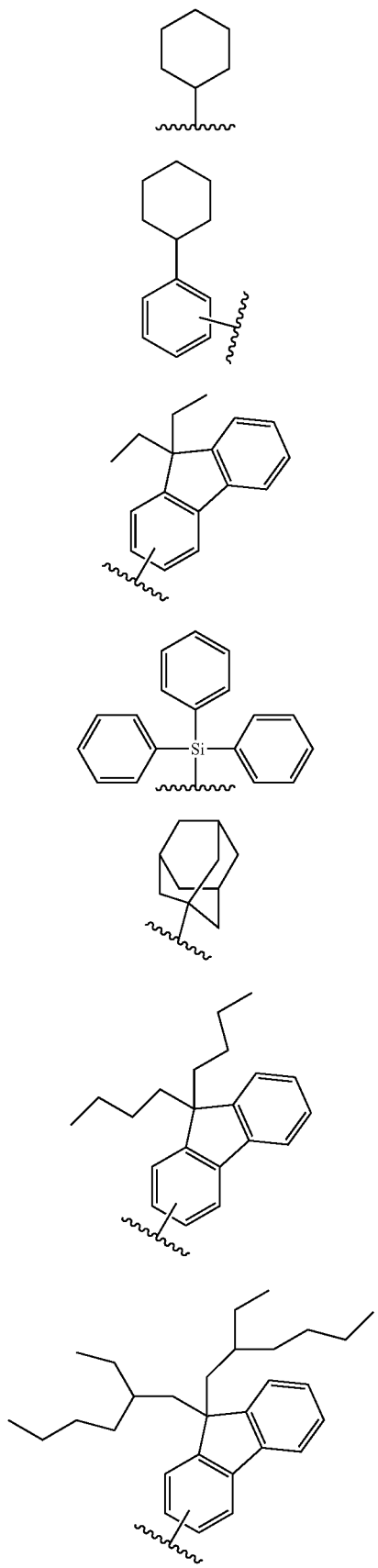
[Formula 13]
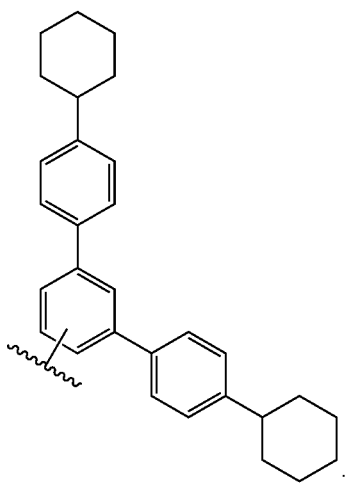
22. The organic electroluminescence device of claim 17, wherein the first organic compound is represented by one of compounds of Compound group 1:
[Compound Group 1]
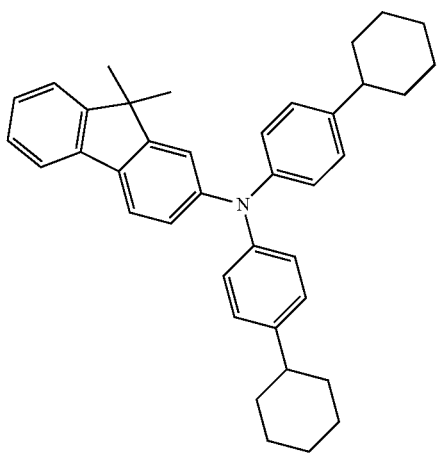
1
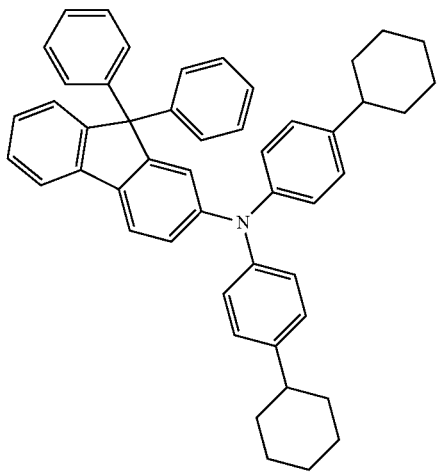
2

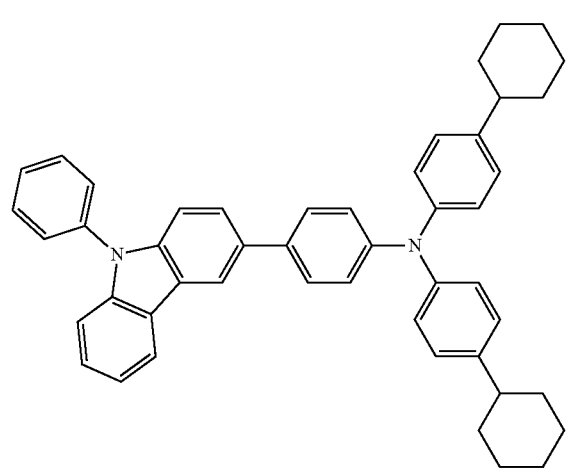
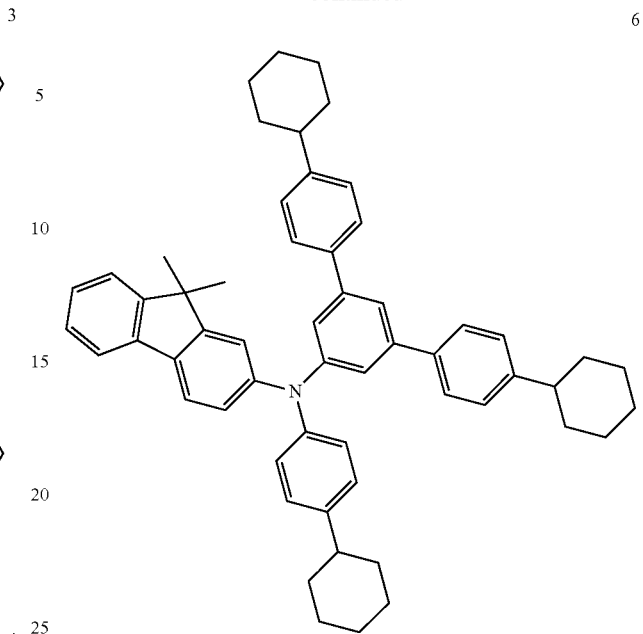
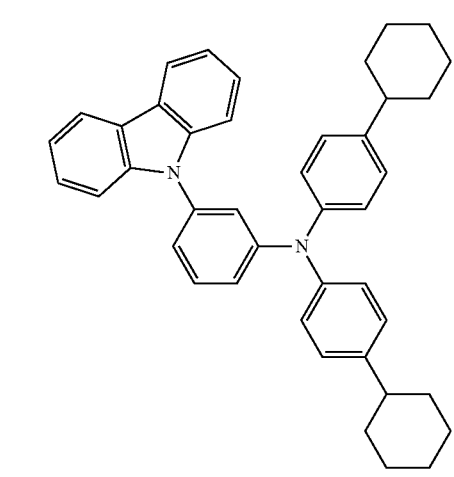
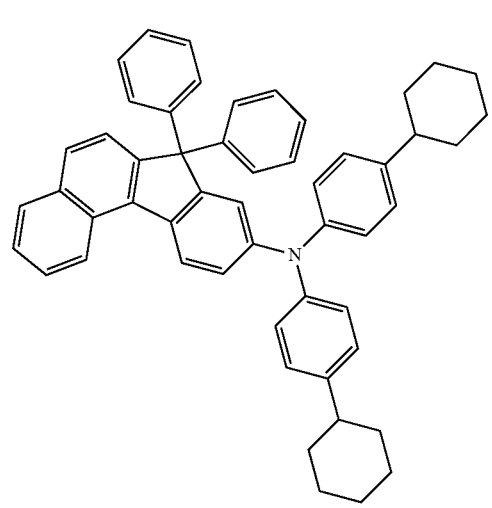
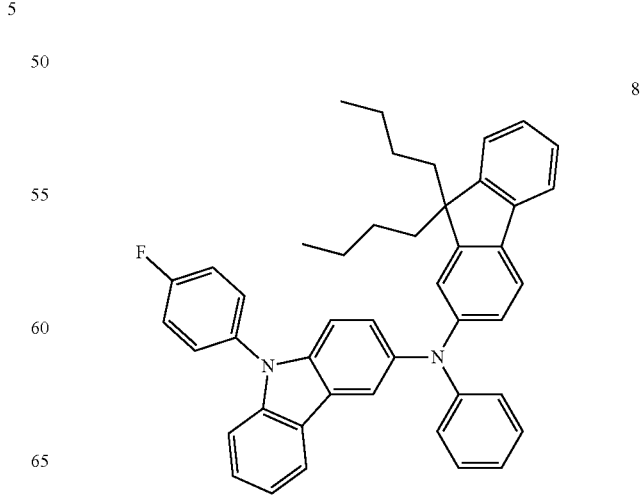

91
-continued
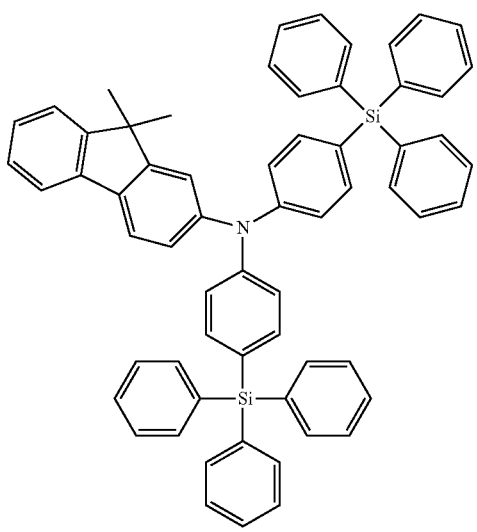
9
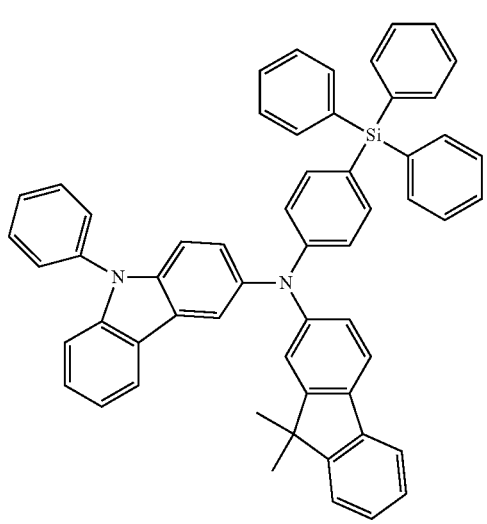
10
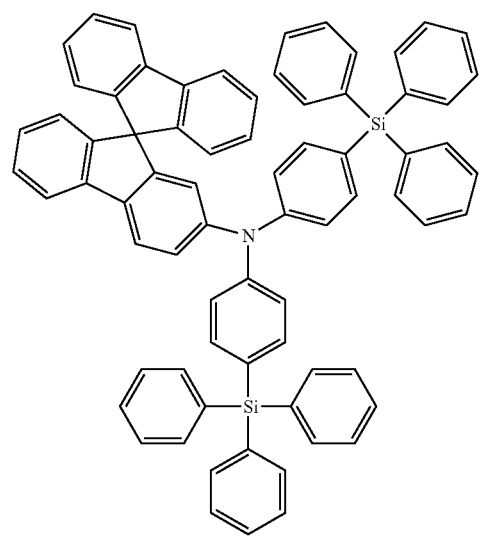
11
92
-continued
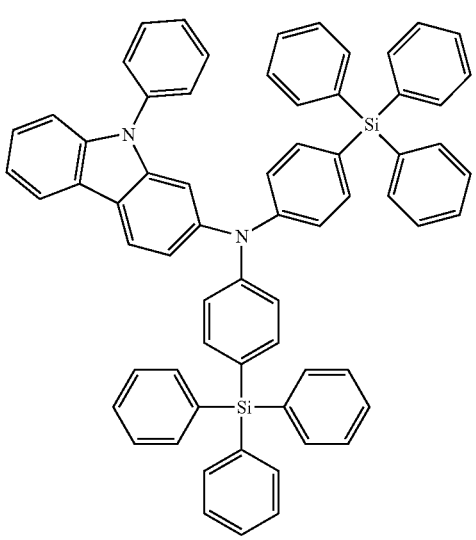
12
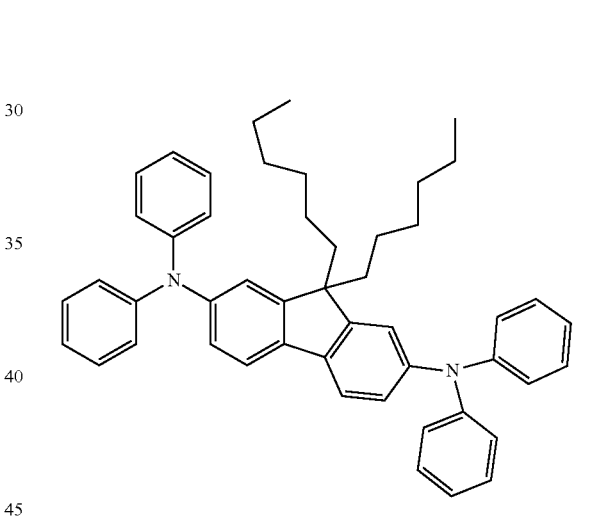
13
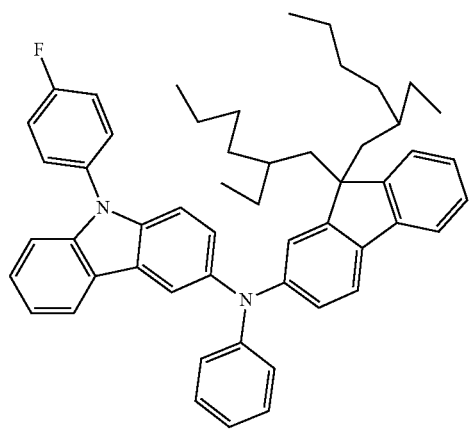
14

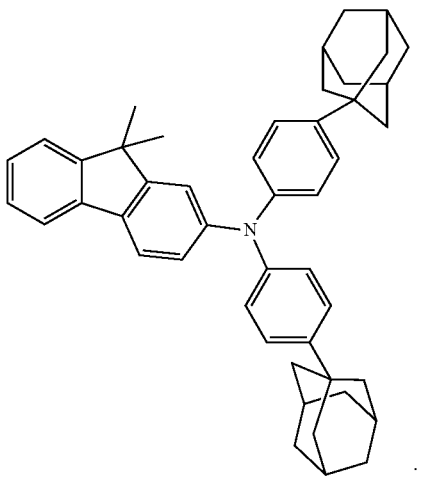

23. A display device comprising
a plurality of organic electroluminescence devices, wherein
each of the plurality of organic electroluminescence devices includes:
a first electrode;
a hole transport region disposed on the first electrode;
an emission layer disposed on the hole transport region;
an electron transport region disposed on the emission layer; and
a second electrode disposed on the electron transport region,
wherein the hole transport region includes:
a first hole transport layer disposed adjacent to the first electrode, the first hole transport layer including a first organic compound having a first dielectric constant; and
a second hole transport layer disposed between the first hole transport layer and the emission layer, the second hole transport layer including a second organic compound having a second dielectric constant which is greater than the first dielectric constant, and
wherein the plurality of organic electroluminescence devices comprise:
a first organic electroluminescence device including a first emission layer that emits light of a first wavelength;
a second organic electroluminescence device including a second emission layer that emits light of a second wavelength which is different from the first wavelength; and
a third organic electroluminescence device including a third emission layer that emits light of a third wavelength which is different from the first wavelength and the second wavelength.

24. The display device of claim 23, wherein
the first dielectric constant is in a range of about 2.0 to about 2.8, and
the second dielectric constant is in a range of about 3.4 to about 4.5.

25. The display device of claim 23, wherein
the first electrode is a reflective electrode, and
the second electrode is either a transmissive electrode or a transflective electrode.

26. The display device of claim 23, wherein
the first wavelength is a wavelength longer than the second wavelength,
the second wavelength is a wavelength longer than the third wavelength,
a thickness of the first emission layer is greater than a thickness of the second emission layer, and
a thickness of the second emission layer is greater than the thickness of the third emission layer.

27. The display device of claim 23, wherein
the first wavelength is a wavelength longer than the second wavelength,
the second wavelength is a wavelength longer than the third wavelength,
the display device further comprises:
a first resonance auxiliary layer disposed between the first emission layer and the hole transport region;
a second resonance auxiliary layer disposed between the second emission layer and the hole transport region; and
a third resonance auxiliary layer disposed between the third emission layer and the hole transport region,
a thickness of the first resonance auxiliary layer is greater than a thickness of the second resonance auxiliary layer, and
a thickness of the second resonance auxiliary layer is greater than a thickness of the third resonance auxiliary layer.

* * * * *